US012598939B2

(12) United States Patent
Mitsuishi et al.

(10) Patent No.: US 12,598,939 B2
(45) Date of Patent: Apr. 7, 2026

(54) SUBSTRATE BONDING DEVICE, CALCULATION DEVICE, SUBSTRATE BONDING METHOD, AND CALCULATION METHOD

(71) Applicant: SCREEN Holdings Co., Ltd., Kyoto (JP)

(72) Inventors: Hajime Mitsuishi, Yokohama (JP); Isao Sugaya, Kawasaki (JP); Masaki Tsunoda, Kamakura (JP); Kazuhiro Suzuki, Tokyo (JP); Takashi Shiomi, Yokohama (JP); Minoru Fukuda, Tokyo (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 802 days.

(21) Appl. No.: 17/235,780

(22) Filed: Apr. 20, 2021

(65) Prior Publication Data

US 2021/0242044 A1    Aug. 5, 2021

Related U.S. Application Data

(63) Continuation of application No. PCT/JP2019/037303, filed on Sep. 24, 2019.

(30) Foreign Application Priority Data

Oct. 25, 2018    (JP) ................................ 2018-200723

(51) Int. Cl.
*B32B 43/00*        (2006.01)
*H01L 21/67*        (2006.01)
*H01L 21/683*       (2006.01)

(52) U.S. Cl.
CPC .. *H01L 21/67092* (2013.01); *H01L 21/67288* (2013.01); *H01L 21/6833* (2013.01);
(Continued)

(58) Field of Classification Search
CPC ............. B32B 43/006; Y10T 156/1132; Y10T 156/1179; Y10T 156/1944; Y10T 156/1983
See application file for complete search history.

(56) References Cited

U.S. PATENT DOCUMENTS 11,842,905 B2    12/2023  Sugaya et al.
2013/0327463 A1*  12/2013  Kitahara ............. H01L 21/2007
156/64
(Continued)

FOREIGN PATENT DOCUMENTS

CN        1574346 A      2/2005
CN      107611061 A      1/2018
(Continued)

OTHER PUBLICATIONS

Korean Office Action issued by the Korean Intellectual Property Office on Aug. 30, 2022, in counterpart Korean Patent Application No. 10-2021-7010640, and English Translation thereof.
(Continued)

*Primary Examiner* — Philip C Tucker
*Assistant Examiner* — Nickolas R Harm
(74) *Attorney, Agent, or Firm* — Rimon P.C.

(57) ABSTRACT

Provided is a substrate bonding apparatus comprising: a first holding unit for holding a first substrate; and a second holding unit for holding a second substrate, wherein the substrate bonding apparatus is configured to bond the first substrate and the second substrate by, after forming a contact region between a part of the first substrate and a part of the second substrate, expanding the contact region to form an initially bonded region and releasing the second substrate having the initially bonded region formed thereon from the second holding unit.

27 Claims, 33 Drawing Sheets

(52) U.S. Cl.
CPC ........ *H01L 21/6838* (2013.01); *B32B 43/006* (2013.01); *H01L 21/67028* (2013.01); *H01L 21/67253* (2013.01); *Y10T 156/1132* (2015.01); *Y10T 156/1179* (2015.01); *Y10T 156/1944* (2015.01); *Y10T 156/1983* (2015.01)

(56) References Cited

U.S. PATENT DOCUMENTS

| | | | | |
|---|---|---|---|---|
| 2014/0209230 A1* | 7/2014 | Wagenleitner | ...... | H01L 21/6838 156/60 |
| 2015/0044786 A1* | 2/2015 | Huang | .............. | H01L 21/67092 156/359 |
| 2015/0056783 A1 | 2/2015 | Kerdiles et al. | | |
| 2015/0129137 A1 | 5/2015 | Sugihara et al. | | |
| 2015/0140689 A1* | 5/2015 | Endo | ................ | H01L 21/67109 156/583.1 |
| 2015/0318260 A1* | 11/2015 | Lin | ................... | H01L 21/67092 438/455 |
| 2016/0204020 A1* | 7/2016 | Huang | .............. | H01L 21/67092 156/60 |
| 2017/0001431 A1* | 1/2017 | Kreindl | ............... | G03F 7/70783 |
| 2017/0278803 A1 | 9/2017 | Sugaya et al. | | |
| 2018/0019140 A1* | 1/2018 | Inamasu | .......... | H01L 21/67201 |
| 2018/0019153 A1 | 1/2018 | Matsunaga et al. | | |
| 2018/0040495 A1* | 2/2018 | Wagenleitner | .......... | H01L 24/80 |
| 2018/0047699 A1 | 2/2018 | Omori et al. | | |
| 2018/0158796 A1* | 6/2018 | Otsuka | .................... | H01L 21/68 |
| 2018/0370210 A1* | 12/2018 | Kim | ........................ | H01L 24/08 |
| 2019/0019677 A1* | 1/2019 | Kurz | ........................ | H01L 22/20 |
| 2019/0043826 A1 | 2/2019 | Sugaya et al. | | |
| 2019/0122915 A1 | 4/2019 | Mitsuishi et al. | | |
| 2019/0148184 A1 | 5/2019 | Sugaya et al. | | |
| 2019/0148333 A1* | 5/2019 | Chen | ........................ | H01L 24/94 438/16 |
| 2019/0228995 A1* | 7/2019 | Wimplinger | .......... | H01L 21/187 |
| 2019/0267238 A1 | 8/2019 | Mitsuishi et al. | | |

FOREIGN PATENT DOCUMENTS

| | | | |
|---|---|---|---|
| CN | 107706129 A | 2/2018 |
| JP | 2013-258377 A | 12/2013 |
| JP | 2015-084369 A | 4/2015 |
| JP | 2015095579 A | 5/2015 |
| JP | 2016042609 A | 3/2016 |
| JP | 2018-010922 A | 1/2018 |
| JP | 2018026414 A | 2/2018 |
| JP | 2018-056481 A | 4/2018 |
| JP | 2019-514197 A | 5/2019 |
| KR | 10-2017-009432 A | 8/2017 |
| KR | 10-2018-0007318 A | 1/2018 |
| KR | 10-2018-0018341 A | 2/2018 |
| KR | 10-2019-0027787 A | 3/2019 |
| KR | 10-2019-0062573 A | 6/2019 |
| TW | 201802867 A | 1/2018 |
| TW | 201812839 A | 4/2018 |
| WO | WO 2017/115684 A1 | 7/2017 |
| WO | WO 2017/168534 A1 | 10/2017 |
| WO | WO 2017/217431 A1 | 12/2017 |
| WO | WO 2018/012300 A1 | 1/2018 |
| WO | WO 2018/092861 A1 | 5/2018 |

OTHER PUBLICATIONS

Taiwanese Office Action issued by the Taiwanese Intellectual Property Office on Apr. 19, 2023, in counterpart Taiwanese Patent Application No. 108134149, and English Translation thereof.

Korean Office Action issued by the Korean Intellectual Property Office on May 9, 2023, in counterpart Korean Patent Application No. 10-2021-7010640, and English Translation thereof.

Notification of Reasons for Refusal mailed Dec. 14, 2021, in corresponding Japanese Patent Application No. 2020-552996.

Written Opinion of the International Searching Authority for International Application No. PCT/JP2019/037303, mailed Nov. 19, 2020.

International Preliminary Report on Patentability, in corresponding international application No. PCT/JP2019/037303, issued Apr. 27, 2021.

The Office Action issued by the Taiwan Intellectual Property Office on Apr. 2, 2024, in counterpart Taiwanese Patent Application No. 112148230, and English Translation thereof.

Office Action issued by the China National Intellectual Property Administration on Jun. 29, 2024 in counterpart Chinese Patent Application No. 201980070212.8, and English Translation thereof.

International Search Report of International Application No. PCT/JP2019/037303 dated Nov. 19, 2019.

Korean Office Action issued by the Korean Intellectual Property Office on Dec. 4, 2024, in counterpart Korean Patent Application No. 10-2023-7041995, and English Translation thereof.

Taiwanese Office Action issued by the Taiwanese Intellectual Property Office on Mar. 4, 2025, in counterpart Taiwanese Patent Application No. 114102267, and English Translation thereof, 5 pages.

\* cited by examiner

210(230)    212(232)    214(234)    218(238)    216(236)

290

SUBSTRATE BONDING DEVICE, CALCULATION DEVICE, SUBSTRATE BONDING METHOD, AND CALCULATION METHOD

BACKGROUND

1. Technical Field

The present invention relates to a substrate bonding apparatus, a calculator, a substrate bonding method, and a calculation method.

The contents of the following Japanese and international patent applications are incorporated herein by reference:

NO. 2018-200723 filed in JP on Oct. 25, 2018, and

NO. PCT/JP2019/037303 filed in WO on Sep. 24, 2019.

2. Related Art

A substrate bonding method is known in which a pair of substrates are bonded by, while keeping hold of one substrate of the pair of substrates, unholding the other substrate of the pair of substrates and releasing the other substrate toward to the one substrate (for example, Patent document 1).

[Patent document 1] Japanese Patent Application Publication No. 2015-95579

In the above-mentioned method, the one substrate that is released at the time of bonding is pressed at its center portion under the same condition regardless of the curved state of the substrate and deformed into a centrally convex shape. The center portion is abutted against a center portion of the other substrate and the region where the substrates are bonded to each other is sequentially expanded toward the outer circumferential direction. Therefore, depending on the curved state of the one substrate to be bonded, an amount of positional misalignment that occurs between the two bonded substrates may vary largely.

DESCRIPTION OF EXEMPLARY EMBODIMENTS

Embodiments of the invention are described below. The embodiments described below do not limit the invention according to the claims, and all the combinations of the features described in the embodiments are not necessarily essential to solving means provided by aspects of the invention.

Figure 1:
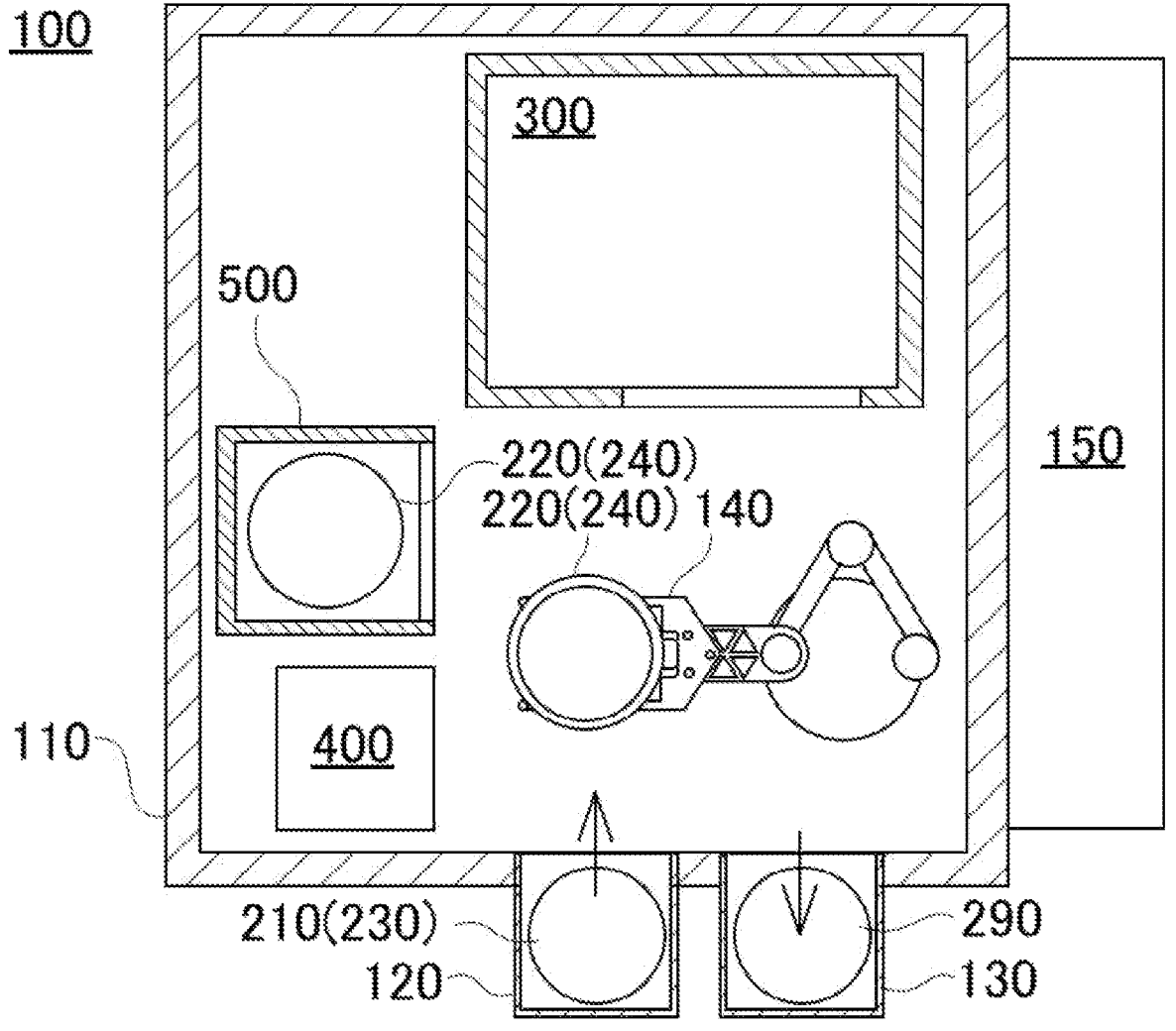
FIG. 1 is a schematic plan view of a substrate bonding apparatus 100.

FIG. 1 is a schematic plan view of a substrate bonding apparatus 100. The substrate bonding apparatus 100 includes an enclosure 110, a substrate cassette 120 for storing substrates 210, 230 to be bonded, a substrate cassette 130 for storing a multilayer substrate 290 manufactured by bonding at least two substrates 210, 230, a control unit 150, a conveying unit 140, a bonding unit 300, a holder stocker 400 for storing substrate holders 220, 240 for holding the substrates 210, 230, and a pre-aligner 500. The temperature inside the enclosure 110 is controlled and kept, for example, at room temperature.

The conveying unit 140 is configured to convey the substrates 210, 230 or the substrate holders 220, 240 alone, the substrate holders 220, 240 respectively holding the substrates 210, 230, the multilayer substrate 290 formed by stacking a plurality of substrates 210, 230, or the like. The control unit 150 is configured to comprehensively control each unit of the substrate bonding apparatus 100 in conjunction with each other. Also, the control unit 150 is configured to receive a user instruction from the outside and set a manufacturing condition when manufacturing the multilayer substrate 290. Moreover, the control unit 150 includes a user interface for displaying an operational state of the substrate bonding apparatus 100 toward the outside.

The bonding unit 300 includes a pair of opposing stages respectively configured to hold the substrate 210 or 230 via the substrate holder 220 or 240. The bonding unit 300 is configured to bond the pair of substrates 210, 230 to form the multilayer substrate 290 by; after mutually aligning the pair of substrates 210, 230 held on the pair of stages, while keeping hold of one substrate of the pair of substrates 210, 230, unholding the other substrate to release the other substrate toward the one substrate and bringing the pair of substrates 210, 230 into contact with each other. In the description below, the substrate 210 may be referred to as a substrate 210 on the fixed side, and the substrate 230 may be referred to as a substrate 230 on the releasing side.

The pre-aligner 500 is configured to align the substrates 210, 230 with the substrate holders 220, 240 respectively, and cause the substrate holders 220, 240 to hold the substrates 210, 230. The substrate holders 220, 240 are respectively formed of a hard material such as alumina ceramics, and are configured to adsorb and hold the substrates 210, 230 respectively by an electrostatic chuck, a vacuum chuck, or the like.

In the substrate bonding apparatus 100 as described above, besides the substrates 210, 230 having an element, a circuit, a terminal, or the like formed thereon, an unprocessed silicon wafer, a SiGe substrate with added Ge, Ge monocrystalline substrate, a compound semiconductor wafer such as a III-V group semiconductor wafer or a II-VI group semiconductor wafer, and a glass substrate, or the like can be bonded. Targets to be bonded may be a circuit board and an unprocessed substrate or may be both unprocessed substrates. Each of the substrates 210, 230 to be bonded may be, by itself, a multilayer substrate 290 including a plurality of substrate that are stacked already.

Figure 2:
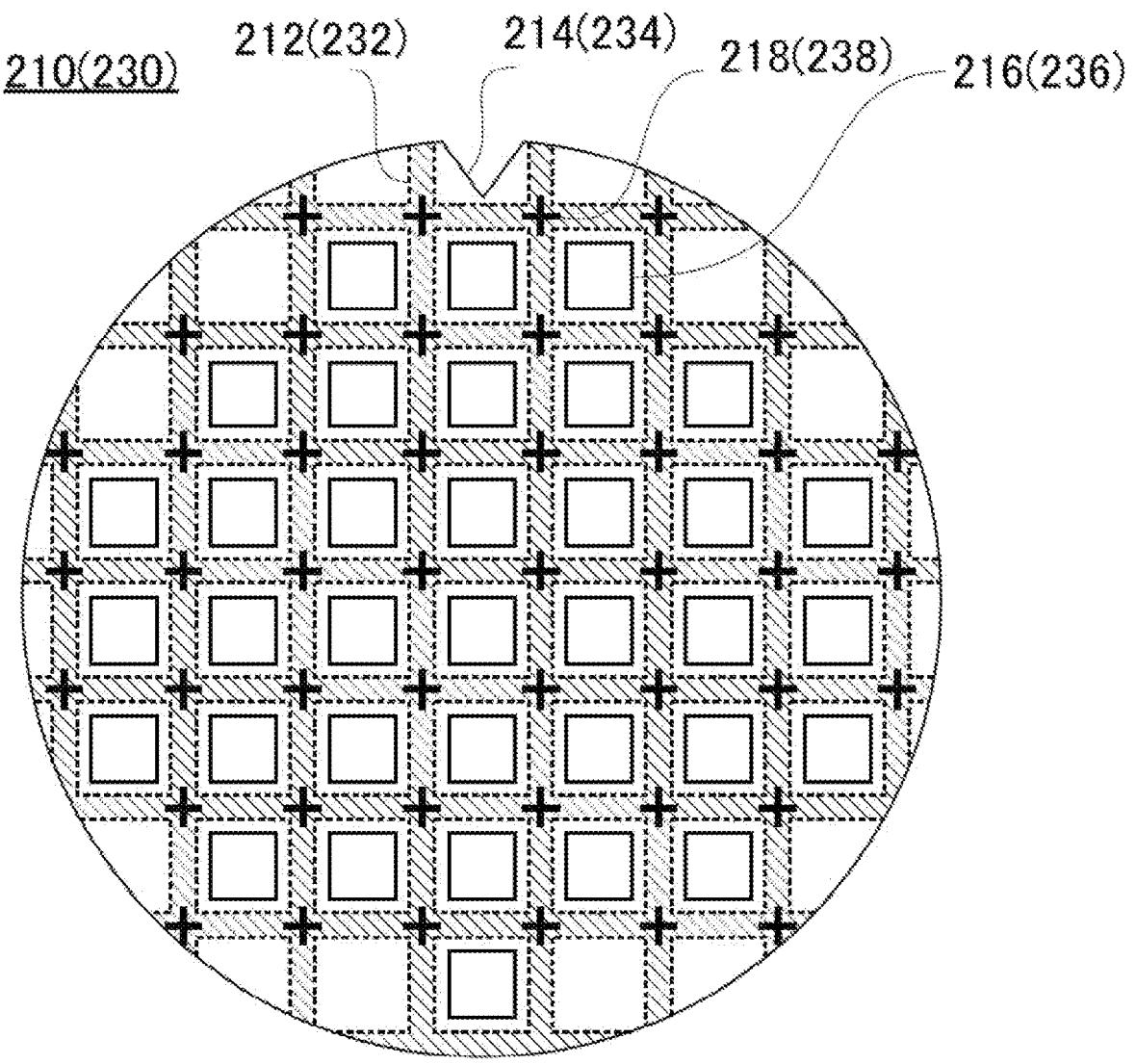
FIG. 2 is a schematic plan view of substrates 210 and 230.

FIG. 2 is a schematic plan view of the substrates 210, 230 to be bonded in the substrate bonding apparatus 100. The substrates 210, 230 have a notch 214, 234, a plurality of circuit regions 216, 236, and a plurality of alignment marks 218, 238, respectively.

The plurality of circuit regions 216, 236 are one example of a structure formed on a surface of each of the substrates 210, 230, and are periodically arranged in a plane direction on the surface of each of the substrates 210, 230. In each of the plurality of circuit regions 216, 236, a structure such as a runner or a protective film formed by the photolithography technique or the like is provided. In each of the plurality of circuit regions 216, 236, a connecting portion such as a pad or a bump as a connection terminal when electrically connecting one of the substrates 210, 230 with the other of the substrates 230, 210, a lead frame, or the like, is also arranged. The connecting portion is also one example of a structure formed on the surface of the substrates 210, 230.

The plurality of alignment marks 218, 238 are also one example of a structure formed on the surface of the substrates 210, 230, and are arranged on scribe lines 212, 232 arranged between the plurality of circuit regions 216, 236. The plurality of alignment marks 218, 238 are indices for aligning one of the substrates 210, 230 and the other of the substrates 230, 210.

Figure 3:
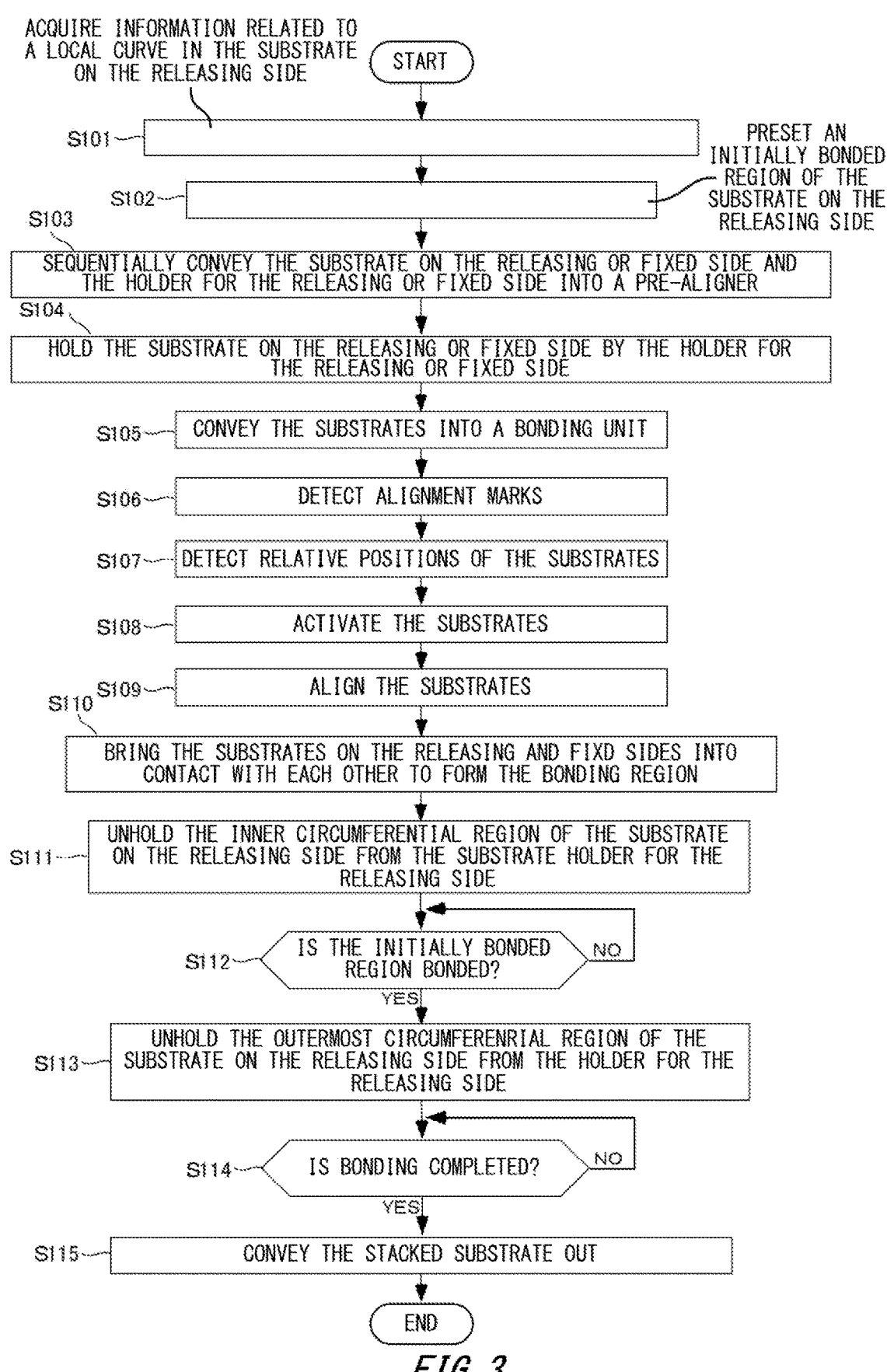
FIG. 3 is a flow chart showing a procedure for manufacturing a multilayer substrate 290 by stacking substrates 210, 230.

FIG. 3 is a flow chart showing a procedure for manufacturing a multilayer substrate 290 by stacking the pair of substrates 210, 230 in the substrate bonding apparatus 100. Here, it is decided in advance that the substrate 230 is to be on the fixed side of the pair of stages of the bonding unit 300, and the substrate 210 is to be on the releasing side. Firstly, the control unit 150 acquires at least information related to a local curve in the substrate 210 on the releasing side (Step S101), and presets an initially bonded region, which is a partial region of a bonding surface of the substrate 210 on the releasing side, based on a characteristic of the local curve of the substrate 210 included in the acquired information (Step S102). Note that the information related to the local curve is included in information related to distortion. The control unit 150 is one example of a setting unit for setting the initially bonded region based on the information related to distortion.

Then, based on an output from the control unit 150, the conveying unit 140 sequentially conveys the substrate holder 220 for the releasing side and the substrate 210 on the releasing side into the pre-aligner 500 (Step S103). In the pre-aligner 500, the substrate holder 220 for the releasing side is caused to hold the substrate 210 (Step S104). Concerning the substrate 230 on the fixed side, similarly to the substrate 210, based on the output from the control unit 150, the conveying unit 140 sequentially conveys the substrate holder 240 for the fixed side and the substrate 230 on the fixed side into the pre-aligner 500 (Step S103), and, in the pre-aligner 500, the substrate holder 240 for the fixed side is caused to hold the substrate 230 (Step S104).

Figure 4:
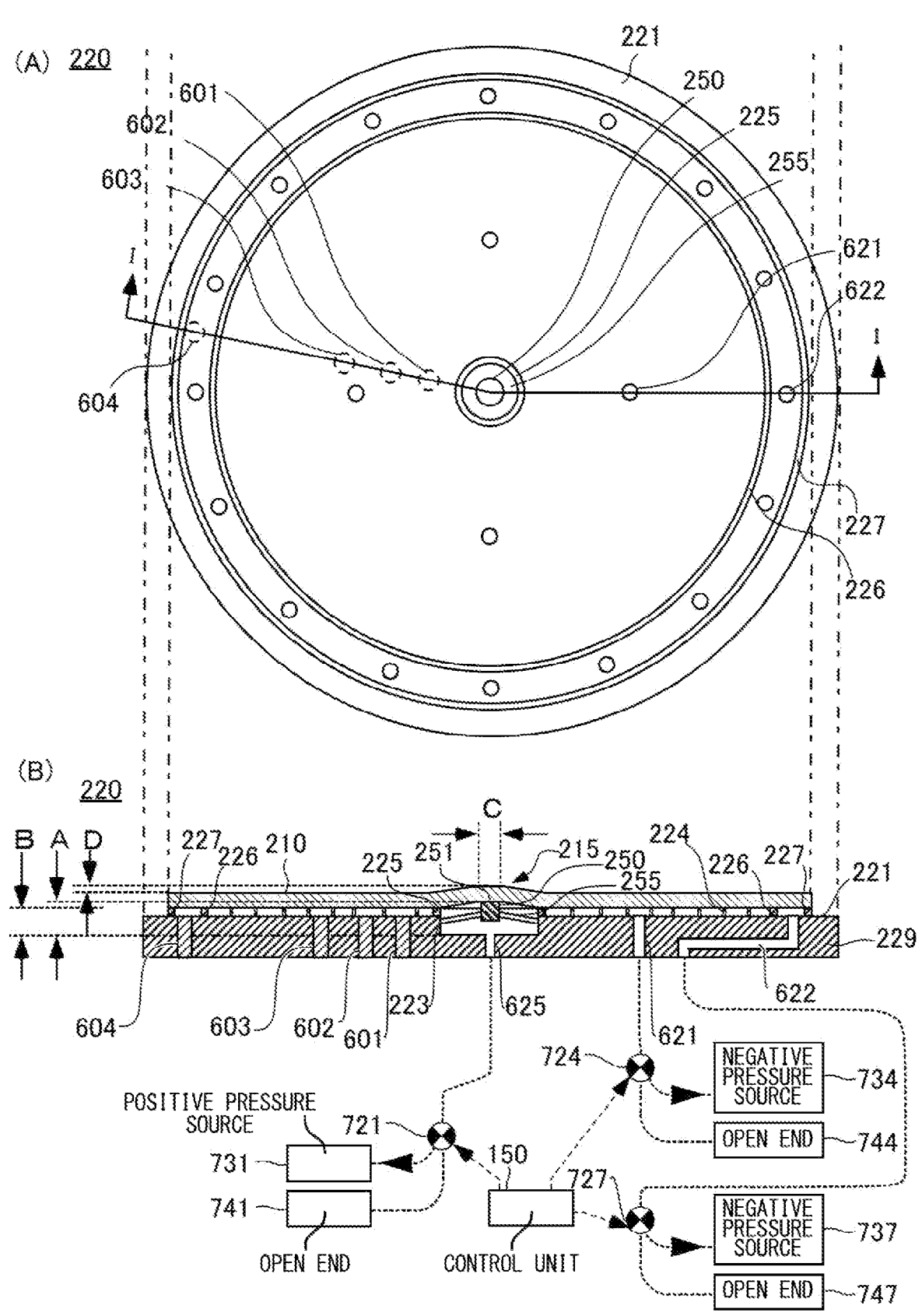
FIG. 4 shows a schematic plan view (A) of a substrate holder 220 and a schematic cross-sectional view (B) of the substrate holder 220 holding the substrate 210, along the line I-I in the schematic plan view (A).

FIG. 4 shows a schematic plan view (A) of the substrate holder 220 used in Step S104 and a schematic cross-sectional view (B) of the substrate holder 220 holding the substrate 210, along the line I-I bending at the center of the substrate holder 220 in the schematic plan view (A). The substrate holder 220 includes a body portion 229 and a protruding member 250.

The body portion 229 has a flat holding surface 221, three annular support portions 225, 226, 227 formed on the holding surface 221 and concentrically with the center of the substrate holder 220, a plurality of support pins 224 formed on the holding surface 221 and at a substantially equal interval between the plurality of support portions 225, etc., and a concave portion 223 formed in a cylindrical shape substantially at the center on the holding surface 221 and having one open end. The three support portions 225, 226, 227 are positioned in this order from the center side of the substrate holder 220. An inner circumferential surface of the support portion 225 is aligned with an inner circumferential surface of the cylindrical concave portion 223, and thus the support portion 225 surrounds the concave portion 223 on the holding surface 221. The support portion 227 has substantially the same outer shape as the outer shape of the substrate 210 held on the substrate holder 220. The support portion 226 is positioned slightly closer to the center side than the support portion 227 on the holding surface 221, and, together with the support portion 227, forms an annular groove on the outermost side of the substrate holder 220. The density of the plurality of support pins 224 formed between the support portion 225 and the support portion 226 is sparse than the density of the plurality of support pins 224 formed between the support portion 226 and the support portion 227. The support portions 225, etc. and the plurality of support pins 224 protrude from the holding surface 221 by the same amount, and each protruding tip portion is positioned on the same plane. Therefore, each protruding tip portion of the support portions 225, etc. and the plurality of support pins 224 is in contact with the substrate 210 mounted on the substrate holder 220. Note that the plurality of support pins 224 are omitted in (A) of FIG. 4 for clarity of the description. A region of the substrate 210 on the radially center side in the plane of the substrate 210, which is adsorbed to between the support portion 225 and the support portion 226 of the substrate holder 220, may be referred to as an inner circumferential region of the substrate 210 below. A region of the substrate 210 on the radially outer side in the plane of the substrate 210, which is adsorbed to between the support portion 226 and the support portion 227 of the substrate holder 220, may be referred to as an outermost circumferential region of the substrate 210.

The body portion 229 further has two leaf springs 255, the outer circumference of which is connected to an inner circumference wall of the concave portion 223, and a cylindrical protruding member 250, the outer circumference of which is connected to the inner circumference of the two leaf springs 255. By the leaf springs 255 elastically deforming under a certain or greater level of external force in a direction away from the concave portion 223, the protruding member 250 protrudes from a plane on which each protruding tip portion of the support portions 225, etc. and the plurality of support pins 224 are positioned. In a state in which the leaf springs 255 does not receive the certain or greater level of external force in the direction away from the concave portion 223, the protruding member 250 does not protrude from the plane. Note that the protruding member 250 may be configured to protrude from the plane by the resilient force of the leaf springs 255 and to be pushed into the concave portion 223 under a certain or greater level of external push-in load toward the concave portion 223 side. In this case, the resilient force of the leaf springs 255 includes at least a force required to deform the substrate 210.

The body portion 229 further has a central vent channel 625, an inner circumferential vent channel 621, and an outermost circumferential vent channel 622. At its one end, the central vent channel 625 has an exhaust hole that is open at the bottom surface of the concave portion 223. The other end of the central vent channel 625 is selectively coupled to a positive pressure source 731 and an open end 741 via a control valve 721 external to the substrate holder 220. At its one end, the inner circumferential vent channel 621 has a plurality of air suction holes positioned at a substantially equal interval, which are open at a point, between the support portion 225 and the support portion 226 on the holding surface 221, where none of the plurality of support pins 224 are formed. The other end of the inner circumferential vent channel 621 is selectively coupled to a negative pressure source 734 and an open end 744 via a control valve 724 external to the substrate holder 220. At its one end, the outermost circumferential vent channel 622 has a plurality of air suction holes positioned at a substantially equal interval, which are open at a point, between the support portion 226 and the support portion 227 on the holding surface 221, where none of the plurality of support pins 224 are formed. The other end of the outermost circumferential vent channel 622 is selectively coupled to a negative pressure source 737 and an open end 747 via a control valve 727 external to the substrate holder 220. The plurality of air suction holes at the one end of the outermost circumferential vent channel 622 are greater in number and arranged more densely than the plurality of air suction holes at the one end of the inner circumferential vent channel 621. The plurality of air suction holes at the one end of the outermost circumferential vent channel 622 are provided at the outermost circumference of the substrate holder 220 in order to be able to adsorb the outermost circumferential region of the substrate 210, while, as shown in (B) of FIG. 4, the outermost circumferential vent channel 622 is formed to extend in the plane direction in the interior of the substrate holder 220 so that the other end of the outermost circumferential vent channel 622 is positioned closely to the center side of the substrate holder 220. Thus, the substrate holder 220 can be adapted to a vacuum plate, a substrate bonding stage, or the like where air ducts for holding the substrate holder 220 and applying suction air or exhaust air to each vent channel of the substrate holder 220 are concentratedly formed at the center of the holding surface of the substrate holder 220.

The control valves 724, 727 selectively cause the inner circumferential vent channel 621 and the outermost circumferential vent channel 622 to communicate respectively with the negative pressure sources 734, 737 under control of the control unit 150. In a state where the substrate 210 is mounted on the support portions 225, etc. and the plurality of support pins 224, when the control valves 724, 727 cause the inner circumferential vent channel 621 and the outermost circumferential vent channel 622 to communicate respectively with the negative pressure sources 734, 737, negative pressure acts on the plurality of air suction holes of each of the inner circumferential vent channel 621 and the outermost circumferential vent channel 622. Thus, the space between the support portion 225 and the support portion 226 and the space between the support portion 226 and the support portion 227, the spaces being enclosed between the substrate 210 and the holding surface 221, are respectively depressurized, so that the substrate 210 is adsorbed to the substrate holder 220. On the other hand, from a state where the substrate 210 is adsorbed to the substrate holder 220, when the control valves 724, 727 cause the inner circumferential vent channel 621 and the outermost circumferential vent channel 622 to communicate respectively with the open ends 744, 747, the adsorption of the substrate 210 by the substrate holder 220 is released. The inner circumferential vent channel 621 and the outermost circumferential vent channel 622 are respectively coupled to the control valves 724, 727 separately controlled by the control unit 150, and a plurality of adsorbing holes at one end of each of the inner circumferential vent channel 621 and the outermost circumferential vent channel 622 are open to each space isolated from each other by the support portion 226. Therefore, the substrate holder 220 can separately adsorb the inner circumferential region and the outermost circumferential region of the substrate 210 and can separately release the adsorption, under control of the control unit 150. In other words, the substrate holder 220 has two adsorbing regions independently isolated from each other.

The control valve 721 selectively causes the central vent channel 625 to communicate with the positive pressure source 731 and the open end 741 under control of the control unit 150. When the control valve 721 causes the central vent channel 625 to communicate with the positive pressure source 731, positive pressure acts on the exhaust hole of the central vent channel 625 to pressurize the space surrounded by the concave portion 223, the leaf springs 255, and the protruding member 250. Then, by the leaf spring 255 elastically deforming in the direction away from the concave portion 223, the protruding member 250 protrudes from the above-mentioned plane and, as a result, the partial region of the substrate 210 located inside the support portion 225 deforms in the same direction. The substrate holder 220 can cause the partial region of the substrate 210 steeply protrude in the direction away from the substrate holder 220 by deforming the substrate 210 in the above-described manner while adsorbing the substrate 210, and also can adjust its protruding amount by adjusting a load applied, under control of the control unit 150. The protruding amount of the protruding member 250 is set by the control unit 150 based on a characteristic of a local curve of the substrate 210. The control unit 150 is configured to adjust the size of the initially bonded region 803 by adjusting the protruding amount of the protruding member 250.

The schematic cross-sectional view in (B) of FIG. 4 shows a state where a region C around the center of the substrate 210 steeply protrudes because of the substrate holder 220, while adsorbing the substrate 210, causing the protruding member 250 to protrude from the above-mentioned plane. In this figure, the height A of the protruding member 250 up to an abutment portion 251 is higher than the sum B of the depth of the concave portion 223 and the height of the support portion 225, and the abutment portion 251 protrudes from the above-mentioned plane. Thus, a steeply protruding raised portion 215 is formed in the region C around the center of the flat substrate 210 adsorbed to the substrate holder 220. The height D of the raised portion 215 is equal to or slightly higher than a protruding amount of the abutment portion 251 of the protruding member 250 from the above-mentioned plane. For example, when the protruding amount of the abutment portion 251 is 50 μm, the height. D of the raised portion 215 is about 70 μm.

The body portion 229 further has three observation holes 601, 602, 603, formed at three points between the support portion 225 and the support portion 226 on the holding surface 221 where none of the plurality of support pins 224 are formed, passing through the substrate holder 220 in the thickness direction and an observation hole 604, formed between the support portion 226 and the support portion 227 on the holding surface 221, passing through the substrate holder 220 in the thickness direction. The four observation holes 601, 602, 603, 604 are positioned on substantially the same linear line along the radial direction of the substrate holder 220, as shown in the schematic plan view in (A) of FIG. 4 as overlapping with the linear line I-I bending at the center of the substrate holder 220. The three observation holes 601, 602, 603 are positioned closely to the center of the substrate holder 220 at a substantially equal interval and in this order from the center side of the substrate holder 220. Note that the observation holes 601, etc. are respectively filled with a material transparent to a wavelength of illuminating light used when observing the substrate 210, and both ends of each of the observation holes 601, etc. are formed smoothly with both planes of the substrate holder 220.

The substrate holder 220 is aligned with the substrate 210 so that a predetermined point of the substrate 210 opposes the observation holes 601, etc. of the substrate holder 220. Specifically, based on information related to a local curve of the substrate 210 sent from the control unit 150 of the substrate bonding apparatus 100, the pre-aligner 500 aligns the substrate holder 220 with the substrate 210 so that the predetermined point of the substrate 210 is positioned on a line on which the observation holes 601 to 604 provided on the substrate holder 220 are positioned. For example, the pre-aligner 500 performs alignment so that a point with a largest local curve in the plane of the substrate 210 is positioned on the line on which the observation holes 601 to 604 provided on the substrate holder 220 are positioned.

Note that the protruding member 250 of the substrate holder 220 described above is configured so that its protruding amount is adjusted by pneumatics, but, instead of this configuration, the protruding member 250 may be configured to be detachable so that its protruding amount may be variable by exchanging a plurality of protruding members 250 with different heights. Similarly to the pneumatic protruding member 250, this configuration can also provide a desired protruding amount.

Figure 5:
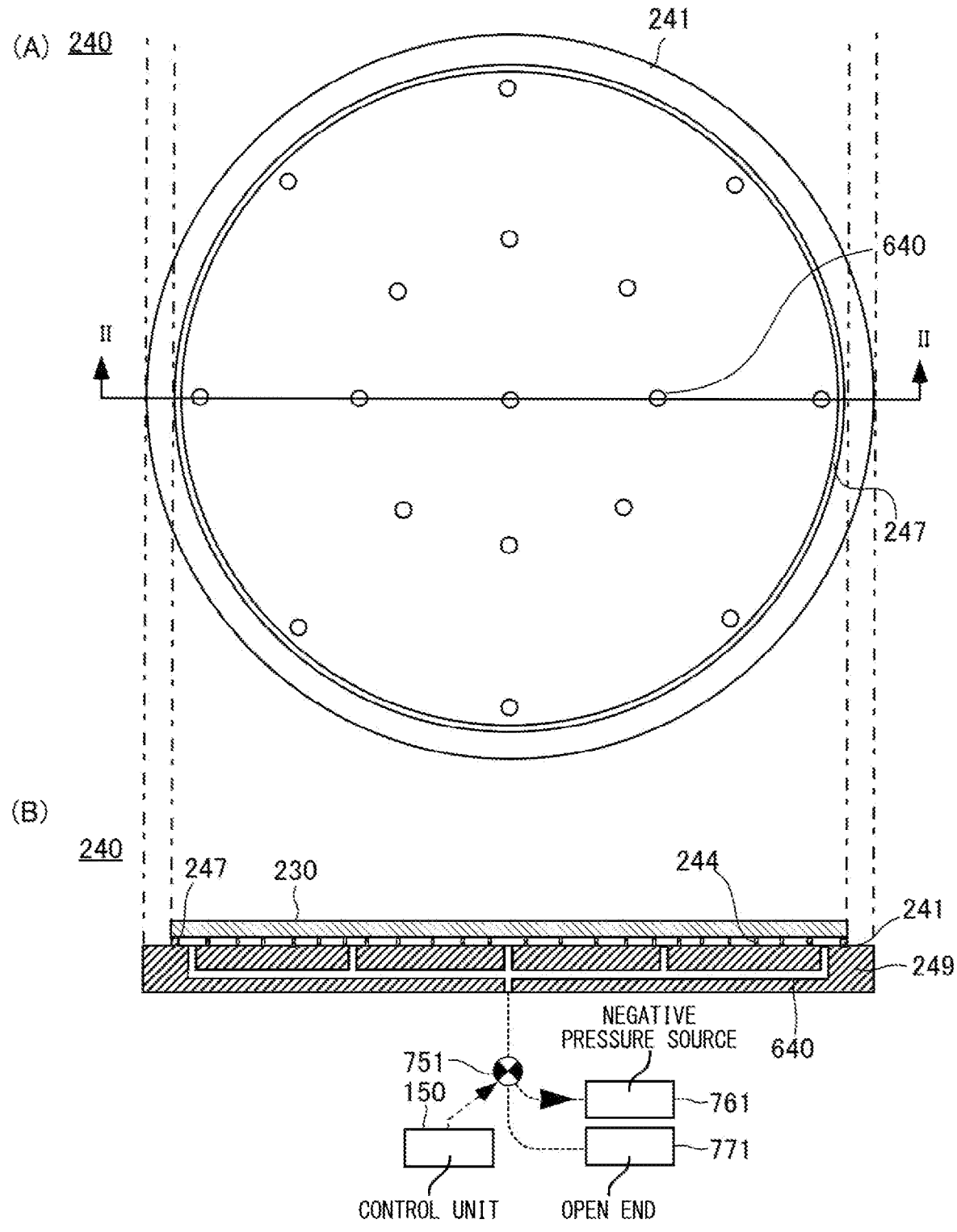
FIG. 5 shows a schematic plan view (A) of a substrate holder 240 and a schematic cross-sectional view (B) of the substrate holder 240 holding the substrate 230, along the line II-II in the schematic plan view (A).

FIG. 5 shows a schematic plan view (A) of a substrate holder 240 and a schematic cross-sectional view (B) of the substrate holder 240 holding the substrate 230, along the line II-II in the schematic plan view (A). The substrate holder 240 includes a body portion 249.

The body portion 249 has a flat holding surface 241, an annular support portion 247 formed concentrically with the center of the substrate holder 240 on the holding surface 241, and a plurality of support pins 244 formed at a substantially equal interval inside of the support portion 247 on the holding surface 241. The support portion 247 has substantially the same outer shape as the outer shape of the substrate 230 held on the substrate holder 240. The support portion 247 and the plurality of support pins 244 protrude from the holding surface 241 by the same amount, and each protruding tip portion is positioned on the same plane. Therefore, each protruding tip portion of the support portion 247 and the plurality of support pins 244 is in contact with the substrate 230 mounted on the substrate holder 240. Note that the plurality of support pins 244 are omitted in (A) of FIG. 5 for clarity of the description.

The body portion 249 further includes a vent channel 640. At its one end, the vent channel 640 has a plurality of air suction holes positioned at a substantially equal interval, which are open at a point inside of the support portion 247 on the holding surface 241 where none of the plurality of support pins 244 is formed. The other end of the vent channel 640 is selectively coupled to a negative pressure source 761 and an open end 771 via a control valve 751 external to the substrate holder 240. The plurality of air suction holes at the one end of the vent channel 640 are provided as far as the outermost circumference of the substrate holder 240, while, as shown in (B) of FIG. 5, the vent channel 640 is formed to extend in the plane direction in the interior of the substrate holder 240 so that the other end of the vent channel 640 is positioned substantially at the center of the substrate holder 240. Thus, similarly to the substrate holder 220, the substrate holder 240 can also be adapted to a vacuum plate, a substrate bonding stage, or the like where air ducts for holding the substrate holder 240 and applying suction air to the vent channel 640 of the substrate holder 240 are concentratedly formed at the center of the holding surface of the substrate holder 240.

The control valve 751 selectively causes the vent channel 640 to communicate with the negative pressure source 761 under control of the control unit 150. In a state where the substrate 230 is mounted on the support portion 247 and the plurality of support pins 244, when the control valve 751 causes the vent channel 640 to communicate with the negative pressure source 761, negative pressure acts on the plurality of air suction holes of the vent channel 640. Thus, the space inside the support portion 227, the space being enclosed between the substrate 230 and the holding surface 241, is depressurized so that the substrate 230 is adsorbed to the substrate holder 240. On the other hand, from a state where the substrate 230 is adsorbed to the substrate holder 240, when the control valve 751 causes the vent channel 640 to communicate with the open end 771, the adsorption of the substrate 230 by the substrate holder 240 is released. The schematic cross-sectional view in (B) FIG. 5 shows a state where the substrate 230 is adsorbed by the substrate holder 240 and the substrate 230 adsorbed to the substrate holder 240 is positioned on the above-mentioned plane and is in a flat state.

Note that both of the substrate holders 220, 240 shown in each of FIG. 4 and FIG. 5 as described above have the body portion 229 or 249 having a substantially rectangular cross-sectional shape, but, instead of this, the substrate holders 220, 240 may have a cross-sectional shape with a gradually increasing thickness from a peripheral portion toward a center portion, or the like. Thus, each of the substrates 210, 230 held by adsorption on each of the substrate holders 220, 240 comes in close contact with each of the holding surfaces 221, 241 and follows the shape of each of the holding surfaces 221, 241 to curve entirely. Therefore, when the front surface of each of the holding surfaces 221, 241 is a curved surface, for example, a cylindrical surface, a spherical surface, a paraboloid surface, or the like, each of the adsorbed substrates 210, 230 change its entire shape to form such curved surface.

Figure 6:
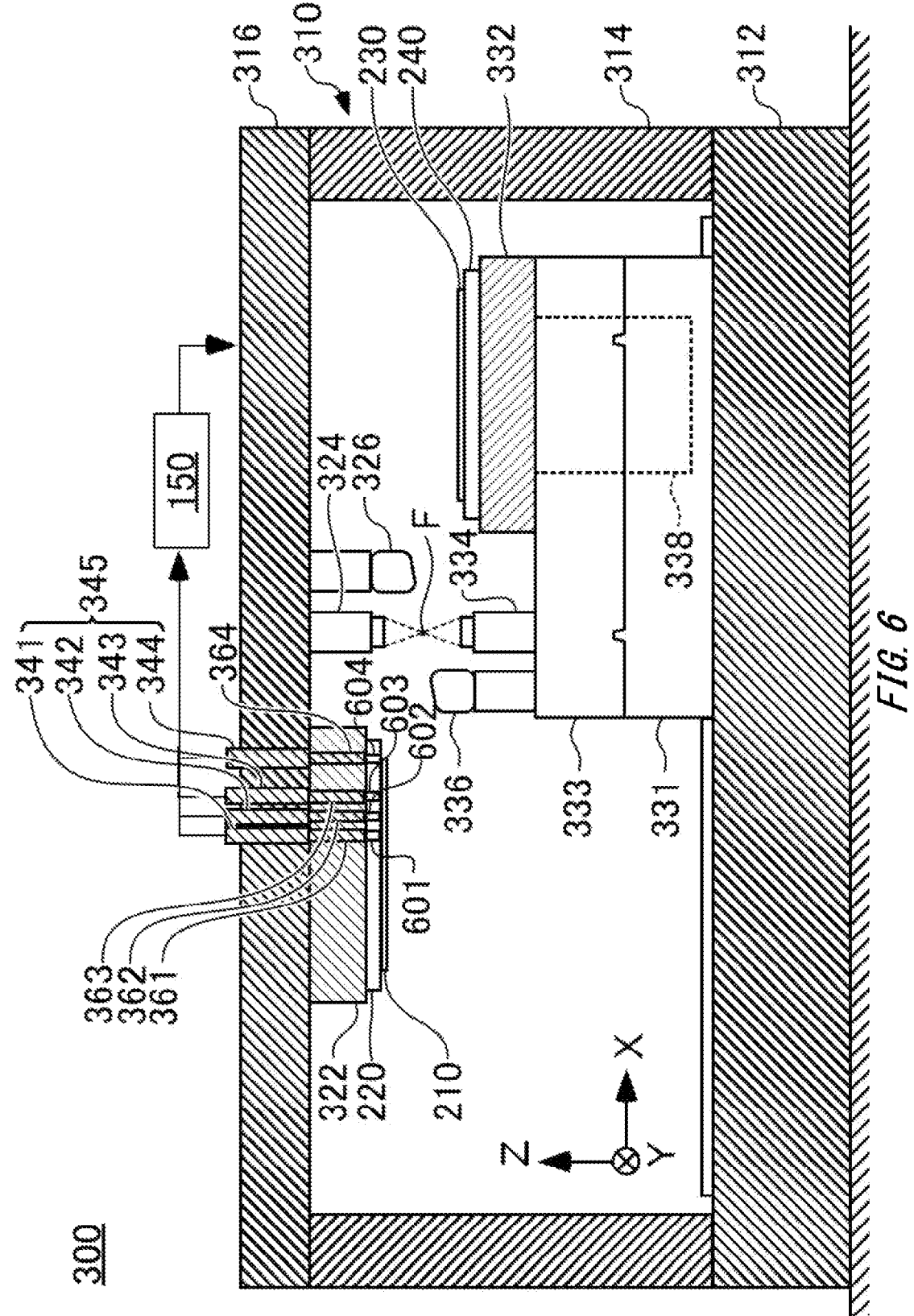
FIG. 6 is a schematic cross-sectional view of a bonding unit 300.

The substrate holders 220, 240 separately holding each of the substrates 210, 230 are sequentially conveyed into the bonding unit 300 and are fixed to each stage (Step S105), as shown in FIG. 6. FIG. 6 to FIG. 9 and FIG. 11, which will be referred to as appropriate in the description below, are schematic cross-sectional views of the bonding unit 300. Here, the bonding unit 300 includes a frame body 310, an upper stage 322, and a lower stage 332.

The upper stage 322 is fixed to the top plate 316 of the frame body 310 downwardly. The upper stage 322 has a holding feature such as a vacuum chuck, an electrostatic chuck, or the like. In the state as shown in the figure, the substrate holder 220 holding the substrate 210 is already held in the upper stage 322. The upper stage 322 has four observation windows 361, 362, 363, 364 provided correspondingly to each position of four observation holes 601, 602, 603, 604 of the substrate holder 220 held in the upper stage. Each of the observation windows 361, etc. is filled with a material transparent to a wavelength of illuminating light used when observing the substrate 210, and a lower surface of the upper stage 322, including a region where the observation windows 361, etc. are formed, forms a flat surface.

The bonding unit 300 further includes four detectors 341, 342, 343, 344 provided, passing through the top plate 316 of the frame body 310 in the thickness direction, at positions corresponding to the four observation windows 361, etc. of the upper stage 322. The four detectors 341, etc. forms an observing unit 345 for observing expansion of the bonded region between the substrates 210, 230 in the bonding unit 300, through the four observation windows 361, etc. optically communicating with the lower surface of the upper stage 322 and the four observation holes 601, etc. of the substrate holder 220. The observing unit 345 is one example of a determining unit for determining that the initially bonded region is bonded.

The four detectors 341, etc. can be formed using a light receiving unit and a light source, for example. In this case, when the substrate holder 220 holding the substrate 210 is held on the upper stage 322, the four detectors 341, etc. can detect a light intensity of light reflected by the substrates 210, 230 or the like, through the four observation windows 361, etc. and the four observation holes 601, etc.

The lower stage 332 of the bonding unit 300 is mounted on an upper surface in the figure of a Y-direction driving unit 333 superposed on an X-direction driving unit 331 arranged on a bottom plate 312 of the frame body 310. The lower stage 332 also has a holding feature such as a vacuum chuck, an electrostatic chuck, or the like. In the state as shown in the figure, the substrate holder 240 holding the substrate 230 is already held in the lower stage 332.

A microscope 324 and an activation apparatus 326 are fixed on the top plate 316, beside the upper stage 322. The microscope 324 can observe the upper surface of the substrate 230 indirectly held on the lower stage 332. The activation apparatus 326 generates plasma for cleaning the upper surface of the substrate 230 indirectly held on the lower stage 332.

The X-direction driving unit 331 moves parallel to the bottom plate 312, in a direction indicated by the arrow X in the figure. On the X-direction driving unit 331, the Y-direction driving unit 333 moves parallel to the bottom plate 312, in a direction indicated by the arrow Y in the figure. By combining the operation of the X-direction driving unit 331 and the operation of the Y-direction driving unit 333, the lower stage 332 moves parallel to the bottom plate 312 two-dimensionally.

Furthermore, the lower stage 332 is supported by a lift driving unit 338, which moves up and down, in a direction indicated by the arrow Z, perpendicularly to the bottom plate 312. Thus, the lower stage 332 can be raised and lowered relative to the Y-direction driving unit 333. In this manner, the lower stage 332 changes relative positions of the substrate 210 held on the substrate holder 220 and the substrate 230 held on the substrate holder 240, in relation to the upper stage 322 holding the substrate holder 220 holding the substrate 210.

The movement amount of the lower stage 332 caused by the X-direction driving unit 331, the Y-direction driving unit 333, and the lift driving unit 338 is measured precisely by using an interferometer or the like.

A microscope 334 and an activation apparatus 336 are each mounted on the Y-direction driving unit 333, beside the lower stage 332. The microscope 334 can observe the lower surface of the downward-facing substrate 210 indirectly held on the upper stage 322. The activation apparatus 336 generates plasma for cleaning the lower surface of the substrate 210 indirectly held on the upper stage 322. Note that, this activation apparatuses 326 and 336 may be provided on another apparatus other than the bonding unit 300, and a robot may convey the substrate, the upper surface of which is activated, and the substrate holder from the activation apparatuses 326, 336 into the bonding unit 300.

Note that the bonding unit 300 may further include a rotational driving unit for rotating the lower stage 332 around a rotational axis perpendicular to the bottom plate 312 and a rock driving unit for rocking the lower stage 332. Thus, the alignment precision of the substrates 210, 230 can be improved by positioning the lower stage 332 to be parallel to the upper stage 322 and rotating the substrate 210 indirectly held on the lower stage 332.

The microscopes 324, 334 are calibrated by adjusting their focuses to each other or by observing a common index, by the control unit 150. Thus, the relative positions of the pair of microscopes 324, 334 in the bonding unit 300 are measured.

Figure 7:
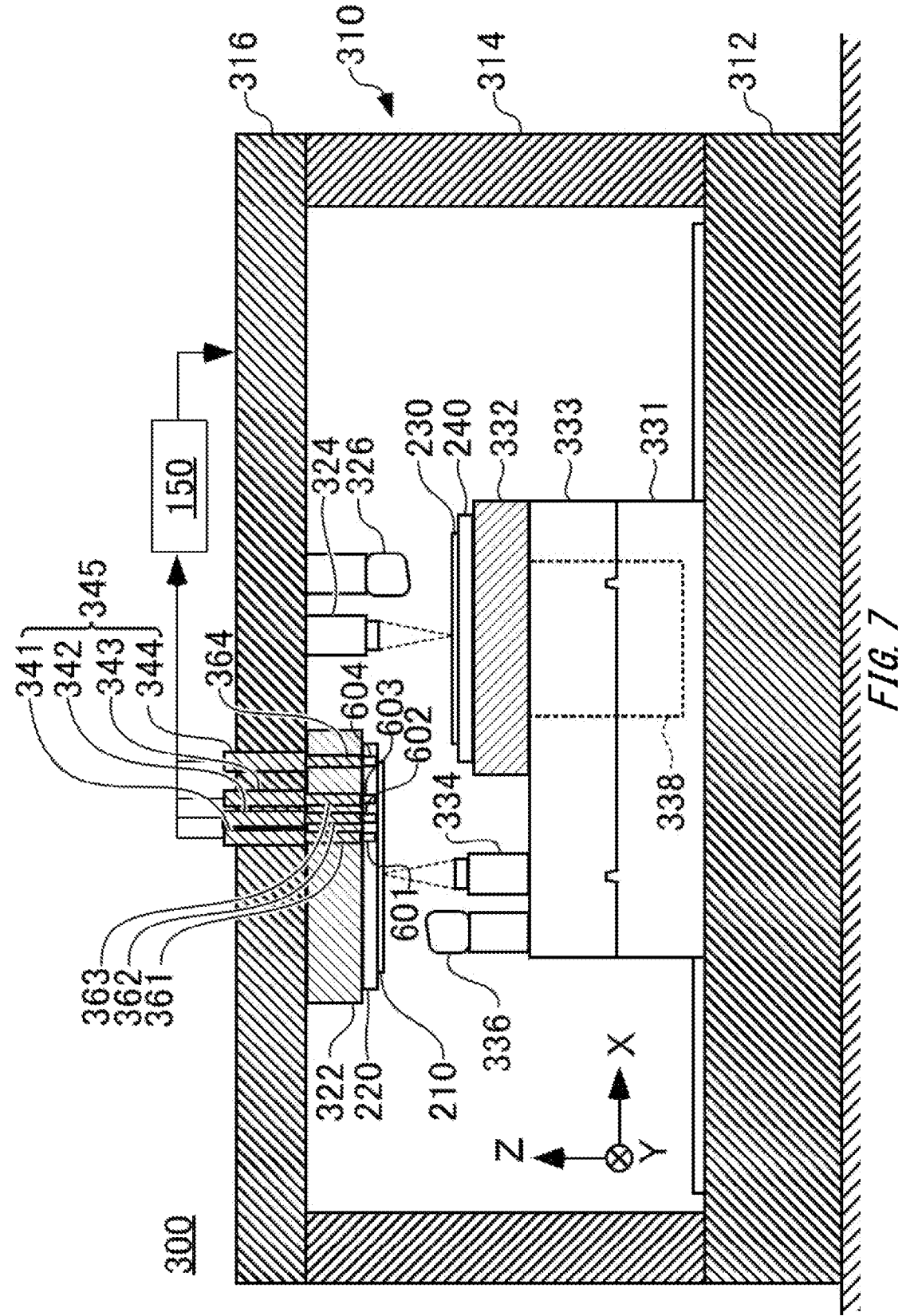
FIG. 7 is a schematic cross-sectional view of the bonding unit 300.

Following the state shown in FIG. 6, as shown in FIG. 7, the control unit 150 operates the X-direction driving unit 331 and the Y-direction driving unit 333 and causes the microscopes 324, 334 to detect the alignment marks 218, 238 provided on each of the substrates 210, 230 (Step S106).

Then, the relative positions of the substrates 210, 230 is calculated by detecting positions of the alignment marks 218, 238 of the substrates 210, 230 with the microscopes 324, 334, whose relative positions are already known (Step S107). Thus, when aligning the substrates 210, 230 with each other, a relative movement amount of the substrates 210, 230 may be calculated so that a positional misalignment amount between the corresponding alignment marks 218, 238 in the pair of substrates 210, 230 is equal to or smaller than a predetermined threshold, or, a positional misalignment amount of the corresponding circuit regions 216, 236 or connecting portions between the substrates 210, 230 is equal to or smaller than a predetermined threshold. The positional misalignment refers to positional misalignment of the corresponding alignment marks 218, 238 and positional misalignment of the corresponding connecting portions between the stacked substrates 210, 230, and includes positional misalignment due to the difference in an amount of distortion occurring in each of the two substrates 210, 230.

Here, the above-mentioned threshold of the positional misalignment amount may be a misalignment amount that allows electrical conduction between the substrates 210, 230 when the bonding of the substrates 210, 230 to each other is completed, and may be a misalignment amount when structures respectively provided on the substrates 210, 230 at least partially come into contact with each other. When the positional misalignment between the substrates 210, 230 is equal to or greater than the threshold, the control unit 150 may determine that the connecting portions are not in contact with each other or appropriate electrical conduction is not established, or a predetermined bonding strength is not obtained between the bonded portions. Furthermore, when a countermeasure is taken in advance before the bonding for distortion occurring in the bonding process of the substrates 210, 230, i.e., when at least one of the substrates 210, 230 are deformed before the bonding so that the positional misalignment due to the distortion is corrected upon completion of the bonding, the threshold may be set by using, as a reference, the positions in a state where the one substrate is deformed.

Figure 8:
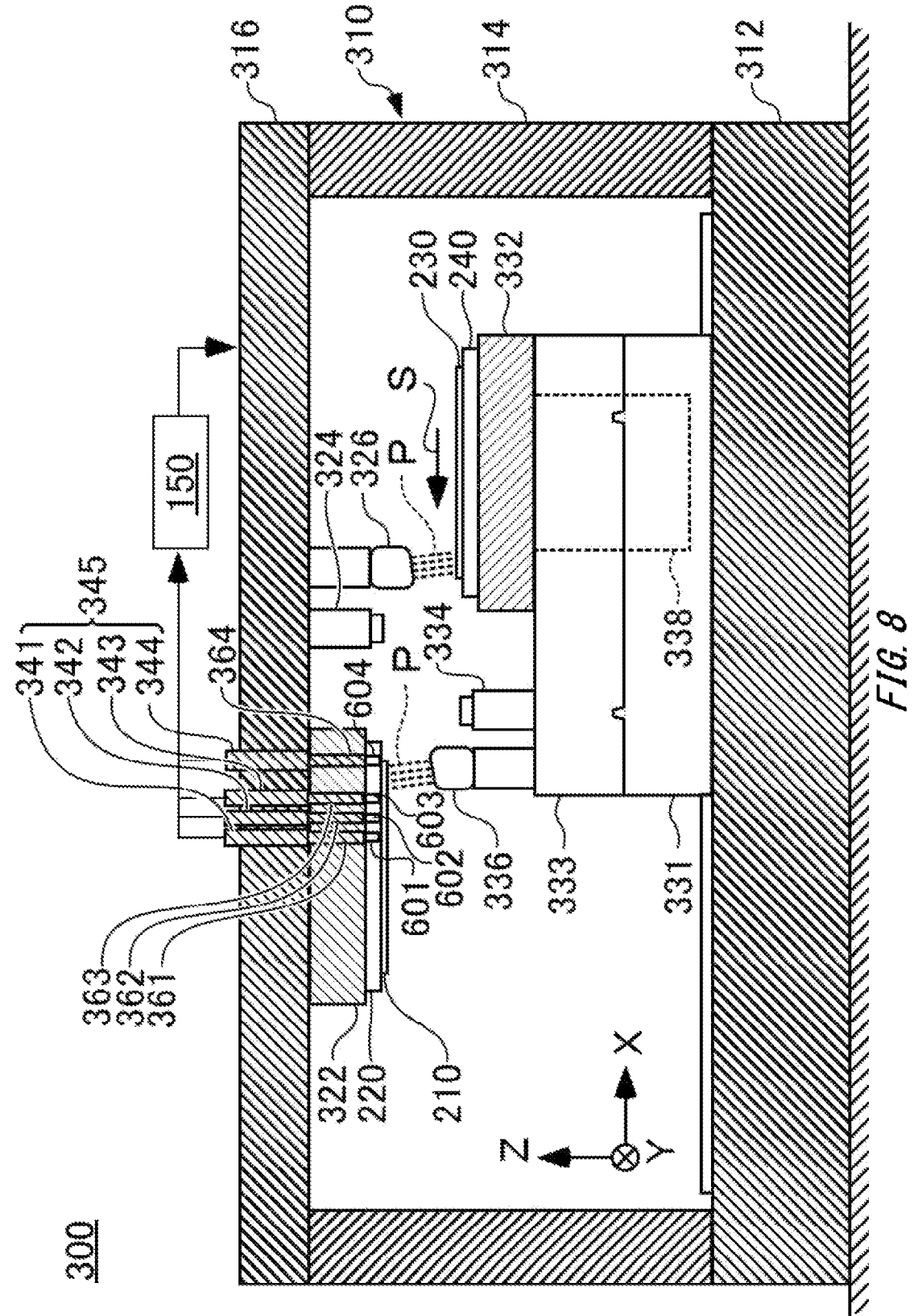
FIG. 8 is a schematic cross-sectional view of the bonding unit 300.

Following the state shown in FIG. 7, as shown in FIG. 8, the control unit 150 records the relative positions of the pair of substrates 210, 230, and chemically activates the bonding surface of each of the pair of substrates 210, 230 (Step S108). The control unit 150 firstly resets the position of the lower stage 332 to an initial position, and then moves the lower stage 332 horizontally to scan the surface of each of the substrates 210, 230 using plasma generated by the activation apparatus 326, 336. Thus, the surface of each of the substrates 210, 230 is cleaned, and the chemical activity is increased. Note that, the activation of the substrates 210, 230 in Step S108 may be performed before Step S106. Moreover, the activation of the substrates 210, 230 may be performed before conveying the substrates 210, 230 into the substrate bonding apparatus 100. Moreover, the substrates 210, 230 may be conveyed to the outside of the substrate bonding apparatus 100 once and, after being activated at the outside, conveyed into the substrate bonding apparatus 100 again.

In addition to the plasma exposure method, the surfaces of the substrates 210, 230 can also be activated by sputter etching using inert gas, ion beam, high speed atom beam, or the like. When using the ion beam or the high speed atom beam, the beam can be generated while the bonding unit 300 is depressurized. Still further, the substrates 210, 230 can also be activated by ultraviolet radiation, ozone asher, or the like. Further, for example, the substrates 210, 230 may also be activated by chemically cleaning the surfaces of the substrates 210, 230 using liquid or gas etchant. After activating the surfaces of the substrates 210, 230, the surfaces of the substrates 210, 230 may be hydrophilized by a hydrophilizing apparatus.

Figure 9:
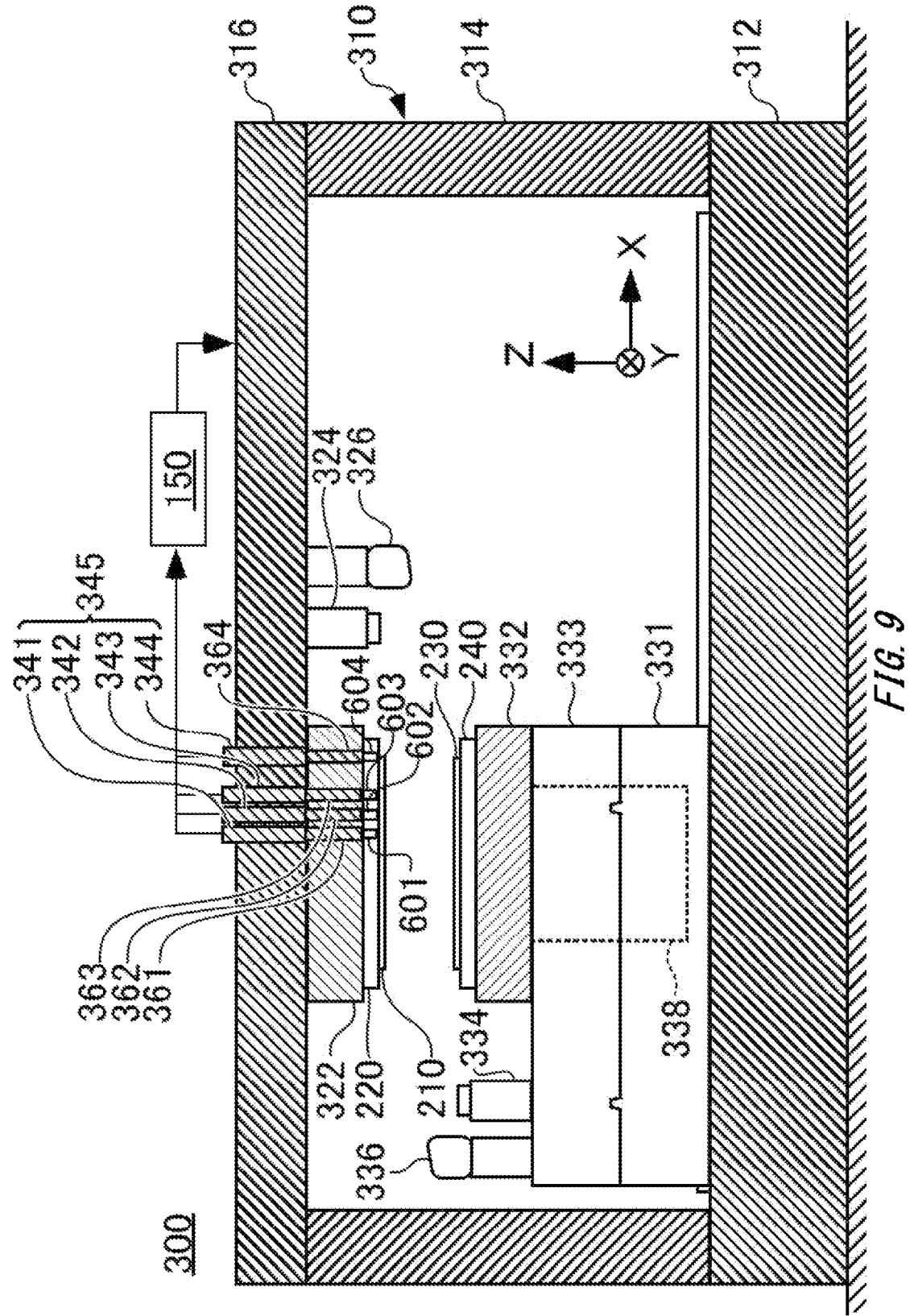
FIG. 9 is a schematic cross-sectional view of the bonding unit 300.

Following the state shown in FIG. 8, as shown in FIG. 9, the control unit 150 aligns the substrates 210, 230 with each other (Step S109 in FIG. 3). The control unit 150 firstly moves the lower stage 332, based on the relative positions of the microscopes 324, 334 detected initially and the positions of the alignment marks 218, 238 of the substrates 210, 230 detected at Step S106, so that the positional misalignment amount of the mutually corresponding structures of the substrates 210, 230 is equal to or smaller than the threshold at least upon completion of the bonding.

Figure 10:
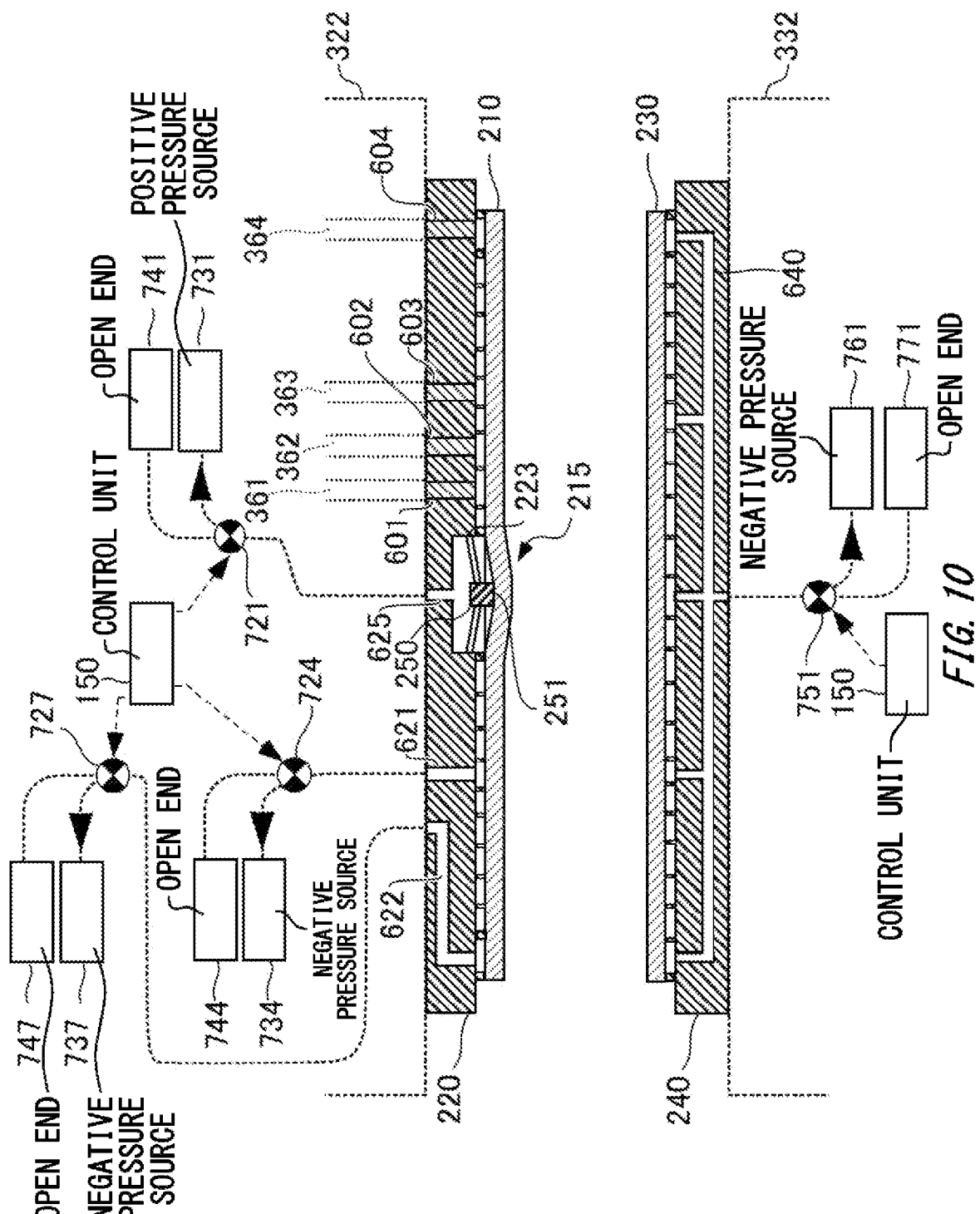
FIG. 10 is a schematic cross-sectional view showing a state of the substrates 210, 230 in the bonding process.

FIG. 10 is a schematic cross-sectional view showing a state of the substrates 210, 230 in the bonding process. FIG. 10 shows the state of the substrates 210, 230 in the state of Step S109 shown in FIG. 9. As shown in the figure, the substrates 210, 230 respectively held on the upper stage 322 and the lower stage 332 via the substrate holders 220, 240 opposes to each other while in alignment with each other. As shown in the figure, because the steeply protruding raised portion 215 is formed in the region C around the center of the flat substrate 210 adsorbed to the substrate holder 220, the interval between the opposing substrates 210, 230 is smaller around the centers of the substrates 210, 230 than at their peripheral portions.

Figure 11:
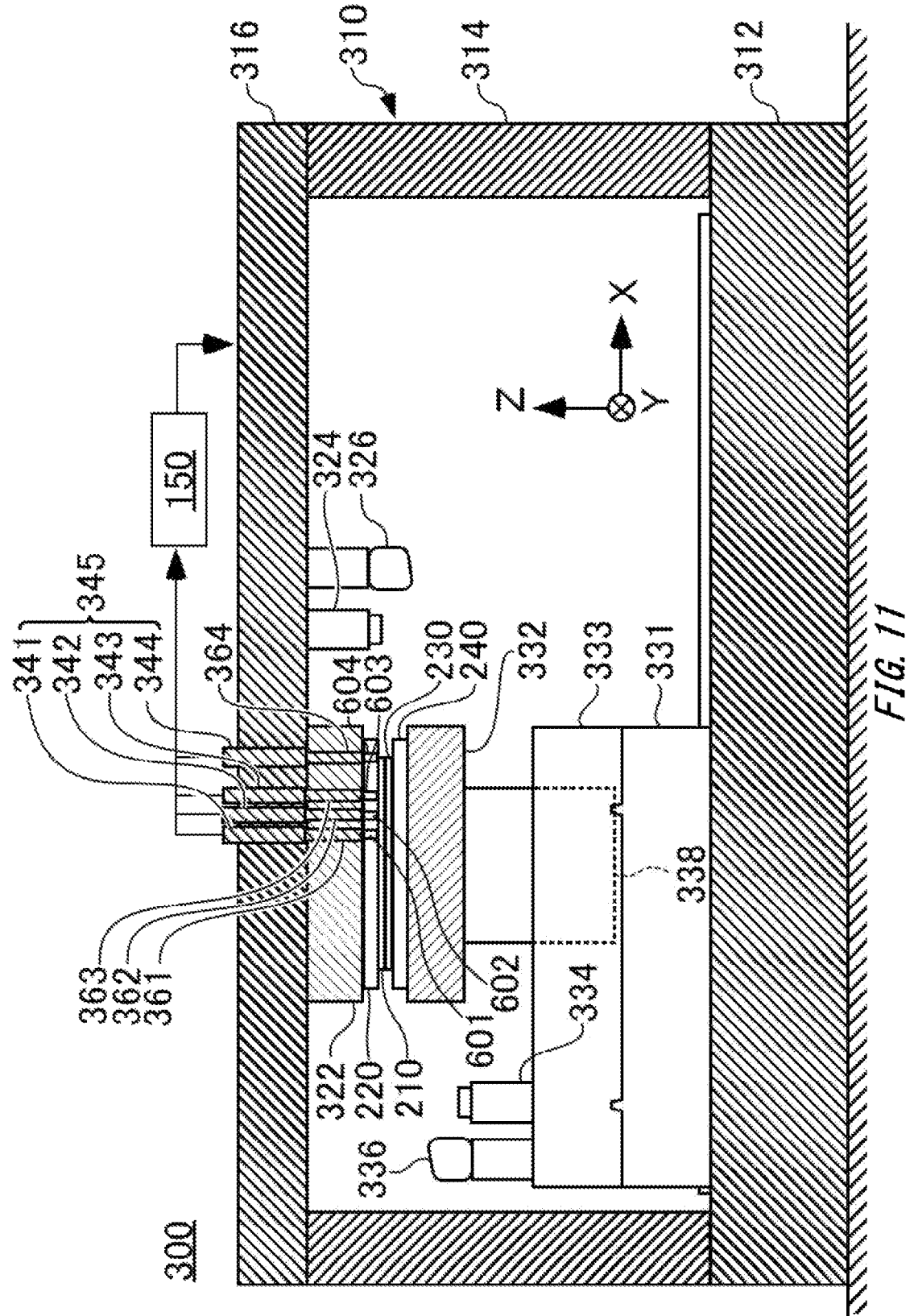
FIG. 11 is a schematic cross-sectional view of the bonding unit 300.

Following the state shown in FIG. 9 and FIG. 10, as shown in FIG. 11, the control unit 150 operates the lift driving unit. 338 to raise the lower stage 332, and moves substrates 210, 230 close to each other. Then, when parts of the substrates 210, 230 come into contact with each other, the contact region forms a bonded region (Step S110). Specifically, when the raised portion 215 of the substrate 210 and a partial region of the substrate 230 opposing the raised portion 215 come into contact with each other, the bonded region is formed in the contact point that is already activated.

Figure 12:
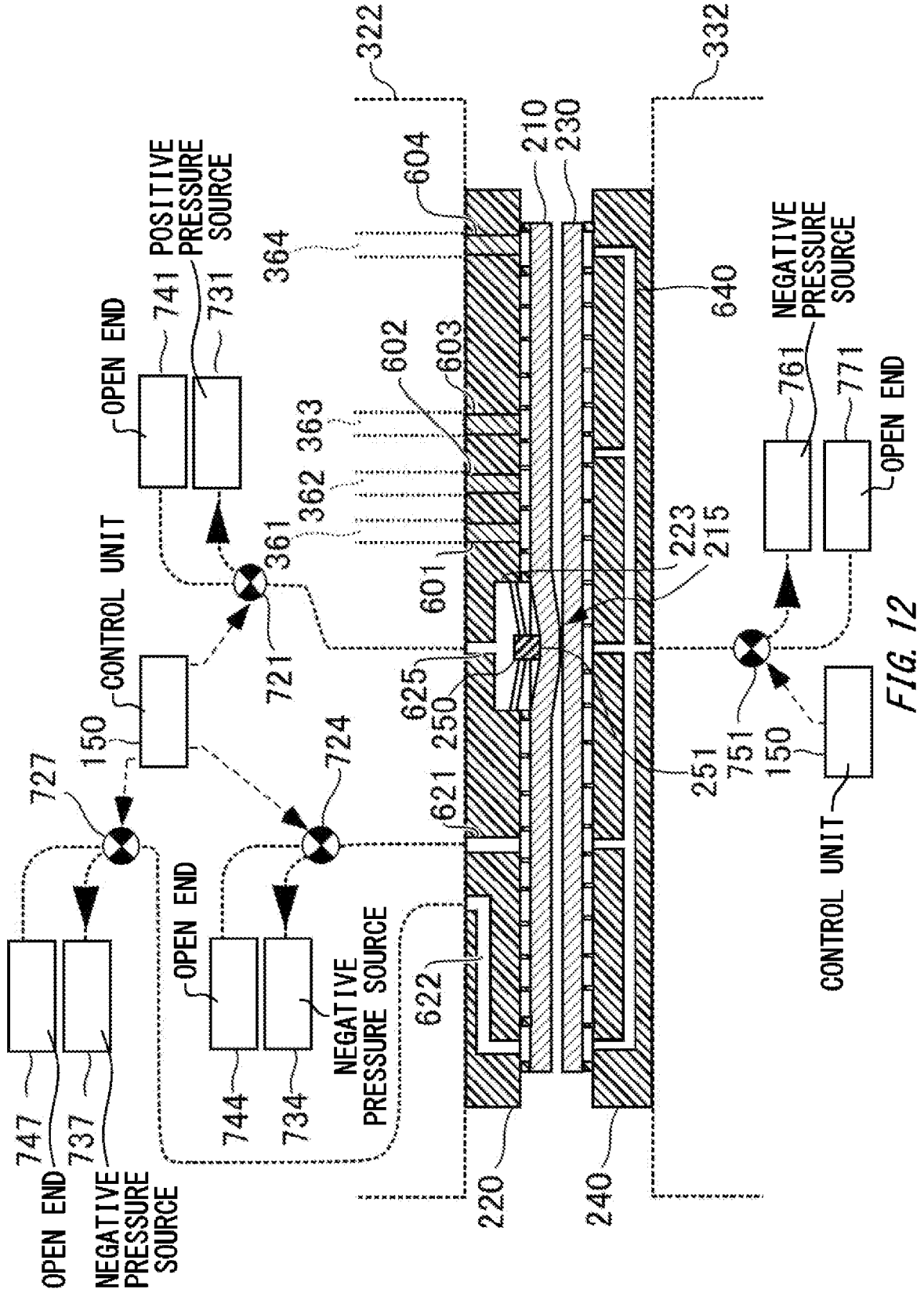
FIG. 12 is a schematic cross-sectional view showing a state of the substrates 210, 230 in the bonding process.

FIG. 12 is a schematic cross-sectional view showing a state of the substrates 210, 230 in the bonding process. FIG. 12 schematically shows, in a cross-section, the state of the substrates 210, 230 in the state of Step S110 shown in FIG. 11. In this phase, the control unit 150 controls the control valves 724, 727, 751 to cause the inner circumferential vent channel 621 and the outermost circumferential vent channel 622 of the substrate holder 220 and the vent channel 640 of the substrate holder 240 to communicate respectively with the negative pressure sources 734, 737, 761. Therefore, the substrates 210, 230 are respectively adsorbed to the substrate holders 220, 240, and the substrates 210, 230 are prevented from contacting with each other at any portion other than the above-mentioned contact point. In this manner, only one contact point is formed between the substrates 210, 230 by using the substrate holder 220 having the protruding member 250 and, as a result, occurrence of a void in the bonding surface due to a plurality of separately formed contact points can be prevented.

Figure 13:
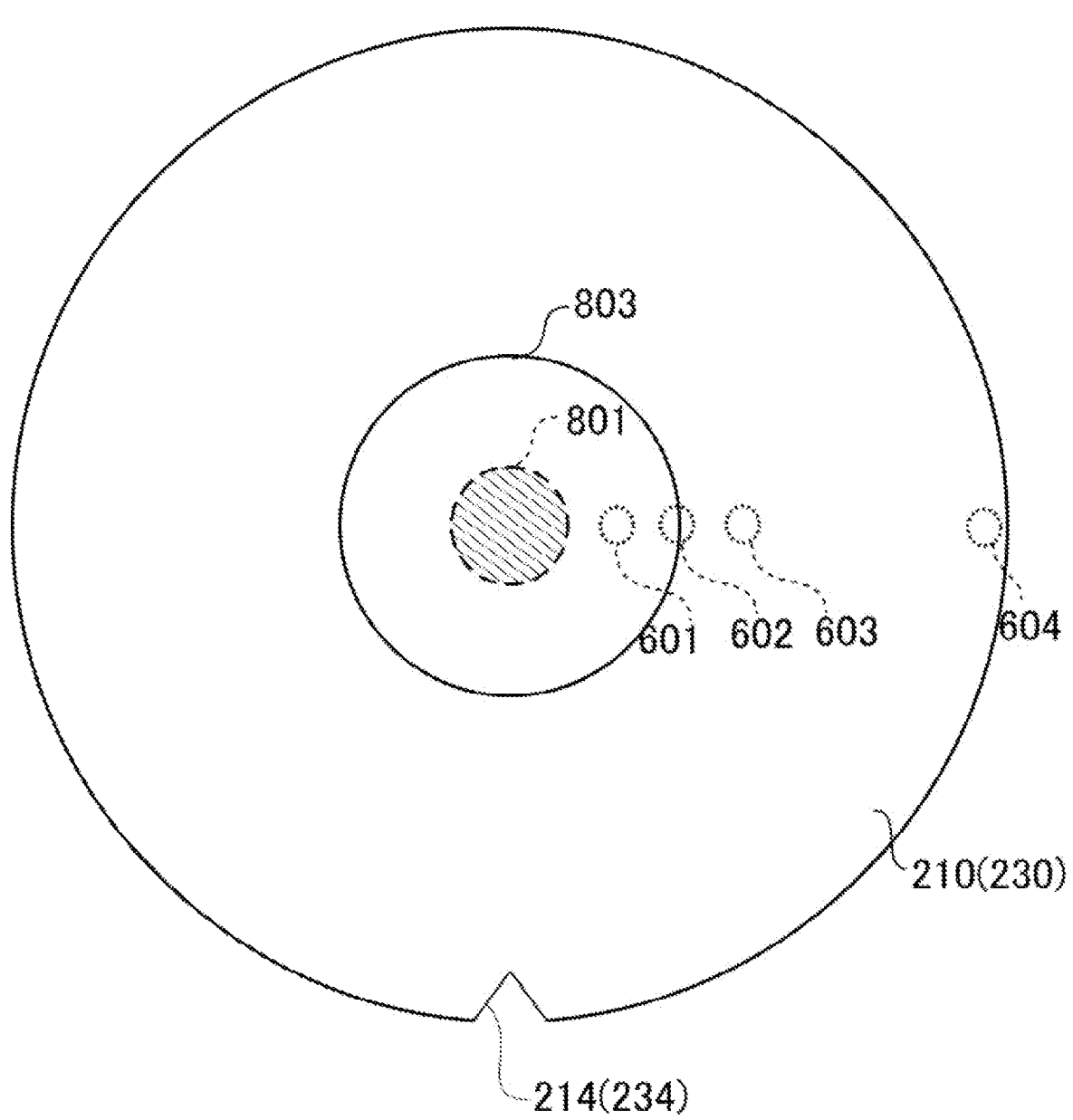
FIG. 13 is a schematic plan view showing a state of the substrates 210 and 230 in the bonding process.

FIG. 13 is a schematic plan view showing a state of the substrates 210, 230 in the bonding process. Specifically, FIG. 13 schematically shows, in a plan view from the side of a back surface of the substrate 210, the state of the substrates 210, 230 in the state of Step S110 shown in FIG. 11 and FIG. 12. A bonded region 801 is formed between the substrates 210, 230 around the center in the plane direction of the substrates. Thus, the substrates 210, 230 expand the bonded region 801 from around the center toward a radially outer side of the substrates 210, 230.

FIG. 13 shows an initially bonded region 803 having a circular shape substantially concentric with the substrates 210, 230, which is preset by the control unit 150. In the present embodiment, the control unit 150 is configured to define in advance three concentric initially bonded regions 803 having different radii, and select one initially bonded region 803 from the three initially bonded regions 803 based on a characteristic of a local curve of the substrate 210 included in information related to the local curve of the substrate 210 on the releasing side. With such configuration, three observation holes 601, 602, 603 are provided in advance in the substrate holder 220 and three observation windows 361 to 363 are provided in the upper stage 322 of the bonding unit 300, correspondingly to the three initially bonded regions 803. When the control unit 150 has selected one initially bonded region 803 based on the characteristic of the local curve of the substrate 210 on the releasing side, a corresponding observation hole, observation window, and detector will be used. FIG. 13 shows that the corresponding observation hole 602 is positioned at the peripheral edge of the selected initially bonded region 803.

Figure 14:
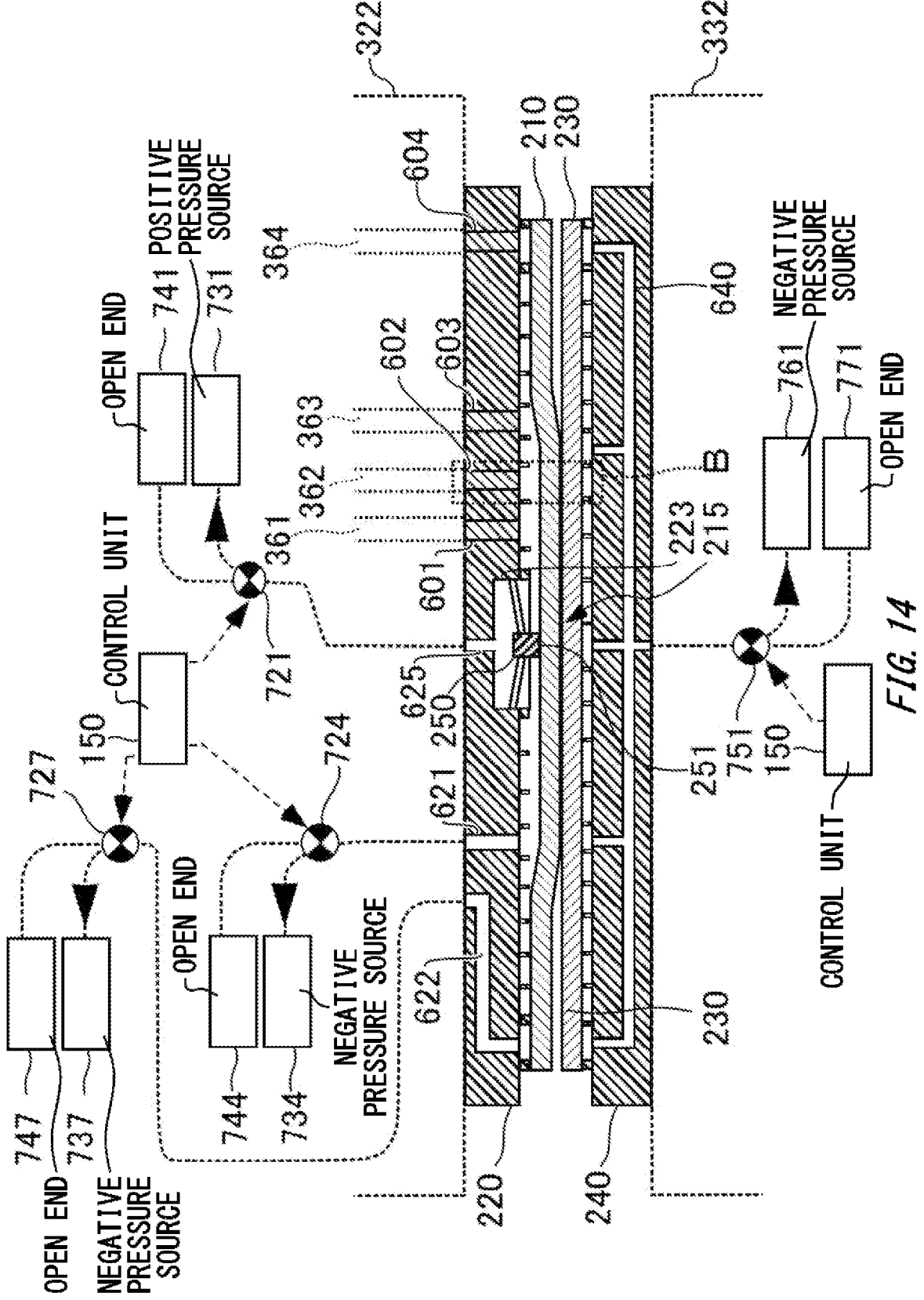
FIG. 14 is a schematic cross-sectional view showing a state of the substrates 210, 230 in the bonding process.

FIG. 14 is a schematic cross-sectional view showing a state of the substrates 210, 230 in the bonding process. Following the state shown in FIG. 12 and FIG. 13, as shown in FIG. 14, the control unit 150 switches the control valve 724 in the upper stage 322, and causes the inner circumferential vent channel 621 of the substrate holder 220 to communicate with the open end 744. Thus, the inner circumferential region of the substrate 210 in the upper side in the figure is unheld from the substrate holder 220 (Step S111), and the substrates 210, 230 are autonomously bonded to each other by the intermolecular force or the like between the activated surfaces. During this time, the outermost circumferential vent channel 622 of the substrate holder 220 is still kept in communication with the negative pressure source 737. Thus, the outermost circumferential region of the substrate 210 in the upper side in the figure is continuously kept in hold by the substrate holder 220.

Because the surfaces of the substrates 210, 230 are activated, when the substrates 210, 230 partially come into contact with each other, the neighboring regions are autonomously adsorbed and bonded to each other by the intermolecular force between the substrates 210, 230. Therefore, for example, by unholding the substrate 230 from the substrate holder 240 held on the upper stage 322, the region where the substrates 210, 230 are bonded to each other sequentially expands from the portion in contact to neighboring regions. This generates a bonding wave by which the bonded region sequentially expands, so that the bonding of the substrates 210, 230 progresses.

After Step S111 is performed, the control unit 150 determines whether the initially bonded region 803 is bonded (Step S112).

Figure 15:
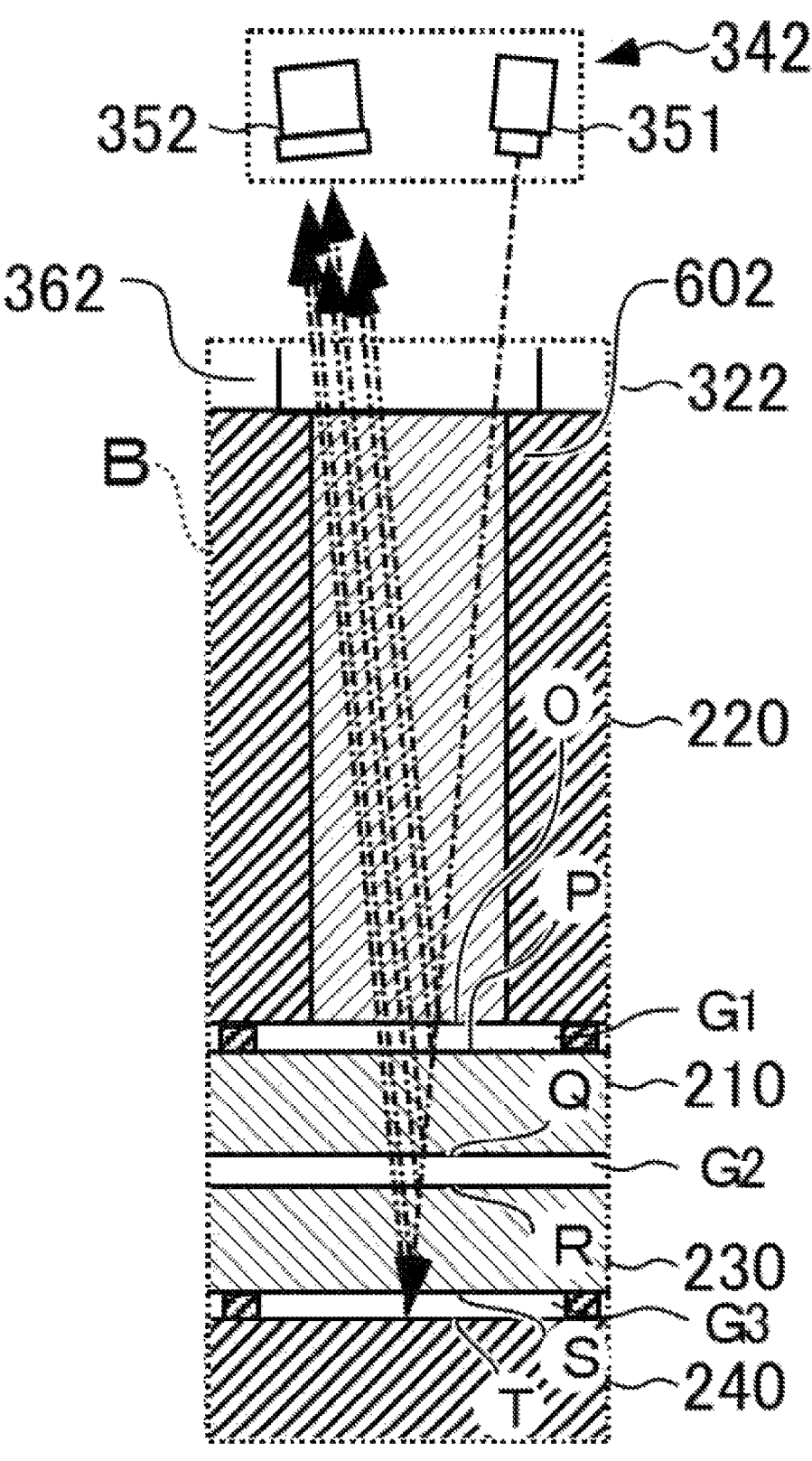
FIG. 15 is a schematic cross-sectional view illustrating an operation of a detector 342.
Figure 16:
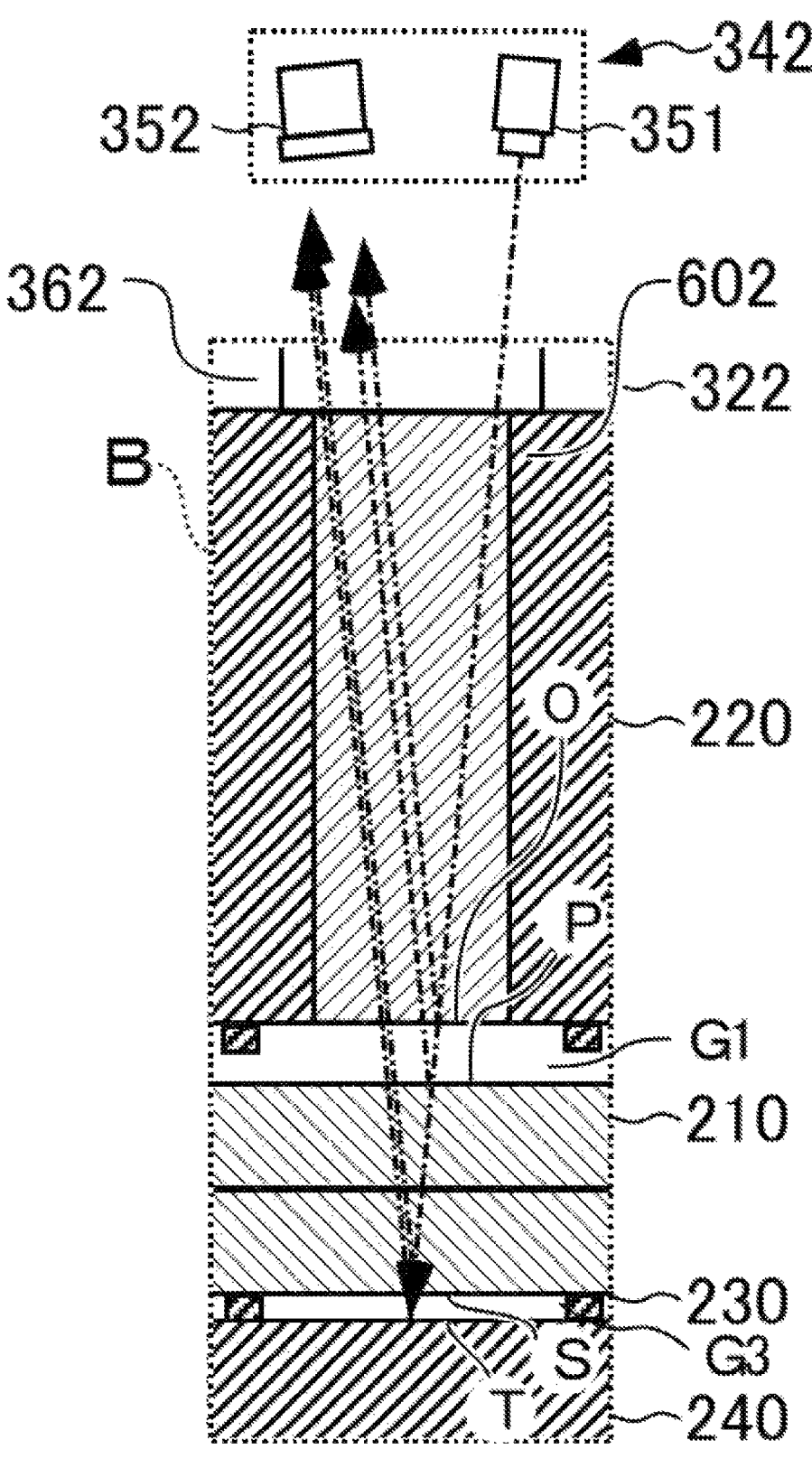
FIG. 16 is a schematic cross-sectional view illustrating an operation of the detector 342.

FIG. 15 and FIG. 16 are schematic cross-sectional views illustrating an operation of the detector 342. FIG. 15 shows, in a partially enlarged view, a state immediately before the substrates 210, 230 come in contact with each other, within a detection range by the detector 342 used for one initially bonded region 803 selected from the three initially bonded regions 803 after Step S111 is performed. The region shown in FIG. 15 corresponds to the region indicated by the dotted line B in FIG. 14.

In the state shown in the figure, a gap G2 is still present between the substrates 210, 230. The gap G2 is formed by the atmosphere or the like in the interior of the bonding unit 300 being sandwiched between the substrates 210, 230. The atmosphere or the like sandwiched between the substrates 210, 230 is expelled as the neighboring regions are autonomously adsorbed and sequentially bonded to each other by the intermolecular force between the substrates 210, 230, and finally the substrates 210, 230 come in close contact and bonded to each other. However, the time required for the substrates 210, 230 to be bonded to each other may vary in the circumferential direction of the substrates 210, 230 due to the characteristic of the local curve of the substrate 210 on the releasing side, the density of the sandwiched atmosphere, or the like. Of course, the above-mentioned time may vary for each of the substrates 210, 230, for each type of the substrates 210, 230, for each manufacturing process, or for each manufacturing lot.

In the bonding unit 300, even when the substrates 210, 230 are sandwiched between the upper stage 322 and the lower stage 332, the region at the peripheral edge of the initially bonded region 803 of the substrate 210 optically communicates with the detector 342 through the observation hole 602 and the observation window 362. In the example shown in the figure, the detector 342 has a light source 351 and a light receiving unit 352.

The light source 351 generates irradiation light of a wavelength that at least partially transmits through the substrate 210. The irradiation light generated by the light source 351 is irradiated toward the substrate 210 through the observation window 362 and the observation hole 602. The light receiving unit 352 has a photoelectric converting element such as a photodiode and is configured to receive the irradiation light reflected by the substrates 210, 230 or the like and generate an electrical signal according to the reflected light intensity. The electrical signal generated by the light receiving unit 352 is input to the control unit 150.

As indicated by a dot-and-dash line in the figure, between the upper stage 322 and the lower stage 332, a reflection surface is formed at the boundary of media having different refractive indices. In the example shown in the figure, reflection surfaces O, P, Q, R, S, T are respectively formed at the boundary between the observation hole 602 and the gap G1, at the boundary between the gap G1 and the substrate 210, at the boundary between the substrate 210 and the gap G2, at the boundary between the gap G2 and the substrate 230, at the boundary between the substrate 230 and the gap G3, and at the boundary between the gap G3 and the substrate holder 240. Therefore, the irradiation light irradiated from the light source 351 of the detector 342 through the observation window 362 and the observation hole 602 is reflected at each of the reflection surfaces O, P, Q, R, S, T and enters the light receiving unit 352 again through the observation hole 602 and the observation window 362, so that the intensity of the reflected light is detected.

FIG. 16 shows, in a partially enlarged view from the same viewpoint as that in FIG. 15, a state where the initially bonded region 803 of the substrate 210 is bonded after Step S111 is performed. When the substrates 210, 230 are bonded to and come in close contact with each other, a pair of reflection surfaces R, Q formed between the substrates 210, 230 and the gap G2 disappear. Thus, the number of the reflection surfaces that reflects the irradiation light of the detector 342 is reduced, and the reflected light intensity detected by the detector 342 is lowered. Therefore, based on detection information outputted from the detector 342, the control unit 150 can determine that the initially bonded region 803 of the substrate 210 is bonded. Note that, the reflected light intensity detected by the detector 342 may change in the reducing process of the gap G2 before the gap G2 disappears. However, in such change in the reducing process, the reflected light intensity is not lowered as the gap G2 reduces, but the reflected light is repeatedly brightened and darkened due to interference occurring between the irradiation light and the reflected light.

Figure 17:
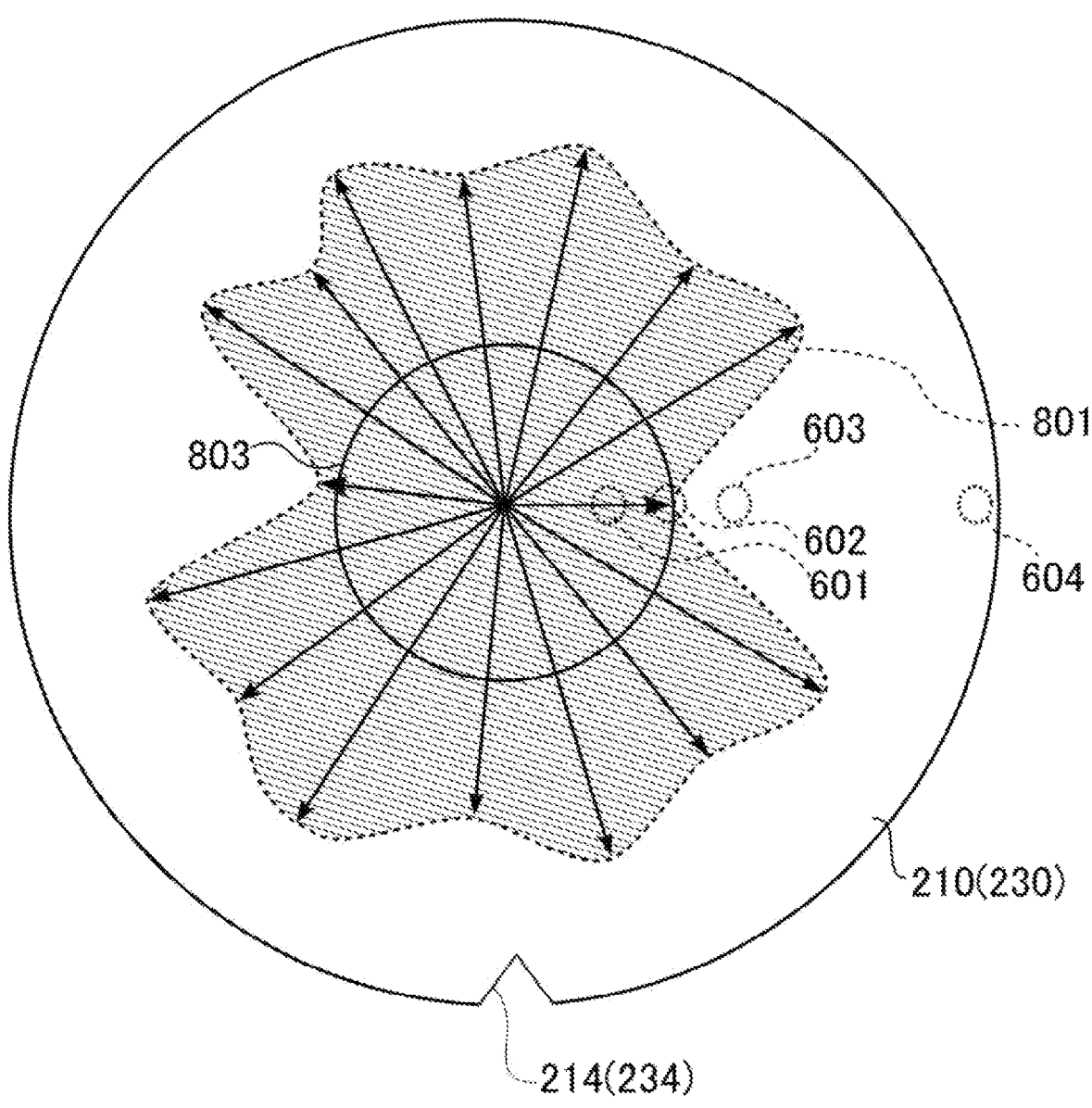
FIG. 17 is a schematic plan view showing a state of the substrates 210 and 230 in the bonding process.

FIG. 17 is a schematic plan view showing a state of the substrates 210, 230 in the bonding process. Specifically, FIG. 17 schematically shows, in a plan view from the side of the back surface of the substrate 210, the state of the substrates 210, 230 shown in FIG. 16. The bonded region 801 in the substrates 210, 230 shown in FIG. 13 is shown as being expanded from around the center toward the radially outer side of the substrates 210, 230, but the progression rate of the expansion of the bonded region 801 is irregular in the circumferential direction of the substrates 210, 230.

After Step S111 is performed, when the control unit 150 determines that the initially bonded region 803 of the substrate 210 is not bonded (Step S112: NO) based on detection information outputted from the detector 342, the control unit 150 continues reception of the detection information from the detector 342 and determination, and, when the control unit 150 determines that the initially bonded region 803 of the substrate 210 is bonded (Step S112: YES), the control unit 150 switches the control valve 727 on the upper stage 322 to cause the outermost circumferential vent channel 622 of the substrate holder 220 to communicate with the open end 747. Thus, the outermost circumferential region of the substrate 210 in the upper side in the figure is also unheld from the substrate holder 220 (Step S113), and the substrates 210, 230 are autonomously bonded to each other as far as the peripheral edges of the substrates 210, 230 by the intermolecular force or the like between the activated surfaces.

In other words, in the example shown in the figure, during the time period from the time when the bonding wave of the substrate 210 occurs by switching the control valve 724 to cause the inner circumferential vent channel 621 of the substrate holder 220 to communicate with the open end 744 to the time when the bonding wave stops due to the lifting force generated in the substrate 210 by the substrate holder 220 holding the outermost circumferential region of the substrate 210, at or after the time when it is determined that the initially bonded region 803 is bonded, the outermost circumferential vent channel 622 is caused to communicate with the open end 747, so that the outermost circumferential region of the substrate 210 is released from the substrate holder 220.

Note that, in FIG. 15 and FIG. 16, the irradiation light is described as if the irradiation light is irradiated at an inclined angle relative to the substrates 210, 230, for the purpose of making the irradiation light easily distinguished from the reflected light in the figures. However, even when the irradiation light is irradiated perpendicularly to the substrates 210, 230, an optical system for detecting the reflected light intensity can be formed by using an optical device such as a half mirror. Furthermore, the detector 342 may use an image sensor such as a CCD or CMOS sensor, instead of the light receiving unit 352. Furthermore, the above-mentioned structure of the detector 342 can also be applied to other detectors 341, 343, 344 shown in FIG. (or the like.

Figure 18:
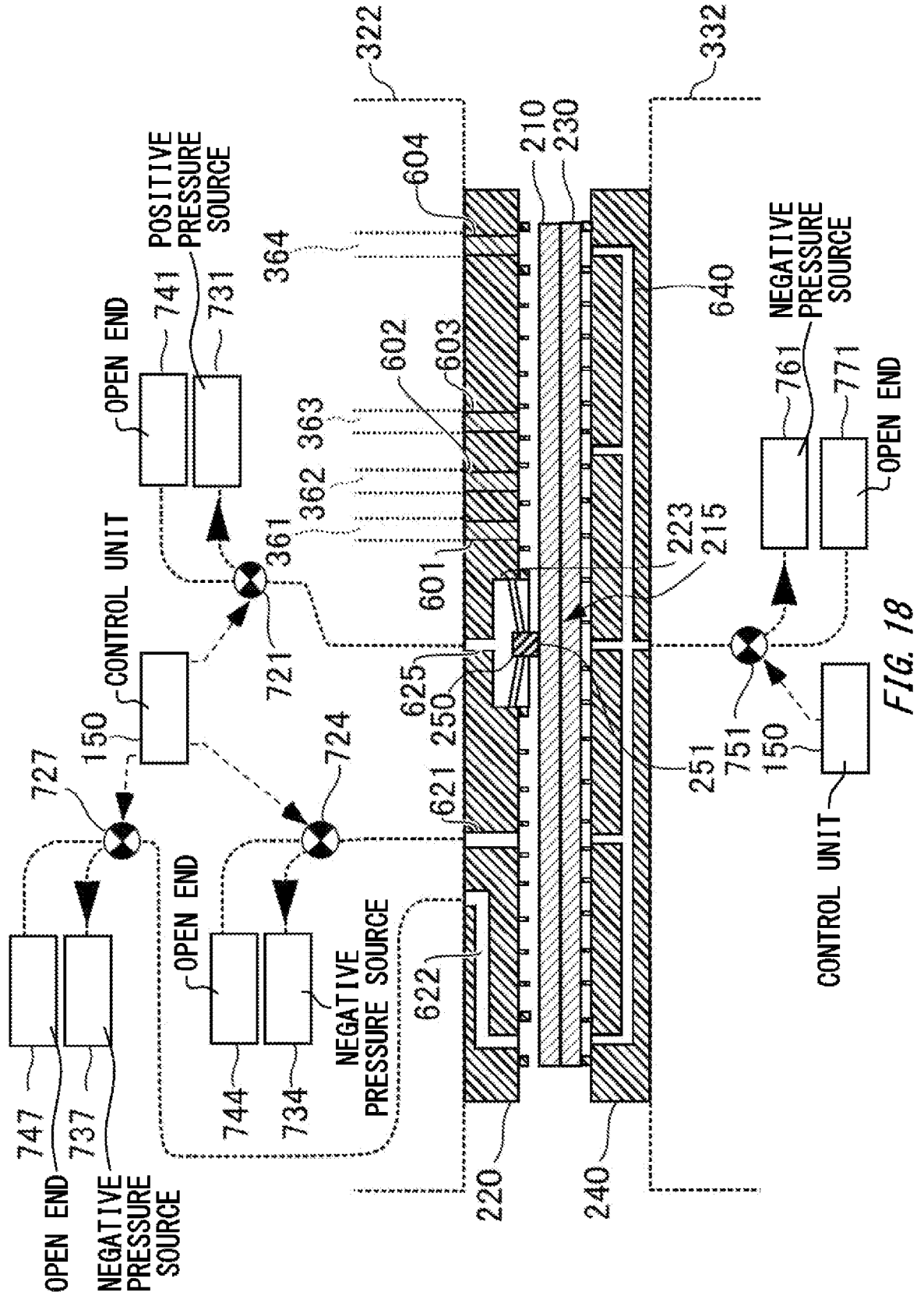
FIG. 18 is a schematic cross-sectional view showing a state of the substrates 210, 230 in the bonding process.

FIG. 18 is a schematic cross-sectional view showing a state of the substrates 210, 230 in the bonding process. After Step S113 is performed, when the control unit 150 determines that the bonding of the substrates 210, 230 is not completed (Step S114: NO) based on the detection information outputted from the detector 344 positioned at the peripheral edge of the substrate 210, the control unit 150 continues reception of the detection information from the detector 344 and determination, and, when the control unit 150 determines that the bonding of the substrates 210, 230 is completed (Step S114: YES), the control unit 150, i.e., when the progression of the bonding wave in the bonding surface of the substrates 210, 230 is completed as shown in FIG. 18, the control unit 150 causes the multilayer substrate 290 formed from the substrates 210, 230 to be conveyed out of the bonding unit 300 with the substrate holder 240 by the conveying unit. 140, after a predetermined time (Step S115). Then, the multilayer substrate 290 and the substrate holder 240 are separated in the pre-aligner 500, and the multilayer substrate 290 is conveyed into the substrate cassette 130 by the conveying unit 140. Note that the multilayer substrate 290 and the substrate holder 240 may be separated in the bonding unit 300 and the multilayer substrate 290 alone may be conveyed out of the bonding unit 300 and conveyed into the substrate cassette 130 by the conveying unit 140.

The following describes a setting method of the initially bonded region 803. In particular, an example of setting the initially bonded region 803 based on a characteristic of a local curve is described. Here, the substrate 210 on the releasing side having a local curve before the bonding is one cause of nonlinear distortion that occurs at the time of bonding. In this case, in the bonding unit 300, even when the substrates 210, 230 are aligned in the plane direction based on the alignment marks 218, 238, or the like, positional misalignment between the substrates 210, 230 may not be eliminated. Therefore, in Step S101 and Step S102 shown in FIG. 3, the control unit 150 acquires information related to a local curve in the substrate 210 on the releasing side, and preset an initially bonded region 803 of the substrate 210 on the releasing side, based on a characteristic of the local curve of the substrate 210 included in the acquired information. Then, as shown in FIG. 14 to FIG. 18, the control unit 150 keeps hold of the outermost circumferential region of the substrate 210 by the substrate holder 220, until it is detected that the preset initially bonded region 803 is bonded by the bonded region 801 expanding from around the center toward the outer circumference of the substrates 210, 230.

Here, the distortion occurring in the substrates 210, 230 is displacement causing positions of structures on each of the substrates 210, 230 to be displaced from designed coordinates, i.e., designed positions. The distortion occurring in the substrates 210, 230 includes planar distortion and stereoscopic distortion.

The planar distortion is distortion occurring in a direction along the bonding surface of the substrates 210, 230, and includes linear distortion in which the positions of structures on each of the substrates 210, 230 displaced relative to the designed positions of the structures can be represented by linear transformation, and nonlinear distortion that is not the linear distortion and cannot be represented by linear transformation.

The linear distortion includes magnification distortion in which the displacement amount increases at a constant increase rate along the radial direction from the center. The magnification distortion is a value obtained by dividing the amount of misalignment from the designed value at a distance X from the center of the substrates 210, 230 by X, and is measured in units of ppm. The magnification distortion includes isotropic magnification distortion. The isotropic magnification distortion is distortion in which the X component and the Y component of a displacement vector from the designed position are equal, i.e. the magnification in the X direction and the magnification in the Y direction are equal. On the other hand, anisotropic magnification distortion in which the X component and the Y component of the displacement vector from the designed position are different, i.e. distortion in which the magnification in the X direction and the magnification in the Y direction are different, is included in the nonlinear distortion.

In the present embodiment, the difference in the magnification distortion, when using, as a reference, the designed positions of at least the circuit regions 216, 236 among the structures on each of the two substrates 210, 230 is included in the positional misalignment amount between the two substrates 210, 230. Note that the designed positions of the circuit regions 216, 236 in each of the two substrates 210, 230 to be bonded may be designed differently, considering the positional misalignment amount due to the difference in magnification distortion occurring by the bonding.

Furthermore, the linear distortion includes orthogonal distortion. The orthogonal distortion is distortion by which, when the X-axis and the Y-axis orthogonal to each other are set with the center of a substrate as the origin, a structure is displaced from the design position, in a direction parallel to the X-axis direction, by an amount that becomes greater as the structure is farther from the origin in the Y-axis direction. This displacement amount is equal in each of a plurality of regions that cross the Y-axis in a direction parallel to the X-axis, and the absolute value of the displacement amount becomes greater as it is farther from the X-axis. Furthermore, in the orthogonal distortion, the direction of displacement on the positive side of the Y-axis and the direction of the displacement on the negative side of the Y-axis are opposite each other.

The stereoscopic distortion of the substrates 210, 230 is displacement in a direction that is not the direction along the bonding surface of the substrates 210, 230, i.e. a direction that intersects with the bonding surface. The stereoscopic distortion includes a curve occurring in the entire or some part of the substrates 210, 230 due to entire or partial bending of the substrates 210, 230. Here, the "bending of the substrates" means that the substrates 210, 230 change their shape in such a manner that the surfaces of the substrates

210, 230 include points that do not exist on a plane defined by three points on the original substrates 210, 230.

Furthermore, a curve is distortion in which the surface of the substrate forms a curved surface, and includes warping of the substrates 210, 230, for example. In the present embodiment, warping refers to distortion that remains in the substrates 210, 230 when the effect of gravity is eliminated. Distortion of the substrates 210, 230 resulting from the effect of gravity added to the warping is referred to as deflection. Note that the warping of the substrates 210, 230 includes global warping in which the substrates 210, 230 are flexed entirely with a substantially uniform curvature and local warping in which a part of the substrates 210, 230 is flexed with a varied local curvature.

Here, the magnification distortion is classified as initial magnification distortion, adsorption magnification distortion, and bonding process magnification distortion, depending on the cause of the distortion.

The initial magnification distortion is caused by factors such as the stress generated in the process of forming the alignment marks 218, the circuit regions 216, or the like on the substrates 210, 230 and periodic rigidity change caused by the positional arrangement of the scribe lines 212, the circuit regions 216, or the like, and manifests from the phase before the bonding of the substrates 210, 230 as a deviation from the design specifications of the substrates 210, 230. Therefore, the initial magnification distortion of the substrates 210, 230 can be known from before starting the stacking of the substrates 210, 230, and the control unit 150 may acquire information related to the initial magnification distortion from a pre-processing apparatus that manufactured the substrates 210, 230, for example.

The adsorption magnification distortion is distortion occurring in the substrates 210, 230 when the substrates 210, 230 having distortion such as warping is bonded or adsorbed to a flat holding member. When the substrates 210, 230 having warping are adsorbed and held by the flat substrate holders 220, 240 or the lower stage 332, the substrates 210, 230 deforms following the shape of the holding surface of the flat substrate holders 220, 240 or the lower stage 332. Here, when the substrates 210, 230 change from a state where the substrates 210, 230 have warping to a state where the substrates 210, 230 have a shape following the shape of the holding surface of the substrate holders 220, 240 or the lower stage 332, the distortion amount of the substrates 210, 230 changes compared to that before the hold.

Therefore, the distortion amount of the circuit regions 216 on the surface of the substrates 210, 230 relative to the design specifications changes compared to that before the hold. The change in the distortion amount of the substrates 210, 230 varies according to the configurations of the structures such as the circuit regions 216 formed on the substrates 210, 230, the processes for forming these structures, a magnitude of the warping of the substrates 210, 230 before the hold, or the like. When distortion such as warping has occurred in the substrates 210, 230, the magnitude of the adsorption magnification distortion can be calculated from the state of the distortion including a warping amount, a warping shape, or the like of the substrates 210, 230, by performing in advance an investigation of the correlation between the distortion and the adsorption magnification distortion.

Figure 19:
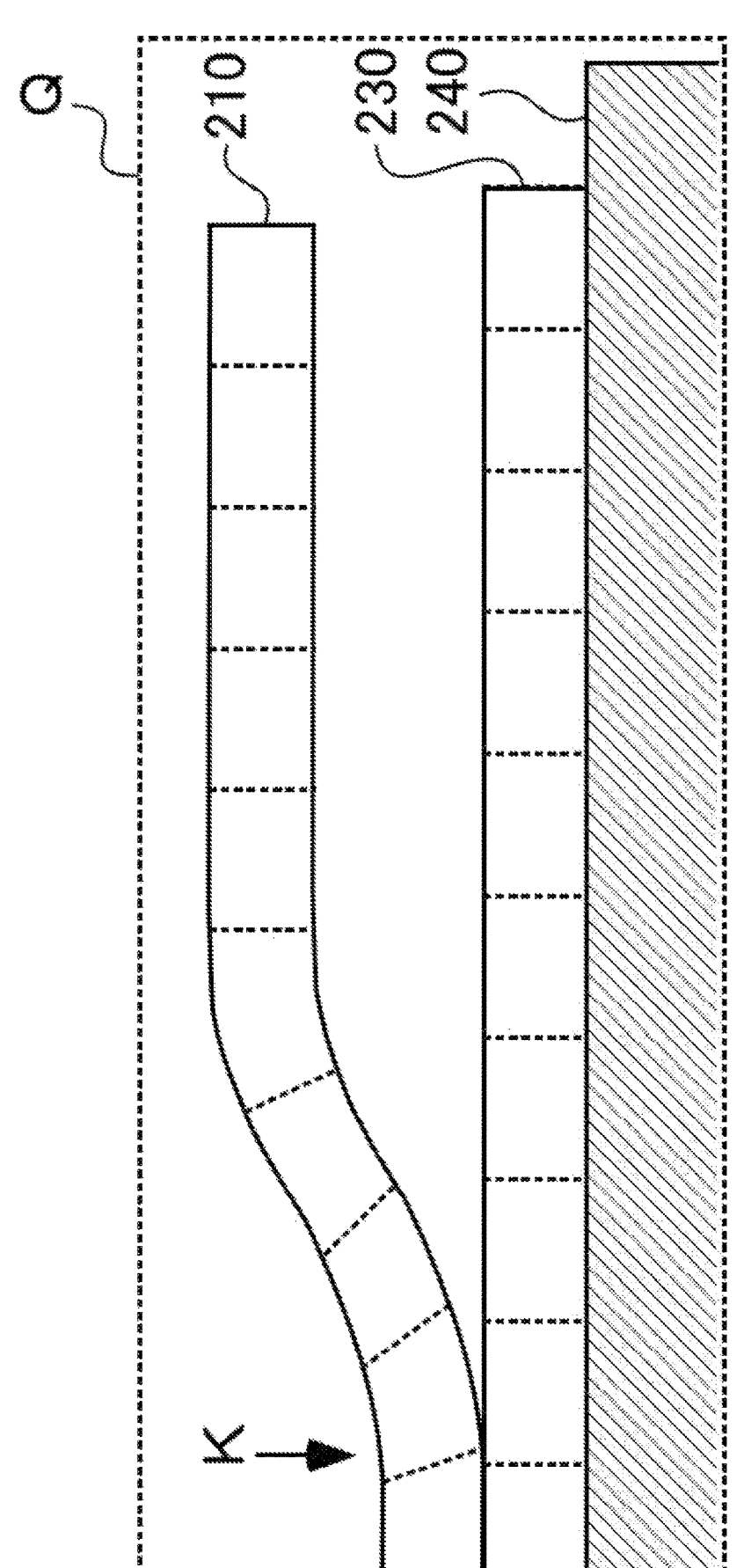
FIG. 19 is a partially enlarged view showing the bonding process of the substrates 210, 230 on the substrate holder 240 for the fixed side having a flat holding surface.
Figure 20:
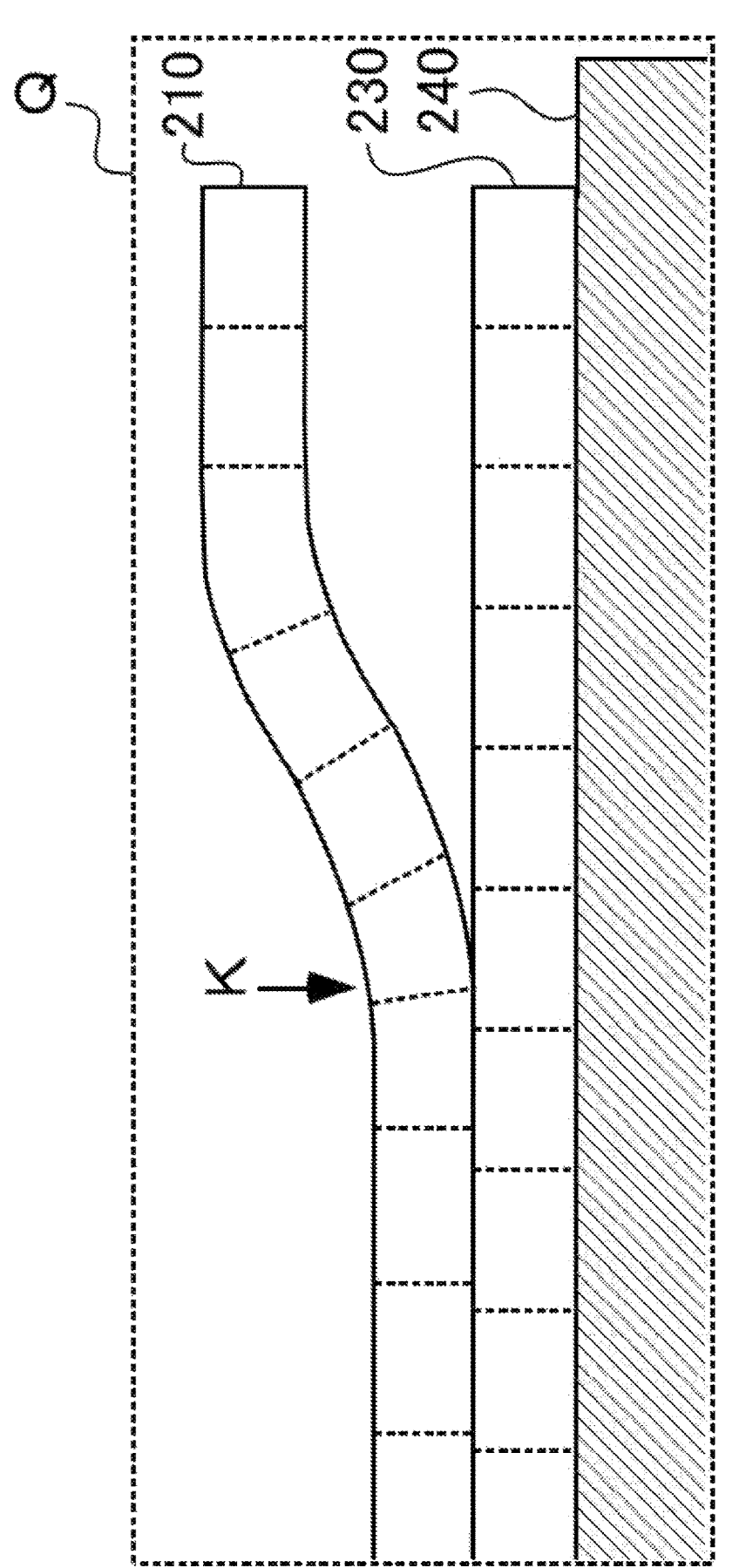
FIG. 20 is a partially enlarged view showing the bonding process of the substrates 210, 230 on the substrate holder 240 for the fixed side having a flat holding surface.
Figure 21:
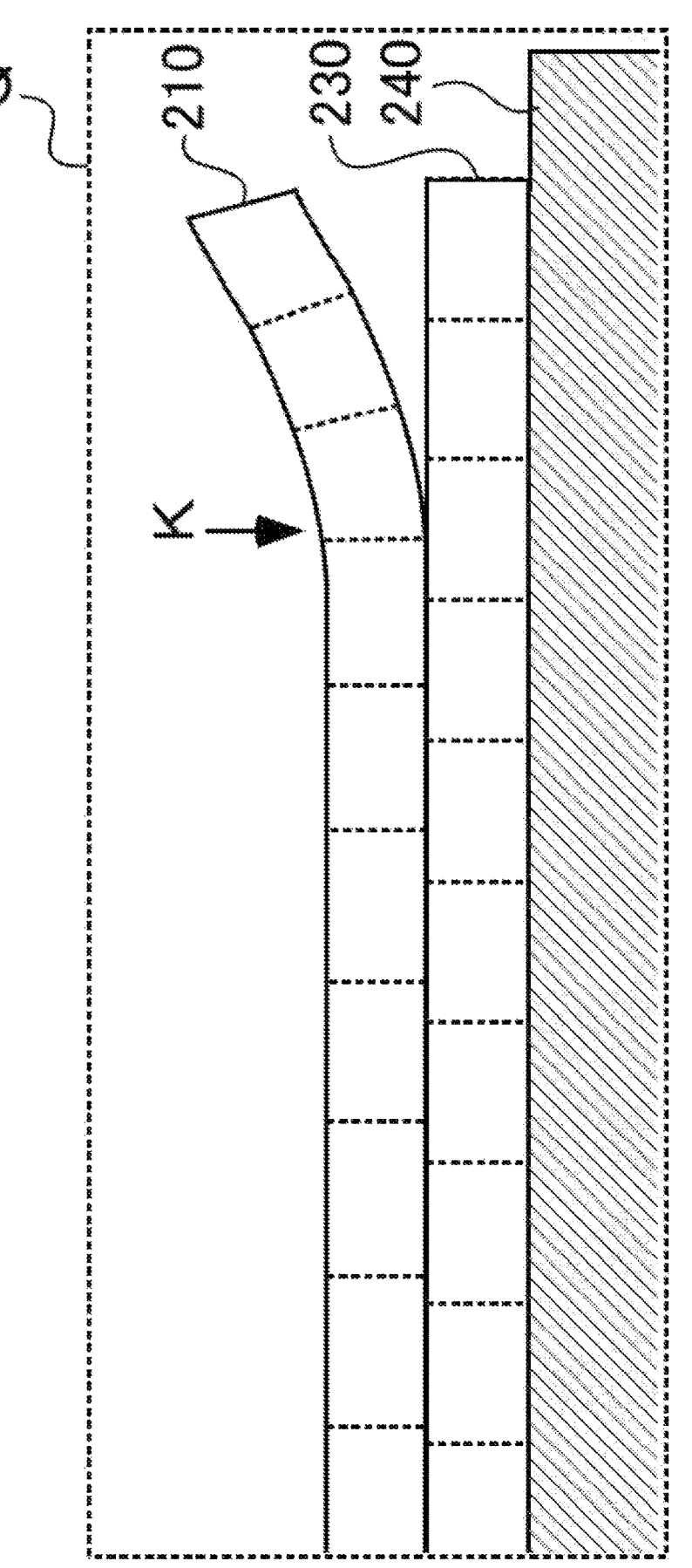
FIG. 21 is a partially enlarged view showing the bonding process of the substrates 210, 230 on the substrate holder 240 for the fixed side having a flat holding surface.

The bonding process magnification distortion is a newly occurring change of magnification distortion caused by distortion that occurs in the substrates 210, 230 during the process of bonding. FIG. 19, FIG. 20 and FIG. 21 are partially enlarged views showing the bonding process of the substrates 210, 230 on the substrate holder 240 for the fixed side having a flat holding surface. FIG. 19, FIG. 20 and FIG. 21 show, in enlarged views, a region Q around a boundary K between the contact region in which the substrates 210, 230 are in contact with each other and a non-contact region where the substrates 210, 230 are separated without contact with each other and will be bonded later, in the substrates 210, 230 that are currently undergoing the bonding process by the bonding unit 300.

As shown in FIG. 19, in the process in which the area of the contact region between the substrates 210, 230 partially in contact with each other expands from the center toward the outer circumference, the boundary K moves from the center side toward the outer circumferential side of the substrates 210, 230. Around the boundary K, the substrate 210 unheld from the substrate holder 220 stretches due to the atmosphere interposed between the substrate 210 and the substrate 230, more specifically due to the air resistance occurring when air interposed between the substrate 210 and the substrate 230 is expelled, for example. More specifically, at the boundary K, the substrate 210 stretches at the lower surface side of the substrate 210 in the figure and contracts at the upper surface side of the substrate 210 in the figure, relative to the plane at the center of the substrate 210 in the thickness direction.

In this way, as shown by the dotted lines in the figure, the substrate 210 distorts at the outer end of the region that is bonded to the substrate 230, as if the positional misalignment relative to the design specifications of the circuit regions 216 on the surface of the substrate 210 is expanded compared to the substrate 230. Therefore, as shown by the misalignment between the dotted lines in the figure, positional misalignment caused by the difference in the stretching amount, i.e. the magnification distortion, of the substrate 210 occurs between the substrate 230 on the lower side held by the substrate holder 240 and the substrate 210 on the upper side unheld from the substrate holder 220.

Furthermore, as shown in FIG. 20, when the substrates 210, 230 are brought into contact with and bonded to each other in the state described above, the expanded magnification distortion of the substrate 210 is fixed. Further, as shown in FIG. 21, the stretching amount of the substrate 210 fixed by the bonding is accumulated as the boundary K moves toward the outer circumference of the substrates 210, 230.

The amount of the bonding process magnification distortion as described above can be calculated based on physical quantities such as the rigidity of the substrates 210, 230 to be bonded, the viscosity of the atmosphere sandwiched between the substrates 210, 230. Furthermore, a misalignment amount caused by bonding of substrates manufactured in the same lot as the substrates 210, 230 to be bonded may be measured and recorded in advance, and the control unit 150 may acquire the recorded measurement values as information related to the bonding process magnification distortion occurring when the substrates 210, 230 of this lot are bonded. Note that, in the present embodiment, the bonding process includes a process from the substrate 210 and the substrate 230 partially coming into contact with each other until the end of expansion of the contact region.

Figure 22:
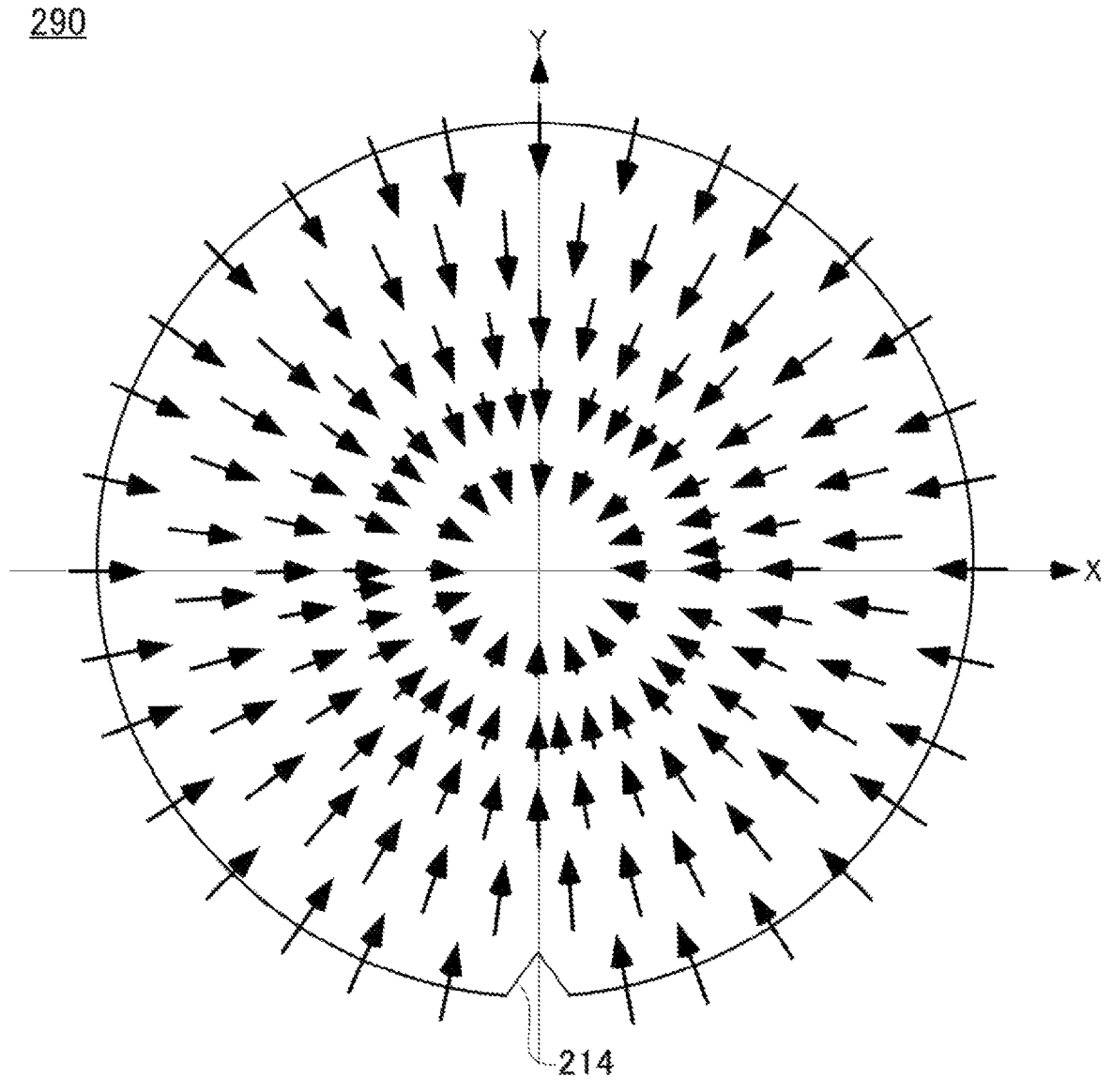
FIG. 22 is a schematic diagram showing positional misalignment in the multilayer substrate 290 caused by magnification distortion due to air resistance occurring when using the substrate holder 240 for the fixed side having a flat holding surface.

FIG. 22 is a schematic diagram showing the positional misalignment in the multilayer substrate 290 caused by the magnification distortion occurring due to the bonding method described using FIG. 19 to FIG. 21. The arrows in the figure are vectors indicating the positional misalignment of the substrate 230 on the fixed side when using the substrate 210 on the releasing side as a reference, the directions of these arrows indicate the direction of the positional misalignment, and the lengths of these arrows indicate the magnitude of the positional misalignment. The misalignment shown in the figure has a misalignment amount gradually increasing radially from the center point of the multilayer substrate 290 in the plane direction. Note that the magnification distortion shown in the figure includes the initial magnification distortion and the adsorption magnification distortion that have occurred before the bonding of the substrates 210, 230 and the bonding process magnification distortion that has occurred during the process of bonding the substrates 210, 230.

Note that, when the substrates 210, 230 are bonded by the bonding method described using FIG. 19 to FIG. 21, the substrate 210 is unheld from the substrate holder 220 while keeping the hold of the substrate 230 by the substrate holder 240. Therefore, at the time point when the substrates 210, 230 are bonded, the substrates 210, 230 are bonded while the shape of the held substrate 230 is fixed but the unheld substrate 210 is distorted. Accordingly, it may be unnecessary to consider the bonding process magnification distortion for the substrate 230 that is bonded in the fixed state, and it is desirable to consider the bonding process magnification distortion for the substrate 210 to be unheld.

When the substrate 230 on the fixed side is held in a distorted state due to the shape of the substrate holder 240 or the like, both the bonding process magnification distortion and the adsorption magnification distortion are desirably considered for the unheld substrate 210, and furthermore, distortion such as the adsorption magnification distortion caused by the substrate 210 following the shape of the distorted substrate 230 is also preferably considered.

Thus, in the bonding method described using FIG. 19 to FIG. 21, the final difference in magnification distortion after the bonding of the substrates 210, 230 is formed by the difference in the adsorption magnification distortion occurring when the substrates 210, 230 are held by the substrate holders 220, 240 or the like and the bonding process magnification distortion of the substrate 210 that is unheld during the process of bonding, added to the difference in the initial magnification distortion that the substrates 210, 230 originally have.

In the manner described above, the positional misalignment occurring in the multilayer substrate 290 formed by stacking the substrates 210, 230 in the method described using FIG. 19 to FIG. 21 is related to the magnitudes of the difference in the initial magnification distortion, the difference in the adsorption magnification distortion, and the difference in the bonding process magnification distortion. Furthermore, the magnification distortion occurring in the substrates 210, 230 is related to the distortion such as warping in these substrates.

Furthermore, the difference in the initial magnification distortion, the difference in the adsorption magnification distortion, and the difference in the bonding process magnification distortion can be estimated by performing measurements, calculations, or the like before the bonding, as described above. Accordingly, based on the final difference in the magnification distortion after the bonding estimated for the substrates 210, 230 to be bonded, countermeasures for correcting the difference can be taken in advance.

Figure 23:
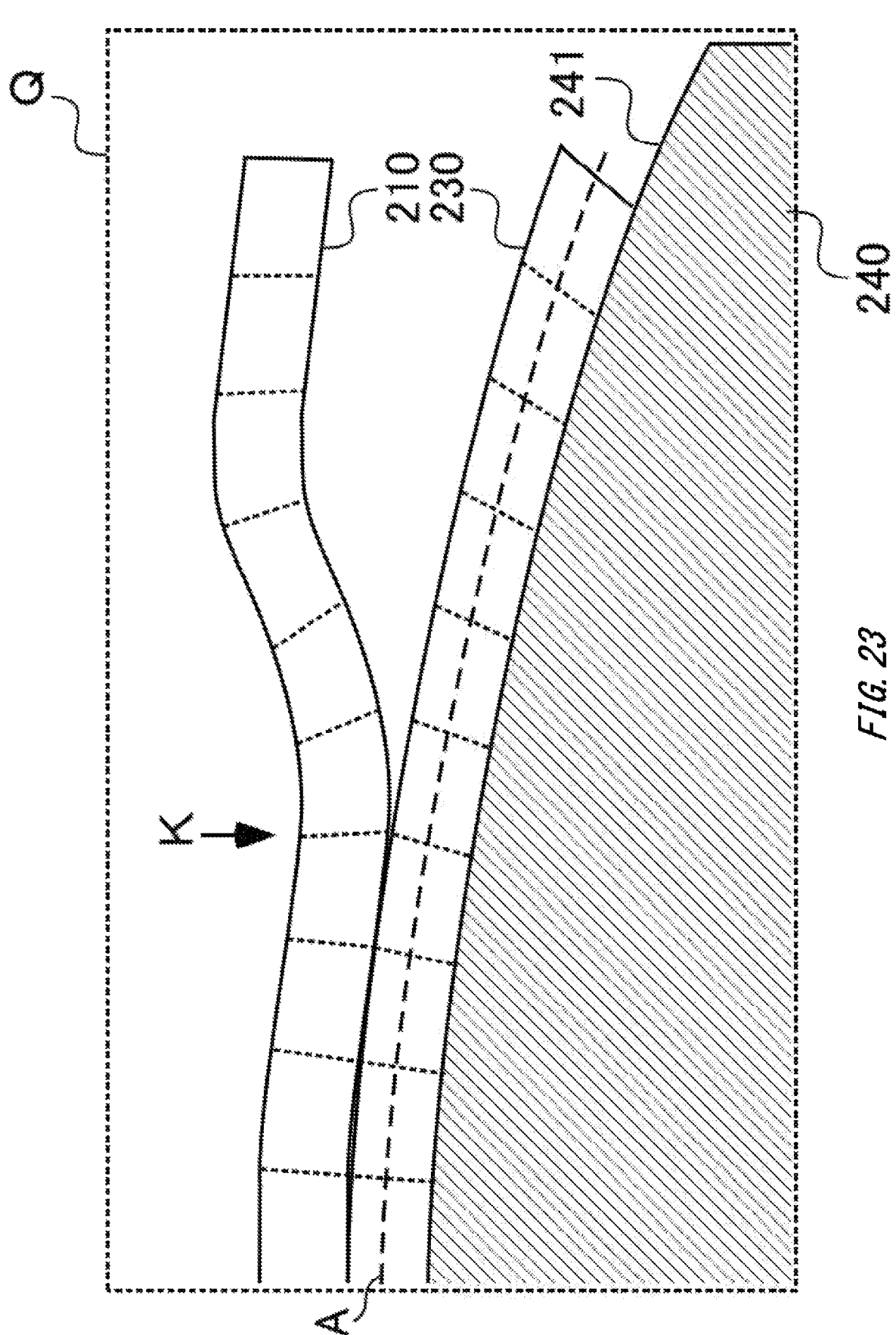
FIG. 23 is a partially enlarged view showing the bonding process of the substrates 210, 230 on the substrate holder 240 when the magnification distortion due to air resistance is corrected by using the substrate holder 240 for the fixed side having a curved holding surface.

One example of the countermeasure can be selecting a substrate holder 240 having a holding surface with a curvature that can correct the final difference in the magnification distortion, from among a plurality of substrate holders 240 for the fixed side. FIG. 23 is a partially enlarged view showing the bonding process of the substrates 210, 230 on the substrate holder 240 when the magnification distortion due to air resistance is corrected by using the substrate holder 240 for the fixed side having a curved holding surface.

As shown in FIG. 23, the holding surface 241 of the substrate holder 240 for the fixed side is curved. When the substrate 230 is adsorbed to the holding surface 241 having such shape, in a state where the substrate 230 is curved, the front surface, which is the upper surface in the figure, of the substrate 230 changes its shape such that the surface of the substrate 230 expands from the center toward the peripheral portion in the plane direction, compared to the center portion A of the substrate 230 in the thickness direction indicated by the dashed line in the figure. Furthermore, the back surface, which is the lower surface in the figure, of the substrate 230 changes its shape such that the surface of the substrate 230 contracts from the center toward the peripheral portion in the plane direction.

By holding the substrate 230 on the substrate holder 240 in this manner, the surface of the substrate 230 on the upper side in the figure is expanded, compared to a state where the substrate 230 is flat. With such change in shape, it is possible to correct the final difference in the magnification distortion with respect to the other substrate 210, i.e. the positional misalignment caused by this difference. Furthermore, by preparing a plurality of substrate holders 240 having curved holding surfaces 241 with different curvatures and selecting a substrate holder 240 whose holding surface 241 has a curvature with which the positional misalignment amount caused by the final difference in the magnification distortion becomes equal to or smaller than a predetermined threshold, it is possible to adjust the correction amount.

In the embodiment shown in FIG. 23, the holding surface 241 of the substrate holder 240 has a shape that is raised at the center. Instead of this, by preparing a substrate holder 240 that is depressed at the center portion relative to the peripheral portion of the holding surface 241 and holding the substrate 230 on this substrate holder 240, it is also possible to reduce the magnification in the bonding surface of the substrate 230 to adjust the positional misalignment relative to the design specification of the circuit regions 236 formed on the bonding surface.

Above described with reference to FIG. 19 to FIG. 22 is the magnification distortion, particularly the bonding process magnification distortion, among the linear distortion included in the planar distortion occurring in the substrates 210, 230 to be bonded. Above described with reference to FIG. 23 is one example of a countermeasure for, based on the final difference in the magnification distortion after bonding that is estimated for the substrates 210, 230 to be bonded, correcting this difference. As another example of this countermeasure, the holding surface of the lower stage 332 of the bonding unit 300 may be deformed by an actuator.

The following describes distortion caused by anisotropy caused by the crystal orientation, i.e. crystal anisotropy, of the substrates 210, 230 within the nonlinear distortion included in the planar distortion occurring in the substrates 210, 230 to be bonded.

Figure 24:
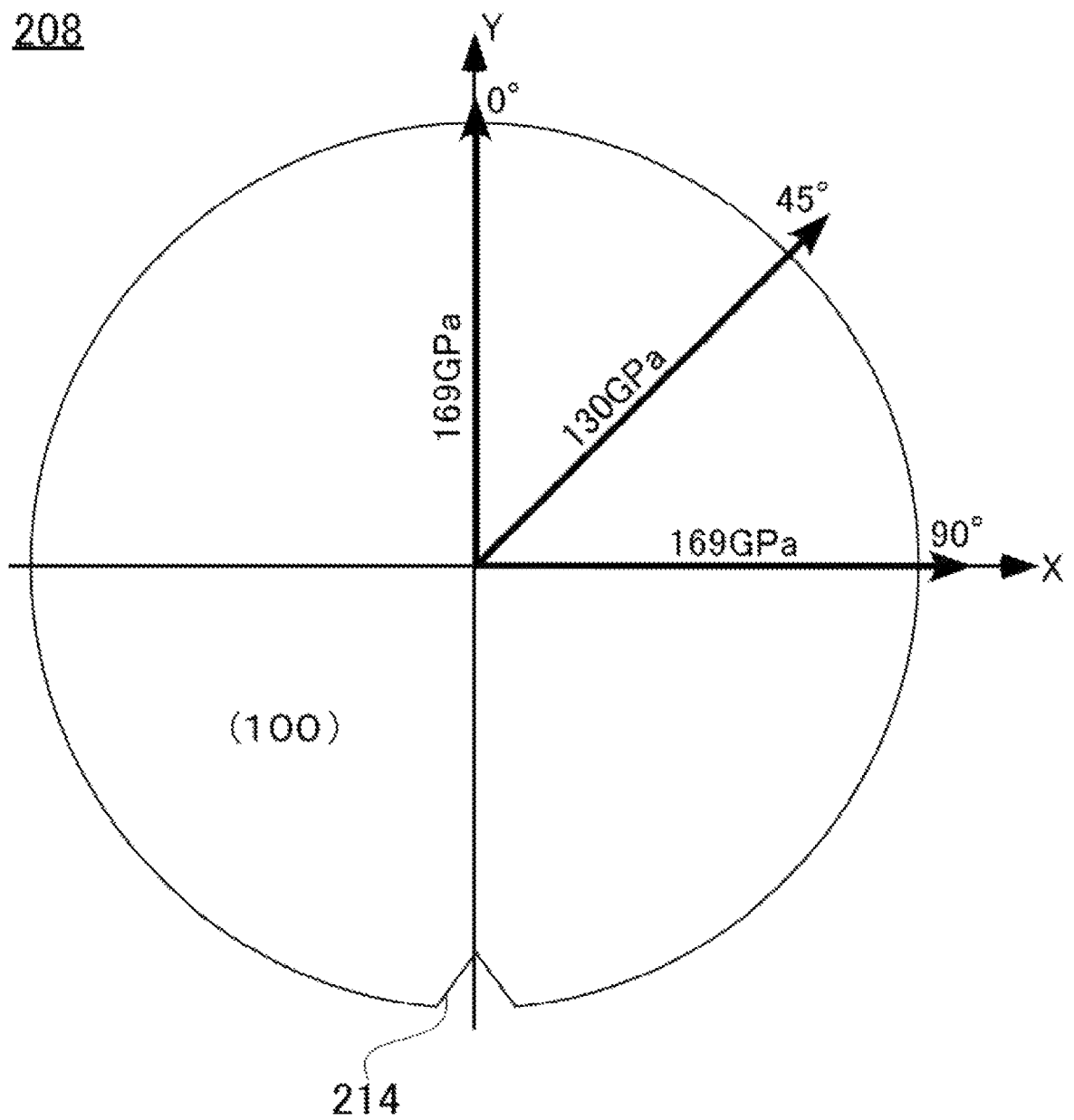
FIG. 24 is a schematic diagram showing a relationship between the crystal anisotropy and the Young's modulus in a silicon monocrystalline substrate 208.

FIG. 24 is a schematic diagram showing a relationship between the crystal orientation and the Young's modulus in a silicon monocrystalline substrate 208. As shown in FIG. 24, in the silicon monocrystalline substrate 208 having the (100) surface as the front surface, in an X-Y coordinate system where the direction opposite to the direction of the notch 214 relative to the center is 0°, the Young's modulus has a high value of 169 GPa at the 0° direction and the 90° direction, and the Young's modulus has a low value of 130

GPa at the 45° direction. Therefore, in the substrates 210, 230 manufactured using the silicon monocrystalline substrate 208, there is an uneven bending rigidity distribution in the circumferential direction of the substrates 210, 230. In other words, the bending rigidity of the substrates 210, 230 differs depending on the progression direction at the time when the bonding wave progresses from the center toward the peripheral portion of the substrates 210, 230. The bending rigidity indicates how easily the substrates 210, 230 deform under a bending force, and may be the elastic modulus.

Figure 25:
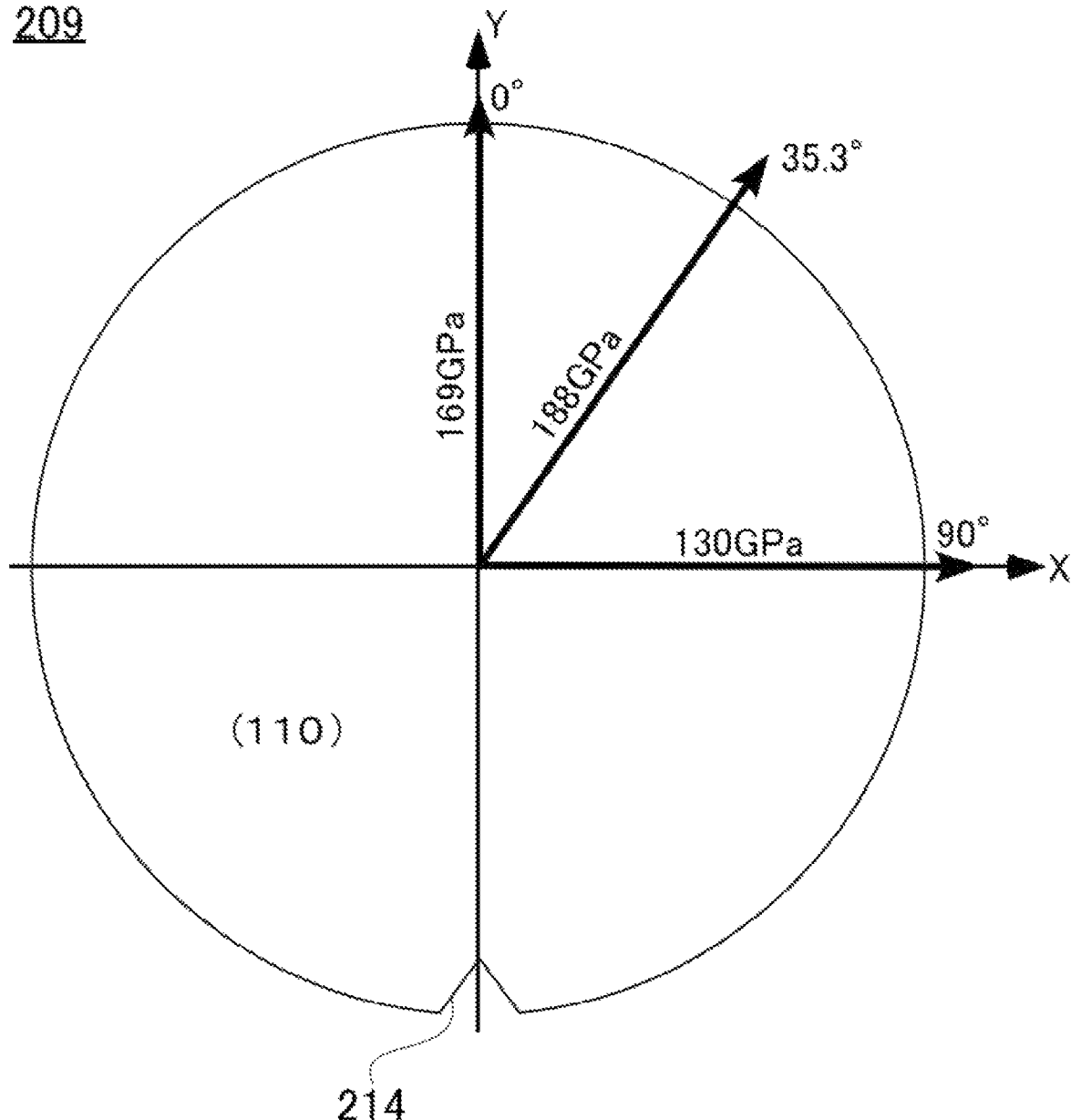
FIG. 25 is a schematic diagram showing a relationship between the crystal anisotropy and the Young's modulus in a silicon monocrystalline substrate 209.

FIG. 25 is a schematic diagram showing a relationship between the crystal orientation and the Young's modulus in a silicon monocrystalline substrate 209. As shown in FIG. 25, in the silicon monocrystalline substrate 209 having the (110) surface as the front surface, in an X-Y coordinate system where the direction opposite to the direction of the notch 214 relative to the center is 0°, the Young's modulus has a highest value of 188 GPa at the 35.3° direction and the Young's modulus has the next highest value of 169 GPa at the 0° direction. Furthermore, the Young's modulus has a lowest value of 130 GPa at the 90° direction. Therefore, in the substrates 210, 230 manufactured using the silicon monocrystalline substrate 209, there is a complicated and uneven bending rigidity distribution in the circumferential direction of the substrates 210, 230.

In this way, also in the substrates 210, 230 formed using any of the silicon monocrystalline substrates 208, 209 respectively having different crystal anisotropy, there is an uneven bending rigidity distribution in the circumferential direction thereof. The magnitude of the distortion that occurs in the bonding process described with reference to FIG. 19 to FIG. 21 differs between the regions with different bending rigidity, depending on the magnitude of the bending rigidity. Specifically, the magnitude of the distortion in a region with low rigidity is smaller than that in a region with high rigidity. Therefore, in the multilayer substrate 290 manufactured by stacking the substrates 210, 230 by the method described using FIG. 19 to FIG. 21, there occurs uneven positional misalignment of the circuit regions 216, 236 in the circumferential direction of the multilayer substrate 290. The positional misalignment between the bonded substrates caused by the distortion due to the crystal anisotropy results from the crystal anisotropy of the substrate 230 on the releasing side.

Figure 26:
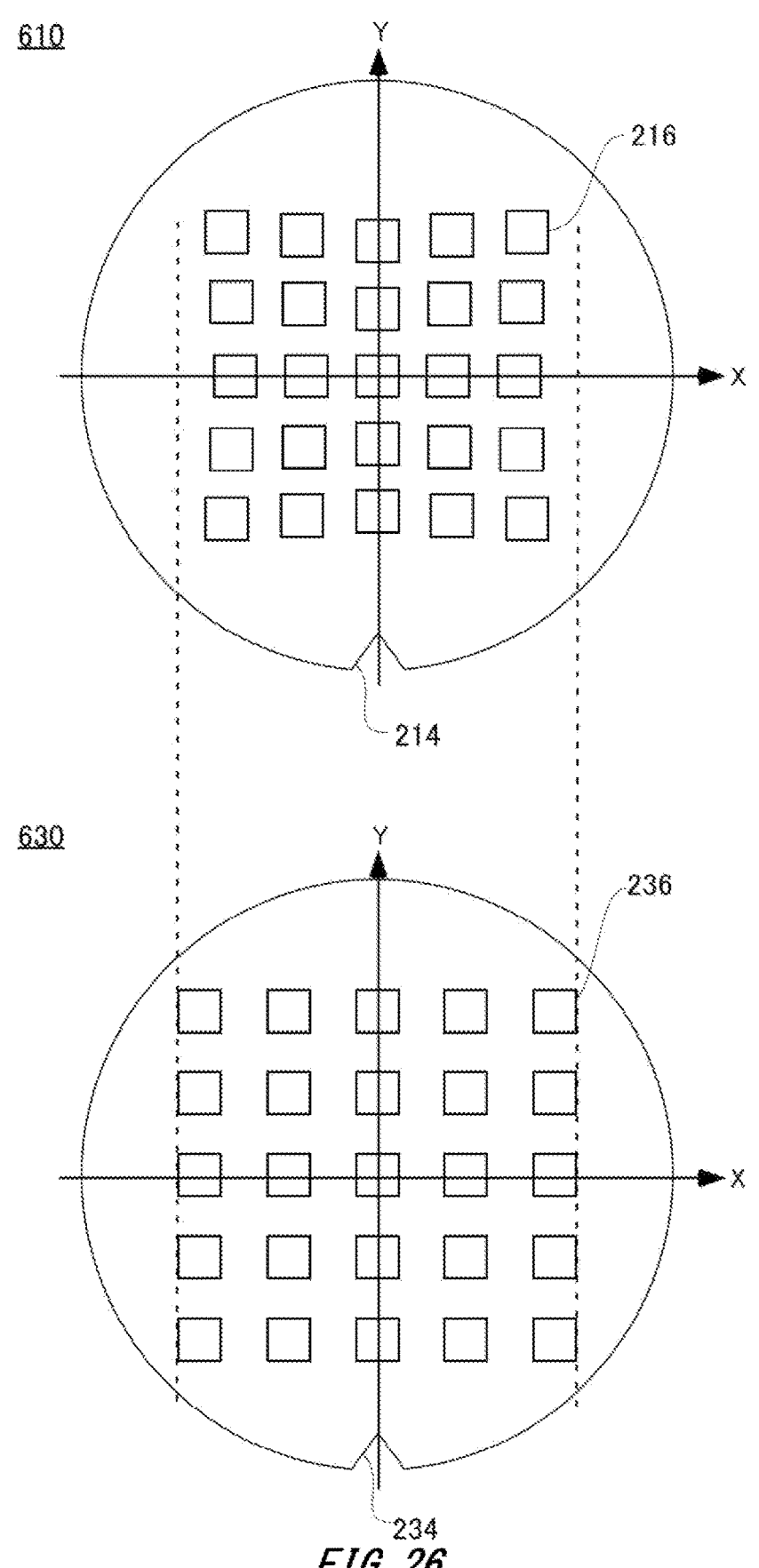
FIG. 26 is a schematic diagram showing substrates 610, 630 on the surface of which a plurality of circuit regions 216 are formed, the positional arrangement of the plurality of circuit regions 216 being corrected in advance so that an amount of positional misalignment in the multilayer substrate 290 caused by the magnification distortion due to air resistance which may occur during the bonding and the distortion due to the crystal anisotropy is equal to or smaller than a predetermined threshold.

FIG. 26 is a schematic diagram showing substrates 610, 630 on the surface of which a plurality of circuit regions 216, 236 are formed, the positional arrangement of the plurality of circuit regions 216, 236 being corrected in advance so that an amount of positional misalignment in the multilayer substrate 290 caused by the magnification distortion due to air resistance which may occur during the bonding and the distortion due to the crystal anisotropy is equal to or smaller than a predetermined threshold. The substrate 610 is the substrate on the releasing side in the bonding unit 300. The substrates 610, 630 are formed from the silicon monocrystalline substrate 208 described using FIG. 24.

In the embodiment of FIG. 23, the method for correcting the magnification distortion due to air resistance in advance was selecting a substrate holder having a curved holding surface 241 as the substrate holder 240 for the fixed side. However, the substrate holders 220, 240 or the upper stage 322 and the lower stage 332 are more easily processed, handled, or the like when they have a flat holding surface. Therefore, in the present embodiment, instead of the method for correcting using the substrate holder 240 for the fixed side with the curved holding surface 241, it is arranged so that the amount of the positional misalignment in the multilayer substrate 290 caused by the magnification distortion due to air resistance that may occur during the bonding and the distortion due to the crystal anisotropy becomes equal to or smaller than the predetermined threshold, by correcting the positional arrangement of the plurality of circuit regions 216 formed on the surface of the substrate 610 on the releasing side in advance to form the plurality of circuit regions 216.

It is predicted that the magnification distortion due to air resistance and the distortion due to the crystal anisotropy do not occur in the substrate 630 on the fixed side, because the fixed state of the substrate 630 is maintained during the bonding. Therefore, in the substrate 630, when the plurality of circuit regions 236 are formed on the entire substrate 630 by repeatedly performing exposure using the same mask, the plurality of circuit regions 236 are formed at an equal interval over the entire substrate 630 without correcting the shot map.

On the other hand, it is predicted that the magnification distortion due to air resistance and the distortion due to the crystal anisotropy occur in the substrate 610 on the releasing side, when the substrate 610 is released during the bonding. Therefore, in the substrate 610, when the plurality of circuit regions 216 are formed on the entire substrate 610 by repeatedly performing exposure using the same mask, the shot map is corrected so that the amount of the positional misalignment caused by the magnification distortion due to air resistance and the distortion due to the crystal anisotropy becomes equal to or smaller than the predetermined threshold, and the intervals between the plurality of circuit regions 216 are gradually narrowed from the center toward the peripheral portion of the substrate 610 over the entire substrate 610 and at the same time the intervals in the 0° direction and in the 90° direction are arranged to be narrower than the intervals in the 45° direction. Thus, even when the holding surface 241 of the substrate holder 240 for the fixed side is flat, the positional misalignment in the multilayer substrate 290 caused by the magnification distortion due to air resistance that may occur during the bonding and the distortion due to the crystal anisotropy can be suppressed to be equal to or smaller than the predetermined threshold.

Figure 27:
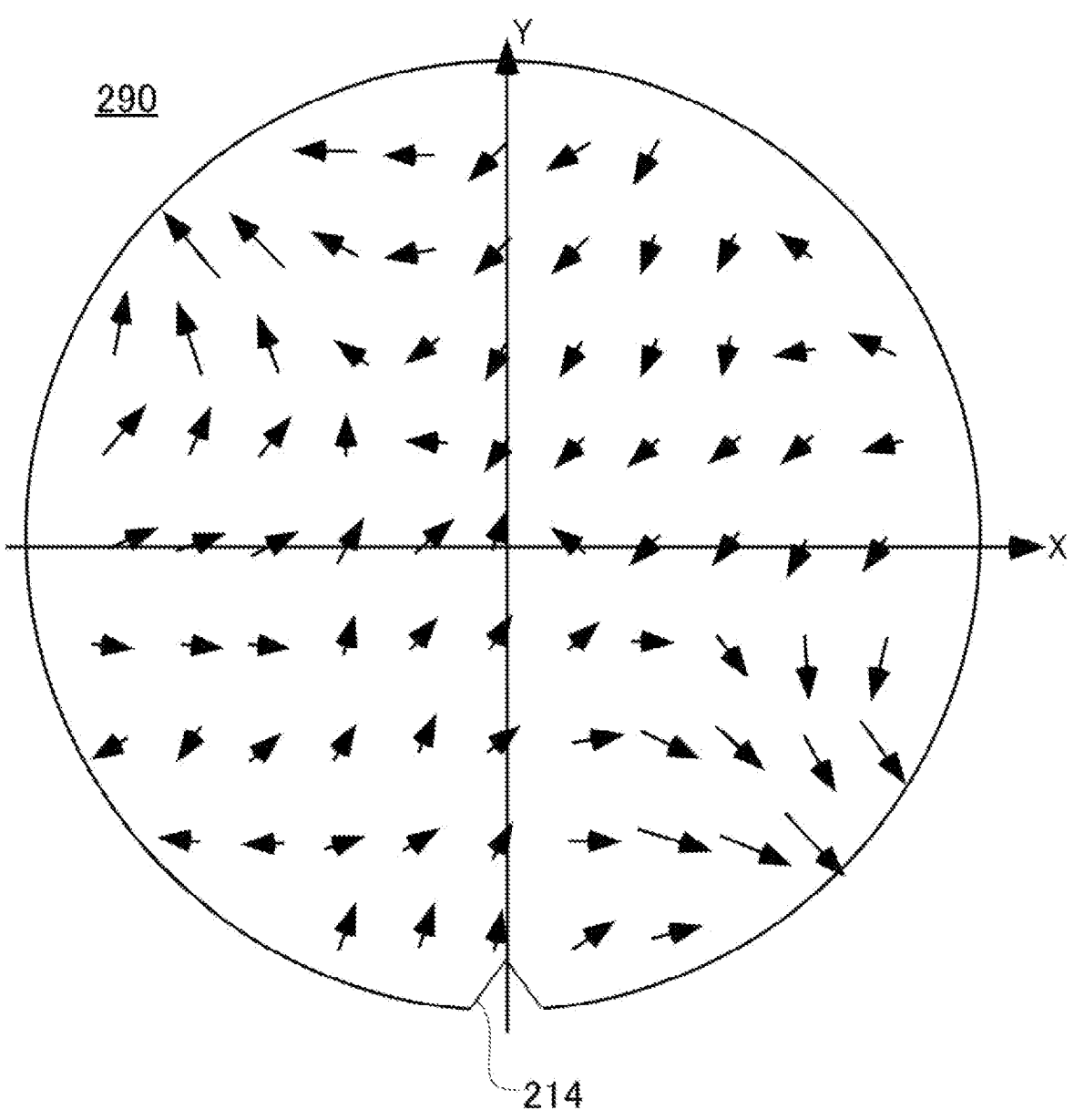
FIG. 27 is a schematic diagram showing positional misalignment in the multilayer substrate 290 caused by the nonlinear distortion occurring in a case where the substrate 210 on the releasing side has a local curve.

The following describes nonlinear distortion included in the planar distortion occurring in the substrates 210, 230 to be bonded. FIG. 27 is a schematic diagram showing positional misalignment in the multilayer substrate 290 due to the nonlinear distortion occurring in a case where the substrate 210 on the releasing side has a local curve without having a global warping, while the substrate 230 is fixed in a flat state on the substrate holder 240. The positional misalignment caused by the nonlinear distortion shown in FIG. 27 does not include the positional misalignment caused by the magnification distortion shown in FIG. 22. Note that the positional misalignment caused by the nonlinear distortion in the substrate 210 as shown in FIG. 27 may provide different results according to the protruding amount of the protruding member 250 of the substrate holder 220 holding the substrate 210.

The arrows in the figure are vectors indicating the positional misalignment of the substrate 230 on the fixed side when using the substrate 210 on the releasing side as a reference, the directions of these arrows indicate the direction of the positional misalignment, and the lengths of these arrows indicate the magnitude of the positional misalignment. As shown in FIG. 27, the positional misalignment caused by the nonlinear distortion occurring due to the local curve in the multilayer substrate 290 has a similar tendency in the first quadrant where X is positive and Y is positive, i.e. the 45° direction and in the third quadrant where X is negative and Y is negative, i.e. the 225° direction, and has a similar tendency in the second quadrant where X is negative and Y is positive, i.e. the 315° direction and in the fourth quadrant where X is positive and Y is negative, i.e. the 135° direction, while the tendency in the first quadrant and the third quadrant differs from the tendency in the second quadrant and the fourth quadrant. The positional misalignment amount along the radial direction from the center of the multilayer substrate 290 exhibits no regular distribution. With reference to FIG. 27, it is understood that the positional misalignment caused by the nonlinear distortion cannot be expressed by a linear transformation of the positions displaced relative to the designed positions of structures on each of the substrates 210, 230.

The nonlinear distortion occurs due to a wide variety of factors interacting with each other, but the main factors are the crystal anisotropy in the silicon monocrystalline substrates 208, 209 described with reference to FIG. 24 and FIG. 25 and the manufacturing process of the substrates 210, 230. The positional misalignment in the multilayer substrate 290 shown in FIG. 27 also results from the nonlinear distortion caused by local warping added to the nonlinear distortion caused by the crystal anisotropy. As described with reference to FIG. 2, a plurality of structures are formed on the substrates 210, 230 in the manufacturing process of the substrates 210, 230. For example, the plurality of circuit regions 216, 236, the scribe lines 212, 232, and the plurality of alignment marks 218, 238 are formed as the structures on the substrates 210, 230. On each of the plurality of circuit regions 216, 236, besides a runner, a protective film, or the like formed using photolithography techniques or the like, a connecting portion such as pads or bumps serving as a connection terminal when the substrates 230, 210 is electrically connected to the other substrates 210, 230, a lead frame, or the like is also arranged as such structures. The construction and arrangement of these structures, i.e. the configurations of these structures, affect the in-plane rigidity distribution and inner surface stress distribution of the substrates 210, 230, and causes a local curve in the substrates 210, 230 when the rigidity distribution or inner surface stress distribution becomes uneven.

The configuration of these structures may differ for each substrate 210 or 230, or may differ for each type of the substrates 210, 230 such as a logic wafer, a CIS wafer, and a memory wafer. Furthermore, even if the manufacturing process is the same, it is conceivable that the configuration of the structures more or less differs depending on the manufacturing apparatuses, and therefore the configuration of these structures may differ for each manufacturing lot of the substrates 210, 230. In this way, the configuration of the plurality of structures formed on the substrates 210, 230 may differ for each substrate 210 or 230, each type of the substrates 210, 230, each manufacturing lot of the substrates 210, 230, or each manufacturing process of the substrates 210, 230. Therefore, the in-plane rigidity distribution of the substrates 210, 230 differs in a similar manner. Accordingly, the curved state of the substrates 210, 230 caused by the manufacturing process and bonding process differs in a similar manner.

During the bonding of the pair of substrates 210, 230, when the substrate 210 on the releasing side has a local curve, there may be a greater distance between the substrate 210 and the other substrate 230 during the bonding to the other substrate 230 at a point where the local curve has occurred than at a point where no local curve has occurred in the substrate 210. For example, this applies to the case where the substrate 210 on the releasing side has a warping that causes stretching of the bonding surface. Thus, at the point where the local curve has occurred, the progression of the bonding wave is slower than at the point where no local curve has occurred, and a wrinkle occurs at the point where the local curve has occurred in the substrate 210 on the releasing side. This causes nonlinear distortion in the bonded multilayer substrate 290. In other words, there is a correlation between the local curve and the nonlinear distortion. At a point where the substrate 210 on the releasing side has a large local curve before the bonding, large nonlinear distortion occurs in the multilayer substrate 290 after the bonding. Note that this causal relationship applies to the case where there is no distortion other than the distortion caused by a local curve. On the other hand, even when the substrates 210, 230 to be bonded have a local curve, it is possible that the nonlinear distortion that may occur due to the local curve is cancelled out by the distortion caused by the crystal anisotropy, for example.

When a local curve has occurred before the bonding in the substrate 230 on the fixed side among the pair of substrates 210, 230, the entire surface on the opposite side of the bonding surface of the substrate 230 is adsorbed by the substrate holder 240 or the like and kept in a fixed state, and therefore nonlinear distortion due to the local curve of this substrate 230 itself does not occur, and also nonlinear positional misalignment caused by the local curve of the substrate 230 on the fixed side does not occur between the substrates 210, 230 after the bonding. Note that, although adsorption magnification distortion or the like might occur in the substrate 230 on the fixed side, such distortion may be ignored because such distortion is small compared to the distortion occurring in the substrate 210 on the releasing side and has almost no effect. On the other hand, when a local curve has occurred in the substrate 210 on the releasing side before the bonding, positional misalignment due to nonlinear distortion occurs between the bonded pair of substrates 210, 230, for the reason described above.

In order to prevent such positional misalignment due to the nonlinear distortion, the control unit 150 acquires information related to the local curve of at least the substrate 210 on the releasing side before the bonding of the substrates 210, 230, presets the initially bonded region 803 of the substrate 210 on the releasing side based on a characteristic of the local curve of the substrate 210 included in the acquired information, and keep the hold of at least the outermost circumferential region of the substrate 210 by the substrate holder 220 until the control unit 150 detects that the preset initially bonded region 803 is bonded by the bonded region 801 expanding from around the center toward the outer circumference of the substrates 210, 230.

For example, as in the present embodiment, assuming that the local curve in the substrate 210, at least partially, gradually increases along the radial direction from the center side to the outer circumferential side of the substrate 210, the holding of the substrate 210 by the substrate holder 220 is maintained both at the point where the local curve has occurred and at the point where no local curve has occurred in the outermost circumferential region of the substrate 210, until the preset initially bonded region 803 of the substrate 210 is bonded. In this way, the distance to the other substrate 230 to be bonded is made constant within a predetermined range, throughout the outermost circumferential region of the substrate 210.

Because warping of the same magnitude is forcibly formed throughout the outermost circumferential region of the substrate 210 until the preset initially bonded region 803 is bonded, the difference of progression rate of the bonding wave between the point where the local curve of the substrate 210 has occurred and the point where no local curve has occurred can be suppressed.

Because the difference of the progression rate of the bonding wave can be suppressed in the region where the initially bonded region 803 overlaps with the point where the local curve has occurred, the larger the overlapping region is, the greater the effect of suppressing nonlinear positional misalignment occurring between the bonded substrates 210, 230 becomes. Therefore, the control unit 150 presets he initially bonded region 803 of the substrate 210 on the releasing side so that the amount of nonlinear positional misalignment occurring between the bonded substrates 210, 230 is equal to or smaller than a predetermined threshold.

As described above, information related to the local curve of the substrate 210 is included in information related to the distortion occurring in the substrate 210. The information related to the distortion occurring in the substrate 210 includes information related to global warping in which the substrate 210 is flexed entirely with a substantially uniform curvature and information related to local warping in which a part of the substrate 210 has a local change in curvature, i.e. a local curve.

The information related to the global warping includes information obtained by measuring a global curve of the substrate 210 such as a characteristic of the global curve including a magnitude of global warping, a direction of warping, a magnitude of deflection, a direction of deflection, or the like of the substrate 210 and information related to factors that cause a global curve in the substrate 210 such as the crystal anisotropy of the substrate 210, the manufacturing process, the type of the substrate 210, or the configuration of the structures formed on the substrate 210.

The information related to the local warping includes information obtained by measuring a local curve of the substrate 210 such as a characteristic of the local curve including a magnitude of local warping, a direction of warping, a warped portion, an amplitude of warping, a magnitude of deflection, a direction of deflection, an amplitude of deflection, a deflected portion, internal stress, stress distribution, or the like of the substrate 210 and information related to factors that cause a local curve in the substrate 210 such as the crystal anisotropy of the substrate 210, the manufacturing process, the type of the substrate 210, or the configuration of the structures formed on the substrate 210.

The control unit 150 may acquire the information related to distortion occurring in the substrate 210 from a pre-processing apparatus such as an exposure apparatus, a film deposition apparatus, or the like used for processes performed before the substrate bonding apparatus 100. Furthermore, the substrate bonding apparatus 100 may acquire the information related to distortion occurring in the substrate 210 from the pre-aligner 500, for example, which is used for a process performed before the bonding unit 300. The control unit 150 outputs the information determined based on the acquired information to at least any one of the conveying unit 140, the pre-aligner 500, and the bonding unit 300.

Figure 28:
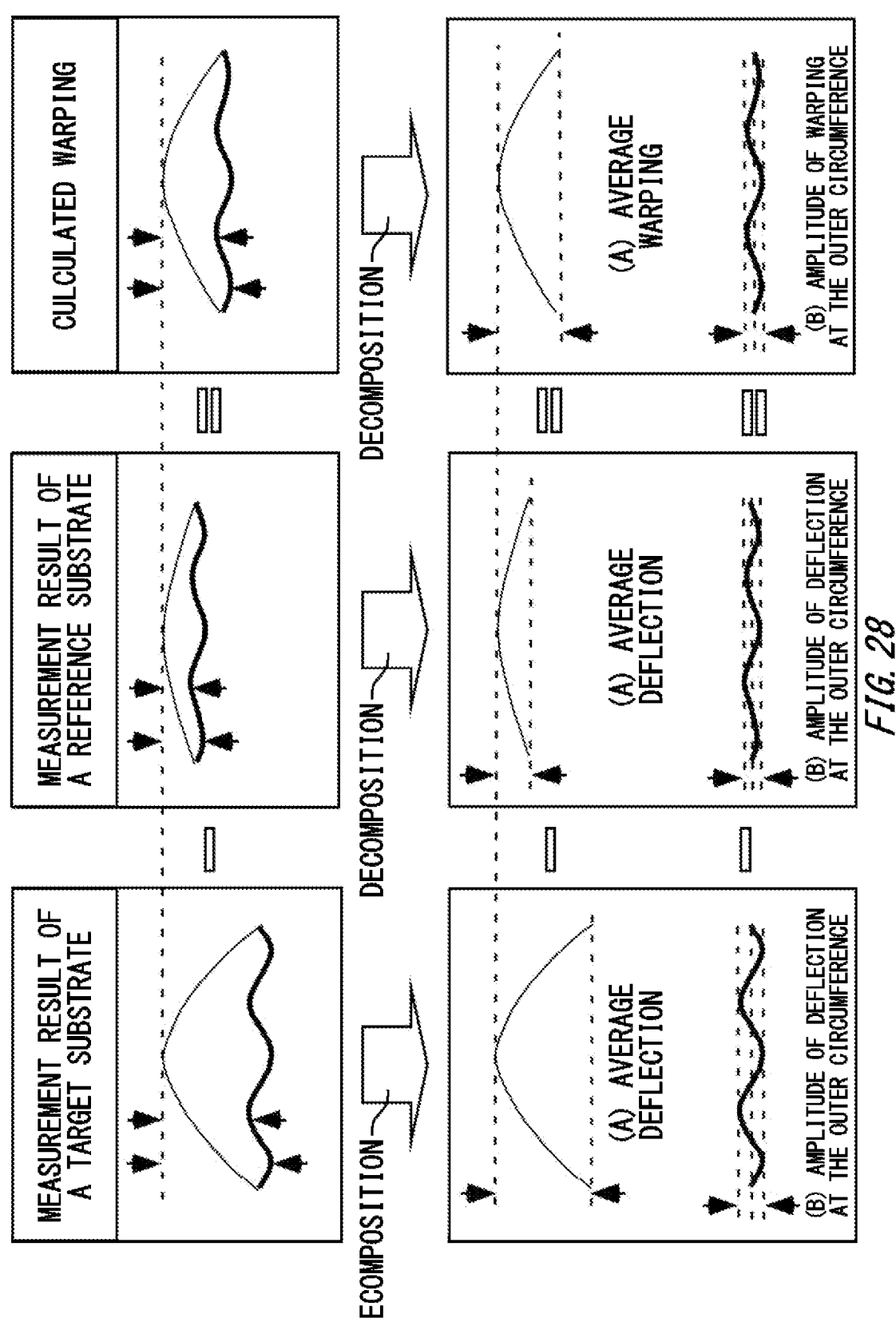
FIG. 28 is a diagram illustrating deflection measurement and a warping calculation method.

In the present embodiment, for example, a local curve is actually measured by the pre-processing apparatus, as one example of distortion of the substrates 210, 230. FIG. 28 is a diagram illustrating deflection measurement and a warping calculation method. In the method of FIG. 28, deflection of the substrate 210 or 230 as a target substrate is firstly measured. Specifically, while the center of the back surface of the substrate 210 or 230 in the plane direction is supported and the substrate 210 or 230 is rotated around its center under gravity, the front surface or back surface of the substrate 210 or 230 is observed by using a non-contact distance meter such as a microscope, and the position of the front surface or back surface is measured based on the distribution of the distance information obtained from an automatic focusing function of the optical system of the microscope.

In this way, the deflection amount that includes the magnitude and orientation of the deflection of the substrate 210 or 230 under gravity can be measured. The deflection amount of the substrate 210 or 230 is determined from the change of the position of the front surface or back surface of the substrate 210 or 230 in the thickness direction when using the supported center of the substrate 210 or 230 as a reference. Then, the control unit 150 acquires information of the deflection amount of the substrate 210 or 230, and decomposes this into a linear component and a nonlinear component along the radial direction from the substrate center. In FIG. 28, the linear component of the deflection amount of the substrate 210 or 230 is shown in a parabolic shape as an average deflection (A) and the nonlinear component is shown in a waved-line shape as an amplitude of the deflection at the outer circumference (B).

Next, the deflection of bare silicon as a reference substrate is measured. Bare silicon can be considered to be a substrate 210 or 230 on which no structure is formed and in which warping has not occurred. Note that, when the bare silicon has a slight warping, it is preferable to calculate the deflection amount, which can be used as a reference, from deflection measurement of the front and back sides of the bare silicon. The deflection amount of the bare silicon is measured using the same measurement conditions as those used for the substrate 210 or 230. The control unit 150 then acquires the information of the deflection amount of the bare silicon, and decomposes this into a linear component ((A) in FIG. 28) and a nonlinear component ((B) in FIG. 28) along the radial direction from the center of the bare silicon.

The amplitude of the deflection at the outer circumference of the bare silicon is then subtracted from the amplitude of the deflection at the outer circumference of the substrate 210 or 230. In this way, the nonlinear component of the warping amount of the substrate 210 or 230 can be calculated, which can be treated as a measurement value under zero gravity. In FIG. 28, the nonlinear component of the warping amount of the substrate 210 or 230 is shown in a waved-line shape as the amplitude of the warping at the outer circumference (B). This non-linear component corresponds to the local warping described above. Note that the reason that the warping amount as the deformation amount measured under zero gravity can be calculated by using this method is that the deformation amount due to its own weight, which is included in the deflection amount as the deformation amount measured under gravity, is essentially removed by the subtraction described above.

Note that, by subtracting the average deflection of the bare silicon from the average deflection of the substrate 210 or 230, the linear component of the warping amount of the substrate 210 or 230, which can be treated as a measurement value under zero gravity can be calculated. This linear component corresponds to the global warping described above. In FIG. 28, the linear component of the warping amount of the substrate 210 or 230 is shown in a parabolic shape as the average warping (A).

Finally, the situation of the substrate 210 on the releasing side during the bonding is reflected. Specifically, by converting the amplitude of the warping at the outer circumference of the substrate 210 with consideration of the direction of gravity and the orientation when the front surface of the substrate 210 that is to be on the releasing side faces downward, the amplitude of the warping at the outer circumference of the substrate 210, assuming that measurement is performed in the manner described above while the center of the front surface of the substrate 210 in the plane direction is supported, is calculated as a predicted value.

The control unit 150 presets the initially bonded region 803 of the substrate 210 on the releasing side, based on the amplitude of the warping at the outer circumference of at least the substrate 210 on the releasing side, among amplitudes of warping at the outer circumference of each of the substrates 210, 230, as the information related to the local curve of the substrate 210 on the releasing side and the substrate 230 on the fixed side calculated in the manner described above. For example, the initially bonded region 803 may be preset based on a maximum value or a average value of the amplitudes of the warping at the outer circumference or may be preset based on the occurrence position of warping in the bonding surface of the substrate 210 and the magnitude of warping.

As described above, the local curve of the substrates 210, 230 may differ for each substrate 210 or 230, each type of the substrates 210, 230, each manufacturing lot of the substrates 210, 230, or each manufacturing process of the substrates 210, 230. Therefore, the control unit 150 may preset the initially bonded region 803 of the substrate 210 for each bonding of the substrates 210, 230, for each type of the substrates 210, 230, for each manufacturing lot of the substrates 210, 230, or for each manufacturing process of the substrates 210, 230. Note that, after the initially bonded region 803 is set for first substrates 210, 230 included in a manufacturing lot or of the same type, the same initially bonded region 803 may be applied to substrates 210, 230 in the same lot or of the same type.

Note that, residual stress of the substrates 210 or 230 may be measured by Raman scattering or the like while the substrate 210 or 230 is adsorbed by the substrate holder 240 or the like and forcibly fixed in a flat state, and this residual stress may be used as information related to the local curve of the substrate. Moreover, the local curve of the substrates 210, 230 may be measured in the pre-aligner 500.

On the other hand, the control unit 150 may analytically acquire information related to the local curve of the substrates 210, 230 without measuring the local curve of the substrates 210, 230, estimate a characteristic of the local curve of at least the substrate 210 from the acquired information, and preset the initially bonded region 803 of the substrate 210 based on the estimated characteristic of the local curve of the substrate 210. In this case, the characteristic of the local curve such as the magnitude and orientation of the warping occurring in the substrates 210, 230, the shape of the substrates 210, 230 may be estimated based on information related to the manufacturing process of the substrates 210, 230, the configuration or material of the structures such as the circuit regions 216, 236 formed on the substrates 210, 230, the type of the substrates 210, 230, stress distribution in the substrates 210, 230. Moreover, the warping occurring in the substrates 210, 230 may be estimated based on information related to the manufacturing process performed on the substrates 210, 230 during the process for forming the above-mentioned structures, i.e., a heat history concerning the film deposition or the like, a chemical processing such as etching, as information indicating factors that causes warping.

Moreover, when estimating the characteristic of the local curve occurring in the substrates 210, 230, reference may be also made to peripheral information, such as the surface structure of the substrates 210, 230 that may be a factor that causes the local curve occurring in the substrates 210, 230, the film thickness of the thin film stacked on the substrate 210, tendencies of the film deposition apparatus used for film deposition such as a CVD apparatus, its variation, the procedure of film deposition, or its condition. The peripheral information may be measured anew for the purpose of estimating the characteristic of the local curve.

Moreover, in order to estimate the characteristic of the local curve of the substrates 210, 230 as described above, reference may be made to past data obtained when an equivalent substrate is processed or the like, or, by conducting an experiment of a process predicted for an equivalent substrate to the substrates 210, 230 to be bonded, provision may be made in advance of data of a relationship between a warping amount as the local curve and nonlinear distortion, a relationship between the difference in the warping amount and the difference in nonlinear distortion between both substrates, or, a combination of warping amounts that allow the difference in nonlinear distortion, i.e. the positional misalignment amount, between both substrates to be equal to or smaller than the threshold. Moreover, provision may be made of data obtained by analytically determining the warping amount using the finite element method or the like, based on the film deposition structure, the film deposition condition of the substrates 210, 230 to be bonded.

Note that the measurement of the distortion amount on the substrates 210, 230 may be performed in the outside of the substrate bonding apparatus 100, or, an apparatus for measuring distortion of the substrates 210, 230 may be incorporated in the substrate bonding apparatus 100 or a system including the substrate bonding apparatus 100. Moreover, measurement items may be increased by jointly using internal and external measuring apparatus.

Figure 29:
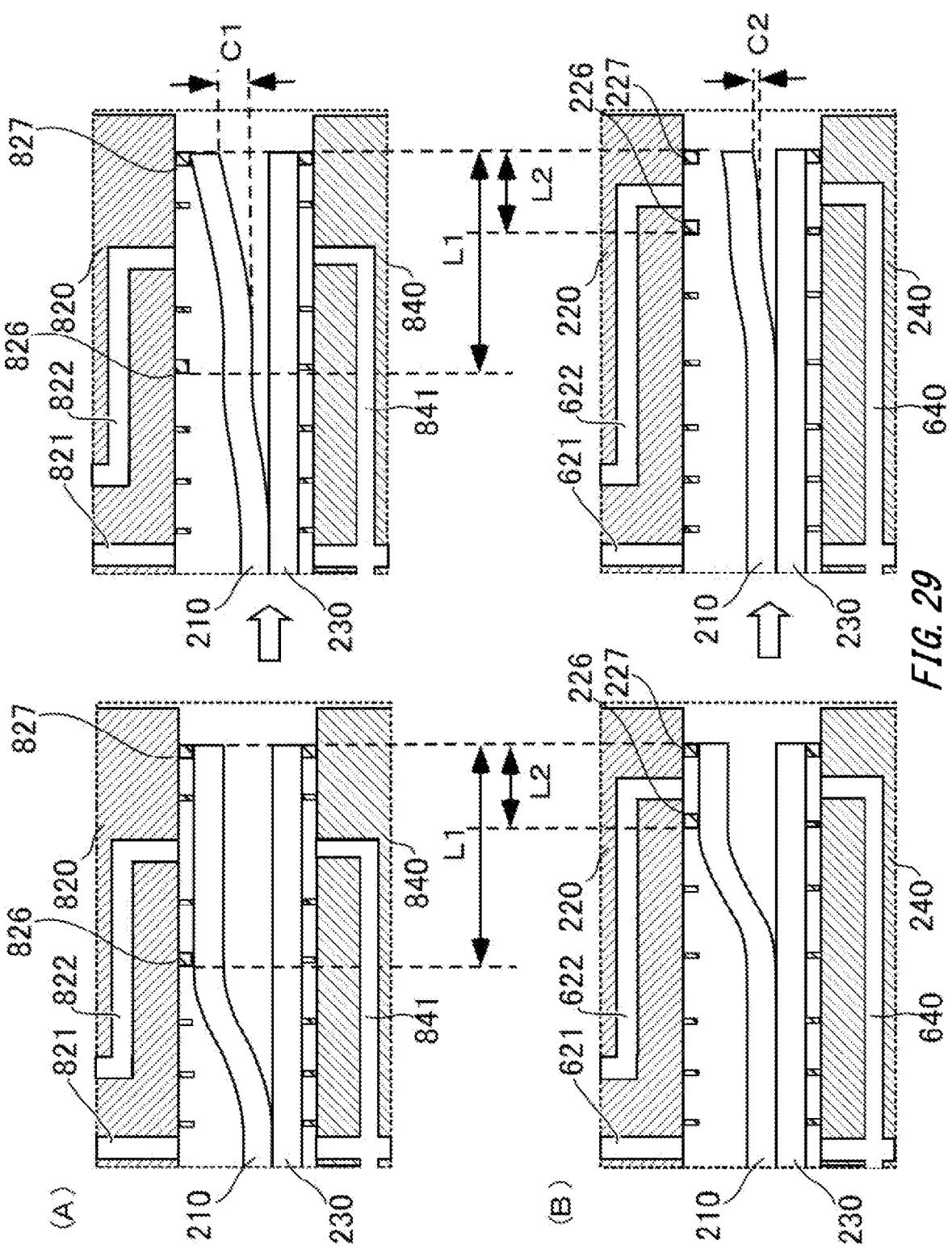
FIG. 29 is an illustrational diagram illustrating the comparison of the process (A) for bonding the substrates 210, 230 by using a substrate holder 820 having an outer circumferential vent channel 822 and the process (B) for bonding the substrates 210, 230 by using the substrate holder 220 having an outermost circumferential vent channel 622.

Advantages of having a large initially bonded region are described below by using FIG. 29. FIG. 29 is an illustrational diagram illustrating the comparison of the process (A) for bonding the substrates 210, 230 by using a substrate holder 820 having an outer circumferential vent channel 822 and the process (B) for bonding the substrates 210, 230 by using the substrate holder 220 having an outermost circumferential vent channel 622.

As shown in FIG. 29, the outer circumferential vent channel 822 of the substrate holder 820 is located at the inner side than the outermost circumferential vent channel 622 of the substrate holder 220. In this case, as shown in the views on the left side of (A) and (B) in FIG. 29, the substrate holder 220 can set a larger outer shape of the initially bonded region 803 to be bonded while the outermost circumferential region of the substrate 210 is held, than the substrate holder 820. Thus, the substrate holder 220 can be adapted to a variety of sizes of the initially bonded region, without changing the configuration of the substrate holder 220 itself.

Furthermore, as shown on the right side of (A) and (B) in FIG. 29 for comparison, after the initially bonded region is bonded, when the outer circumferential vent channel 822 and the outermost circumferential vent channel 622 are released, a local curve that has occurred in the substrate 210 tends to restore itself upon the release. In this case, because the substrate 210 held by the substrate holder 220 is already bonded farther to the vicinity of the outer circumference, a magnitude C2 of the curve is smaller than a magnitude C1 of the curve in the substrate 210 held by the substrate holder 820 and therefore the influence of the bonding on the distortion is also smaller. By having a large initially bonded region, the influence of a local curve of the substrate 210 on the distortion during the bonding can be thus suppressed to be small.

Note that, in the configuration of the main embodiment, the control unit 150 defines in advance a predetermined number of initially bonded regions 803, and a corresponding number of observation holes 601, etc., observation windows 361, etc., and detectors 341, etc., are provided in advance in the substrate holder 220 and the bonding unit 300. Instead of this, when the control unit 150 presets the initially bonded region 803 of any size based on the characteristic of the local curve of the substrate 210 on the releasing side, a continuous linear observation hole or window may be provided in advance in the substrate holder 220 and the bonding unit 300, and a line sensor as a detector may be provided in advance in a corresponding position. Thus, the observing unit 345 can observe the bonding of the initially bonded region 803 of any size.

Figure 30:
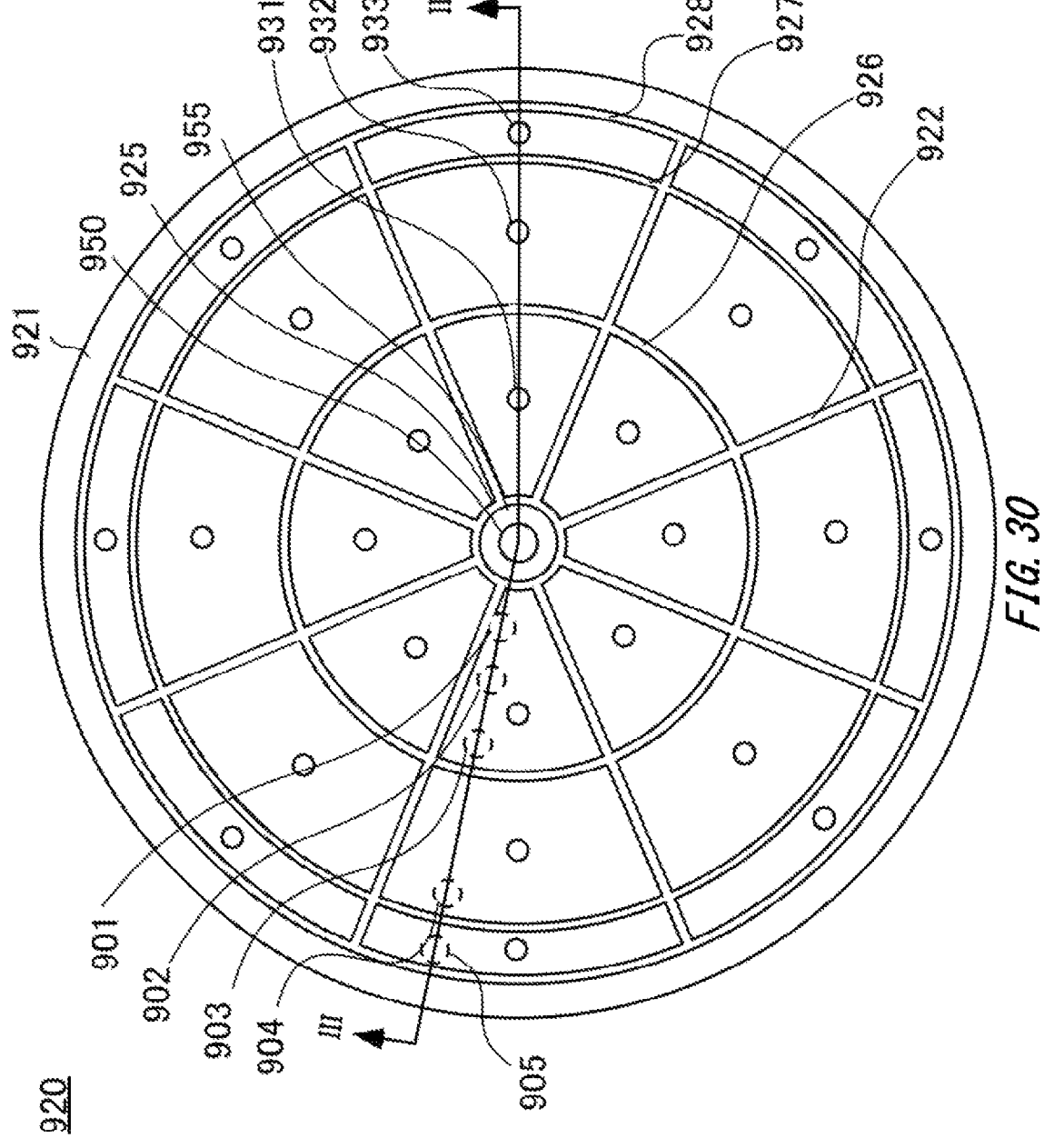
FIG. 30 is a schematic plan view of a substrate holder 920.
Figure 31:
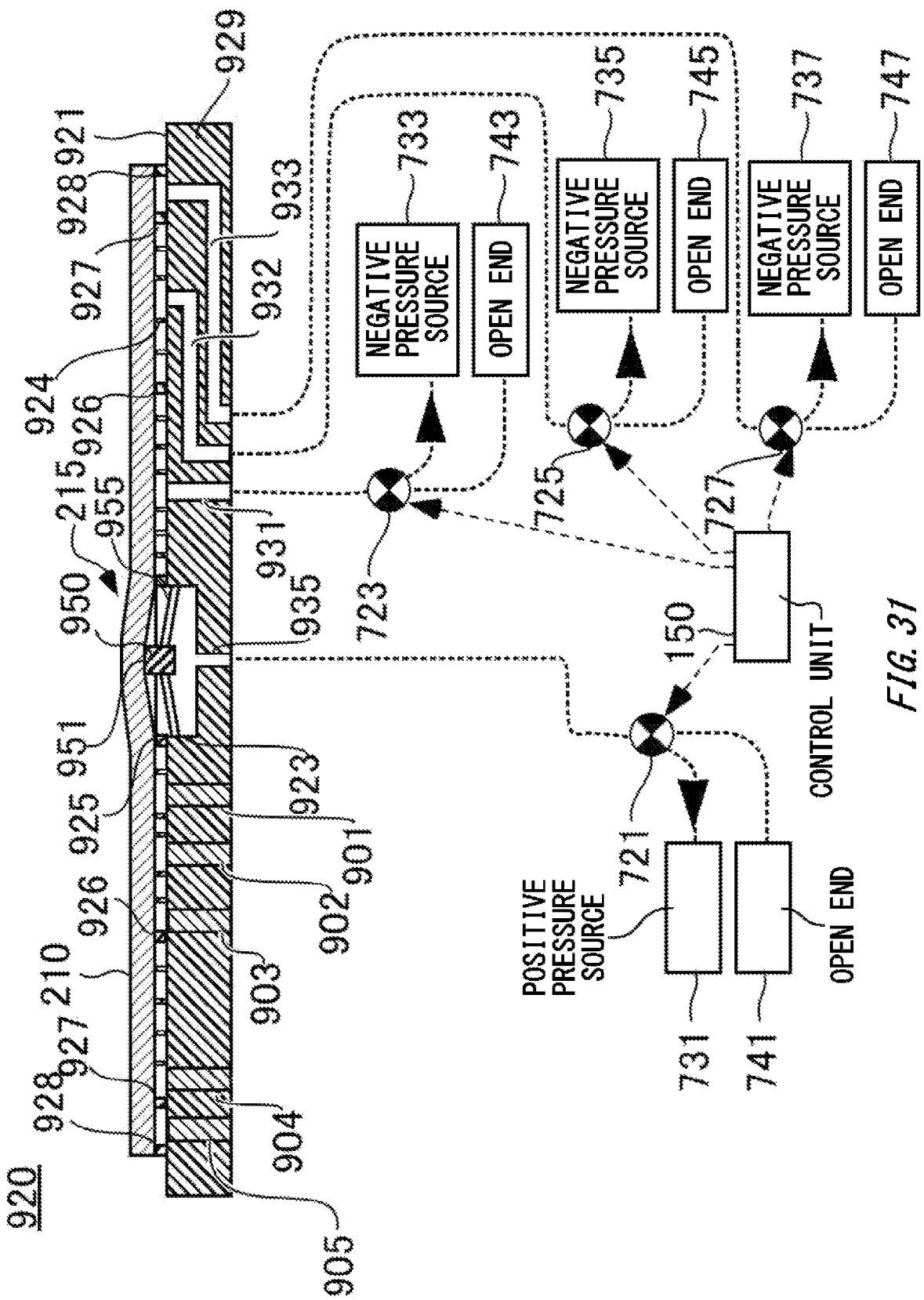
FIG. 31 is a schematic cross-sectional view of the substrate holder 920 holding the substrate 210, along the line III-III of the schematic plan view in FIG. 30.

FIG. 30 is a schematic plan view of a substrate holder 920 according to another embodiment. FIG. 31 is a schematic cross-sectional view of the substrate holder 920 holding the substrate 210, along the line III-III bending at the center of the substrate holder 920 in the schematic plan view in FIG. 30. In the present embodiment, the substrate holder 920 is used instead of the substrate holder 220 for the releasing side used in the main embodiment. Note that the substrate holder 240 for the fixed side is the same as that used in the main embodiment and repeated descriptions thereof are omitted. Moreover, some components of the substrate holder 920 are the same as those of the substrate holder 220. The same or corresponding reference numerals are used for such components and repeated descriptions thereof are omitted. Note that the plurality of support pins 924 are omitted in FIG. 30 for clarity of the description.

A body portion 929 of the substrate holder 920 has four annular support portions 925, 926, 927, 928 formed on the holding surface 921 concentrically with the center of the substrate holder 920 and a plurality of linear support portions 922 formed on the holding surface 921 radially from the center of the substrate holder 920. The four support portions 925, 926, 927, 928 are positioned in this order from the center side of the substrate holder 920. The inner circumferential surface of the support portion 925 is aligned with the inner circumferential surface of the cylindrical concave portion 923 provided substantially at the center of the body portion 929, and thus the support portion 925 surrounds the concave portion 923 on the holding surface 921. The support portion 928 has substantially the same outer shape as the outer shape of the substrate 210 held on the substrate holder 920. The support portion 927 is positioned slightly closer to the center side than the support portion 928 on the holding surface 921, and forms, together with the support portion 928, an annular groove on the outermost side of the substrate holder 920. The support portion 926 is positioned between the support portion 925 and the support portion 927 in the radial direction of the substrate holder 920, and divides the region between the support portion 925 and the support portion 927 into an inner circumference side and an outer circumferential side. The plurality of support portions 922 is formed to intersect with the support portions 925, etc., and divides the region between the support portion 925 and the support portion 926, the region between the support portion 926 and the support portion 927, and the region between the support portion 927 and the support portion 928 into a plurality of subregions respectively.

The body portion 929 further has an inner circumferential vent channel 931, an outer circumferential vent channel 932, and an outermost circumferential vent channel 933. The inner circumferential vent channel 931 is positioned in each of a plurality of sector-shaped region isolated from each other by the plurality of support portions 922, between the support portion 925 and the support portion 926 on the holding surface 921. At its one end, the inner circumferential vent channel 931 has a plurality of air suction holes that are open at a point where none of the plurality of support pins 924 are formed. The other end of the inner circumferential vent channel 931 is selectively coupled to a negative pressure source 733 and an open end 743 via a control valve 723 external to the substrate holder 920. The outer circumferential vent channel 932 is positioned in each of the plurality of sector-shaped regions isolated from each other by the plurality of support portions 922, between the support portion 926 and the support portion 927 on the holding surface 921. At its one end, the outer circumferential vent channel 932 has a plurality of air suction holes that are open at a point where none of the plurality of support pins 924 are formed. The other end of the outer circumferential vent channel 932 is selectively coupled to a negative pressure source 735 and an open end 745 via a control valve 725 external to the substrate holder 920. The outermost circumferential vent channel 933 is positioned in each of the plurality of sector-shaped region isolated from each other by the plurality of support portions 922, between the support portion 927 and the support portion 928 on the holding surface 921. At its one end, the outermost circumferential vent channel 933 has a plurality of air suction holes that are open at a point where none of the plurality of support pins 924 are formed. The other end of the outermost circumferential vent channel 933 is selectively coupled to a negative pressure source 737 and an open end 747 via a control valve 727 external to the substrate holder 920. In the following descriptions, a region on the radially center side in the plane of the substrate 210, where the substrate 210 is adsorbed to between the support portion 925 and the support portion 926 of the substrate holder 920, may be referred to as the inner circumferential region of the substrate 210. Moreover, a region on the radially outer side in the plane of the substrate 210, where the substrate 210 is adsorbed to between the support portion 227 and the support portion 228 of the substrate holder 920, may be referred to as an outermost circumferential region of the substrate 210. Moreover, a region between the inner circumferential region and the outermost circumferential region in the plane of the substrate 210, where the substrate 210 is adsorbed to between the support portion 226 and the support portion 227 of the substrate holder 920, may be referred to as an outer circumferential region of the substrate 210.

The plurality of air suction holes at the one ends of the outer circumferential vent channel 932 and the outermost circumferential vent channel 933 are respectively provided at the outer circumference and the outermost circumference of the substrate holder 920 in order to be able to adsorb the outer circumferential region and the outermost circumferential region of the substrate 210, while, as shown in FIG. 31, the outer circumferential vent channel 932 and the outermost circumferential vent channel 933 are formed to be offset from each other in the thickness direction and extend in the plane direction in the interior of the substrate holder 920 so that the other ends of the outer circumferential vent channel 932 and the outermost circumferential vent channel 933 are positioned closely to the center side of the substrate holder 920. Thus, the substrate holder 920 can be adapted to a vacuum plate, a substrate bonding stage, or the like where air ducts for holding the substrate holder 920 and applying suction air or exhaust air to each vent channel of the substrate holder 920 are concentratedly formed at the center of the holding surface of the substrate holder 920.

The control valves 723, 725, 727 selectively cause the inner circumferential vent channel 931, the outer circumferential vent channel 932, and the outermost circumferential vent channel 933 to communicate respectively with the negative pressure sources 733, 735, 737 under control of the control unit 150. In a state where the substrate 210 is mounted on the support portions 925, etc. and the plurality of support pins 924, when the control valves 723, 725, 727 cause the inner circumferential vent channel 931, the outer circumferential vent channel 932, and the outermost circumferential vent channel 933 to communicate respectively with the negative pressure sources 733, 735, 737, negative pressure acts on the plurality of air suction holes of each of the inner circumferential vent channel 931, the outer circumferential vent channel 932, and the outermost circumferential vent channel 933. Thus, the space between the support portion 925 and the support portion 926, the space between the support portion 926 and the support portion 927, and the space between the support portion 927 and the support portion 928, the spaces being enclosed between the substrate 210 and the holding surface 921 and respectively divided into a plurality of subspaces by the plurality of support portions 922 in the circumferential direction, are respectively depressurized, so that the substrate 210 is adsorbed to the substrate holder 920. On the other hand, from a state where the substrate 210 is adsorbed to the substrate holder 920, when the control valves 723, 725, 727 cause the inner circumferential vent channel 931, the outer circumferential vent channel 932, and the outermost circumferential vent channel 933 to communicate respectively with the open ends 743, 745, 747, the adsorption of the substrate 210 by the substrate holder 920 is released.

In this manner, the inner circumferential vent channel 931, the outer circumferential vent channel 932, and the outermost circumferential vent channel 933 are respectively coupled to the control valves 723, 725, 727 separately controlled by the control unit 150, and the plurality of adsorbing holes at respective one ends are open to each space isolated from each other by the support portion 926, the support portion 927, and the support portion 928. Thus, under control of the control unit 150, the substrate holder 920 can be separately adsorb and separately release the adsorption of the inner circumferential region, the outer circumferential region, and the outermost circumferential region in the radial direction of the substrate 210. In other words, the substrate holder 920 has an inner circumferential adsorbing region, an outer circumferential adsorbing region, and an outermost circumferential adsorbing region, which are independently isolated from each other and arranged concentrically with each other along the radial direction. Note that, in addition to this, adsorption and release may also be enabled independently of each other in the circumferential direction of each region.

The body portion 929 further has four observation holes 901, 902, 903, 904, formed at four points between the support portion 925 and the support portion 926 and between the support portion 926 and the support portion 927 on the holding surface 921 where none of the plurality of support pins 924 are formed, passing through the substrate holder 920 in the thickness direction and an observation hole 905, formed between the support portion 927 and the support portion 928 on the holding surface 921, passing through the substrate holder 920 in the thickness direction. The five observation holes 901, 902, 903, 904, 905 are positioned on substantially the same linear line along the radial direction of the substrate holder 920, as shown in the schematic plan view of FIG. 30, overlapping with the linear line III-III bending at the center of the substrate holder 920. The three observation holes 901, 902, 903 are positioned between the support portion 925 and the support portion 926 that are arranged closely to the center of the substrate holder 920, at a substantially equal interval and in this order from the center side of the substrate holder 920. The observation hole 904 is positioned on the outer circumferential side between the support portion 926 and the support portion 927. Note that the observation holes 901, etc. are respectively filled with a material transparent to a wavelength of illuminating light used when observing the substrate 210, and both ends of each of the observation holes 901, etc. are formed smoothly with both planes of the substrate holder 920.

Figure 32:
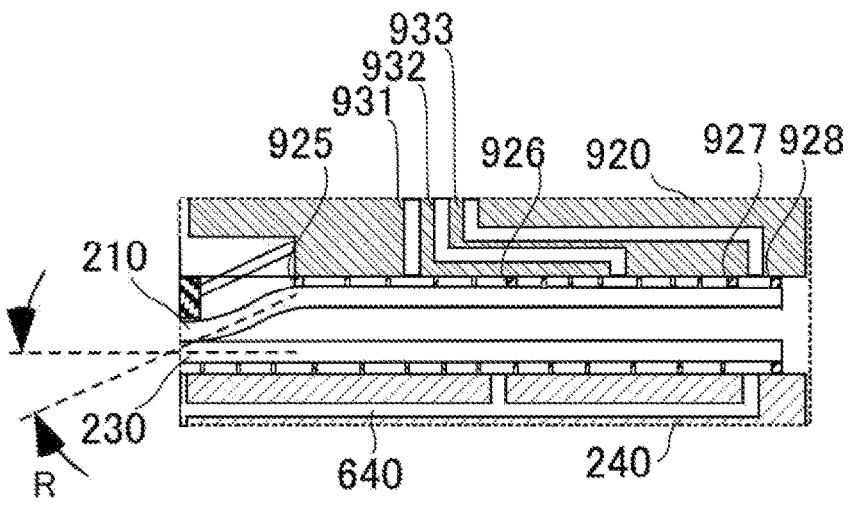
FIG. 32 is an illustrational diagram illustrating the process for bonding the substrates 210, 230 by using the substrate holder 920 having an inner circumferential vent channel 931, an outer circumferential vent channel 932, and an outermost circumferential vent channel 933.
Figure 32:
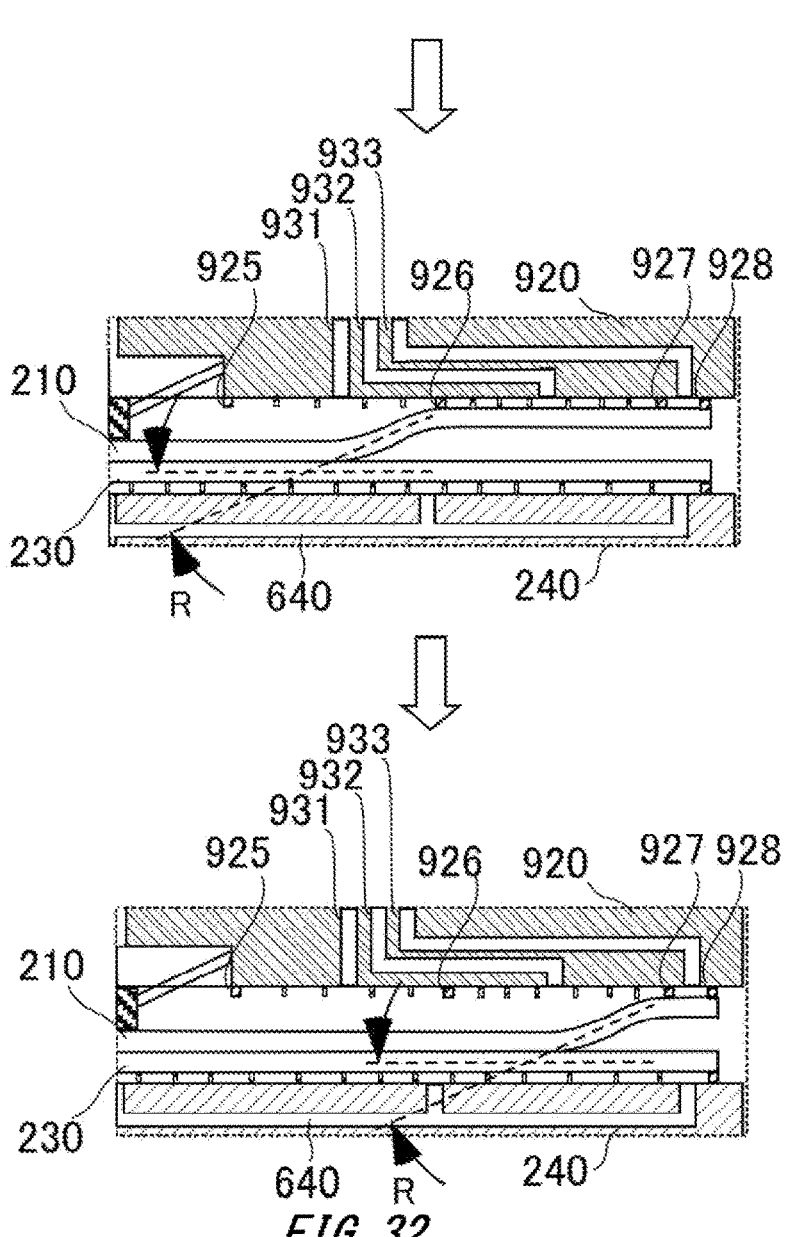

FIG. 32 is an illustrational diagram illustrating the process for bonding the substrates 210, 230 by using the substrate holder 920. The control unit 150 observes expansion of the bonded region 801 by the observing unit 345 through the observation holes 901, etc. of the substrate holder 920, and, as the bonded region 801 expands, sequentially releases the adsorption in the plurality of adsorbing regions described above from the center side toward the outer circumferential side of the substrate holder 920. In the substrate holder 920, it is preferable that the timing of releasing the inner circumferential vent channel 931, the outer circumferential vent channel 932, and the outermost circumferential vent channel 933 from the negative pressure are set so that the bonded region expands while an angle R formed between the portion of the substrate 210 raised from the bonded region and the bonded region is kept as constant as possible. Thus, the distortion occurring due to air resistance is kept constant and the nonlinearity of the distortion can be suppressed.

In particular, because the substrate holder 920 has the inner circumferential vent channel 931, the outer circumferential vent channel 932, and the outermost circumferential vent channel 933 from the inner circumference toward the outer circumference. R can be kept more constant than in the case where the control is performed using two vent channels, i.e. the inner circumferential vent channel 621 and the outermost circumferential vent channel 622, as in the substrate holder 220. Note that, instead of or in addition to increasing a number of vent channels, R may be kept constant by changing the protruding amount of a protruding member 950 as the bonded region expands. In this case, the protruding amount of the protruding member 950 itself may be actively changed, or the protruding amount of the protruding member 950 itself may be passively changed via the substrates 210 and 230 by a push-up force from the opposing substrate holder 240.

Here, the size of the initially bonded region 803 to be bonded while the outermost circumferential region of the substrate 210 on the releasing side is held may be correlated with the height of the protruding members 250, 950 in the substrate holders 220, 920 on the releasing side and the size of the adsorbing area where the substrate holders 220, 920 on the releasing side adsorbs the substrate 210. For example, when the height of the protruding members 250, 950 is made smaller while the substrate 210 is held by the substrate holders 220, 920, the convex curvature around the center of the substrate 210 while the substrate 210 is held becomes smaller and, as a result, the initially bonded region 803 becomes larger. Thus, the nonlinear distortion due to local warping may be reduced. Moreover, because the amount of convex deformation of the substrate 210 on the releasing side around its center caused by the protruding members 250, 950 become smaller, the nonlinear distortion around the center of the substrate 210 may be reduced.

Furthermore, as one example, when the adsorbing area of the substrate 210 by the substrate holders 220, 920 is set smaller, i.e., when the bonding of the substrates 210, 230 is performed while only the side of the outer circumferential end portion of the substrate 210 is held, the area of the substrate 210 that is attracted to the substrate 230 while the substrate 210 is held becomes larger and, as a result, the initially bonded region 803 becomes larger. Thus, the nonlinear distortion due to local warping may be reduced and the adsorption magnification distortion may be further reduced.

Figure 33:
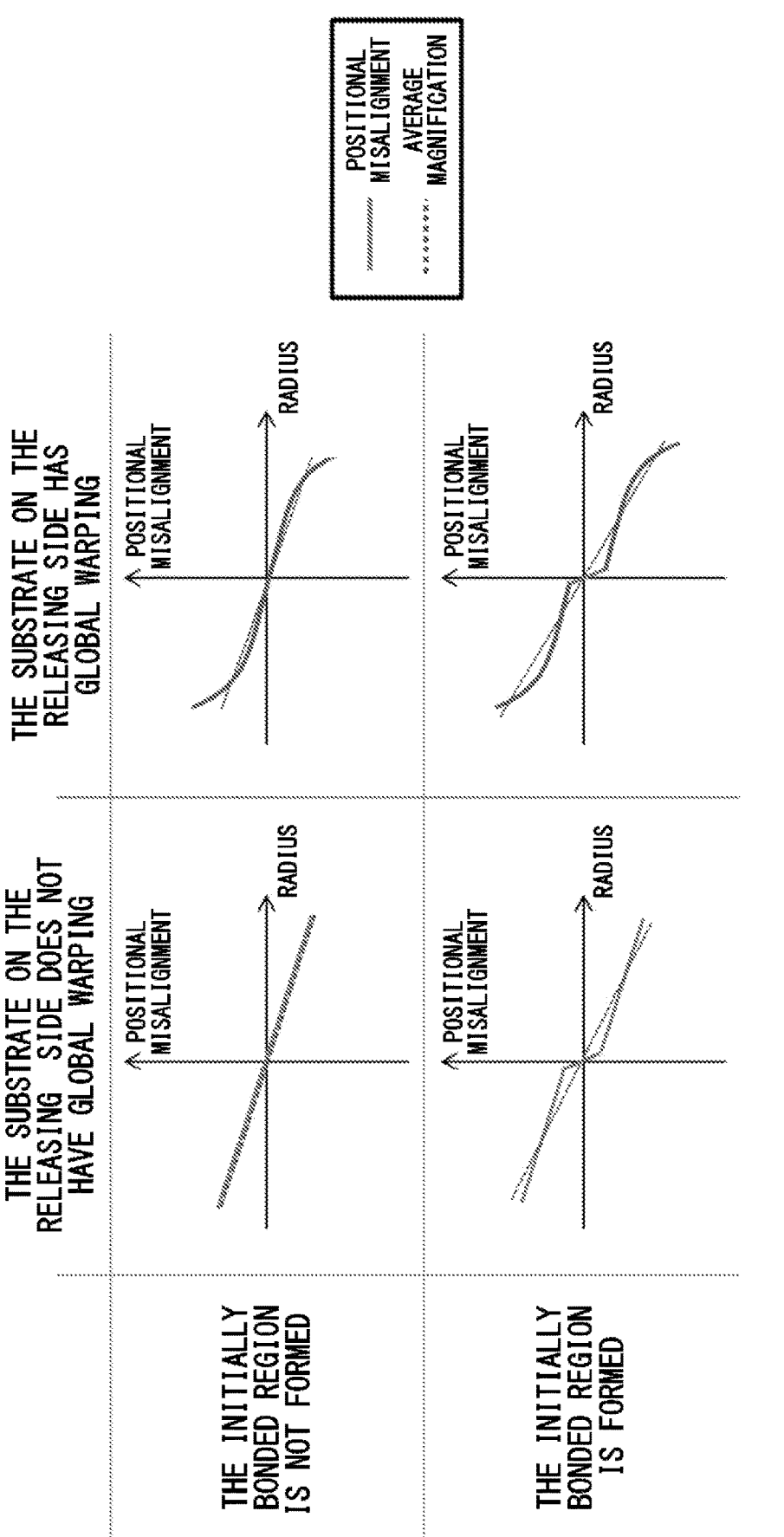
FIG. 33 is an illustrational diagram illustrating a case where the setting of an initially bonded region is changed according to the presence or absence of global warping in the substrate 210 on the releasing side.

FIG. 33 is an illustrational diagram illustrating a case where the setting of the initially bonded region is changed according to the presence or absence of global warping in the substrate 210 on the releasing side. The table in FIG. 33 shows schematic graphs each illustrating a relationship between radial positions of the bonded substrates and positional misalignment occurring between the bonded substrates, with respect to four combination patterns where the substrate 210 on the releasing side has or does not have global warping and where the initially bonded region is or is not formed. In each graph shown in FIG. 33, the solid line indicates positional misalignment, and the dashed line indicates the average magnification. More specifically, the average magnification is a magnification determined by using the least squares method. Moreover, the difference between the solid line and the dashed line in each graph indicates the magnitude of nonlinear distortion.

When the global warping in the substrate 210 on the releasing side is large, the magnification distortion due to air resistance may become larger from the center side toward the outer circumferential side of the substrate 210. In such case, the substrate 210 with large global warping has larger nonlinear distortion on the outer circumferential side.

As shown on the upper left in the table of FIG. 33, in a case where the substrate 210 on the releasing side does not have global warping, it may be unlikely that nonlinear distortion occurs even if the initially bonded region is not formed. Note that, strictly speaking, nonlinear distortion may occur in the substrate 210 with no global warping, because magnification distortion due to air resistance gradually changes in the plane of the substrate 210.

On the other hand, as shown on the lower left in the table of FIG. 33, in a case where the substrate 210 on the releasing side does not have global warping, when the initially bonded region is formed by making the outermost circumferential adsorbing region for the substrate holder 220 smaller or making the convex amount of the protruding member 250 smaller for example, the nonlinear distortion in an in-plane center region and an in-plane outer circumferential region of the substrate 210 on the releasing side becomes large, and this nonlinear distortion may cause positional misalignment.

Moreover, as shown on the upper right in the table of FIG. 33, in a case where the substrate 210 on the releasing side has global warping, when the initially bonded region is not formed, the nonlinear distortion in the in-plane outer circumferential region of the substrate 210 on the releasing side becomes large, and this nonlinear distortion may cause positional misalignment.

On the other hand, as shown on the lower right in the table of FIG. 33, in a case where the substrate 210 on the releasing side has global warping, when the initially bonded region is formed, nonlinear distortion occurs in the in-plane center region of the substrate 210 on the releasing side, but the nonlinear distortion in the in-plane outer circumferential region is alleviated, and thus positional misalignment due to the nonlinear distortion may become generally smaller. It is preferable to generate the initially bonded region of a suitable size for the general nonlinear distortion in the substrate 210.

Thus, when the substrate 210 on the releasing side does not have global warping, it may be preferable not to form, than to form, the initially bonded region, and, when the substrate 210 on the releasing side has global warping, it may be preferable to enlarge the size of the initially bonded region. Therefore, the size of the initially bonded region may be set so that the nonlinear distortion becomes generally smaller, considering the balance between the nonlinear distortion in the in-plane center region and the nonlinear distortion in the in-plane outer circumferential region of the substrate 210 on the releasing side. For example, the size of the initially bonded region may be set so that at least one of the maximum value, the average value, and $3\sigma(\sigma$ is the standard deviation) of the magnitude of the nonlinear distortion shown as the difference between the solid line and the dashed line in each graph is equal to or smaller than a predetermined threshold.

In the above-described embodiments, the substrate bonding apparatus 100 may execute a sequence for performing the substrate bonding in the order from (1) to (6) as described below. (1) Adsorb, by the substrate holder 220 or 920 on the releasing side the inner circumferential region and the outermost circumferential region of the substrate 210 or the inner circumferential region, the outer circumferential region and the outermost circumferential region of the substrate 210. (2) Perform EGA (Enhanced Global Alignment) measurement. (3) Form the bonded region 801 by bringing parts of the substrates 210, 230 into contact with each other. (4) Change the adsorption of the substrate 210 by the substrate holder 220 or 920 on the releasing side to be applied only to the outermost circumferential region of the substrate 210. (5) Wait until the preset initially bonded region 803 is bonded by expansion of the bonded region 801 described above. (6) Unhold the substrate 210 by further releasing the adsorption of the outermost circumferential region of the substrate 210 by the substrate holder 220 or 920 on the releasing side, when it is detected that the initially bonded region 803 is bonded. When the substrates 210, 230 are aligned with each other while the outermost circumferential region of the substrate 210 is adsorbed by the substrate holder 220, an EGA measurement mark formed on the substrate 210 may be difficult to detect. However, the substrate bonding apparatus 100 can correctly detect the EGA measurement mark by executing this sequence.

In the above-described embodiments, the substrate bonding apparatus 100 may further include a calculator for calculating at least any one parameter of the convex amount for convexly deforming the substrate 210, the adsorbing area for adsorbing the outer circumferential portion of the substrate 210 in order to hold the substrate 210 by the substrate holder 220, and the timing of unholding the substrate 210 from the substrate holder 220, based on information related to distortion of the substrate 210 on the releasing side. It is preferable that a relationship between each parameter and nonlinear distortion in the substrate 210 is determined in advance. Moreover, in this case, each parameter calculated by this calculator may be automatically set in the substrate bonding apparatus 100. Furthermore, this calculator may be provided separately from the substrate bonding apparatus

100. For example, a user may acquire each parameter calculated by the calculator and input manually to the substrate bonding apparatus 100. Note that the convex amount for convexly deforming the substrate 210 may be the protruding amount of the protruding member 250 for example or may be a value corresponding a gap between the substrates 210, 230 to be bonded to each other. Note that the adsorbing area for adsorbing the outer circumferential portion of the substrate 210 may be an area of the substrate holder 220 corresponding to each of a plurality of adsorbing regions segmented by a plurality of support portions of the substrate holder 220 for example, or, an area of the substrate 210 held by the substrate holder 220 in the back surface of the substrate 210 opposite to the surface to be bonded to the substrate 230.

In the above-described embodiments, a plurality of vacuum holes may be provided along the progression direction of the bonding wave, instead of the segmenting scheme of adsorbing regions using the plurality of support portions. In this case, an interval between the vacuum holes may be set to have a size by which the distortion amount caused by lifting becomes permittable.

In the above-described embodiments, the protruding member is pneumatically driven, but, instead of this, the protruding member may be spring loaded without using pneumatics. In this case, the spring has a preload that is sufficient to deform the substrate, and the preload of the spring is larger than the push-in load applied when bringing the pair of substrates into contact with each other. When the protruding member is spring loaded, the protruding member may be gradually pushed in by increasing the push-in load by the stage after bringing the pair of substrates into contact with each other. In this case, both of the substrate holders may be configured to have a spring loaded protruding member. Then, deformation of the pair of substrates to be bonded can have a mirror image relationship with each other and the nonlinear distortion can be suppressed.

In the above-described embodiments, whether the protruding amount of the protruding member is made constant or made gradually smaller, the protruding amount of the protruding member or the maximum value thereof may be set so that the amount of nonlinear distortion occurring in the substrate on the releasing side is equal to or smaller than a predetermined threshold when the substrate is deformed by the protruding member.

In each of the above-described embodiments, the countermeasures for nonlinear distortion due to the crystal anisotropy or magnification distortion due to air resistance, and nonlinear distortion caused by a local curve of the substrate are separately described. In order to eliminate positional misalignment occurring in the multilayer substrate formed by bonding the substrates due to these varied types of distortion, some countermeasures may be combined or preferably all countermeasures may be taken.

In the above-described embodiments, it is described that the observing unit is configured to optically observe that the initially bonded region is bonded. Instead of this or in addition to this, the observing unit may determine that the initially bonded region is bonded, by detecting that a predetermined time has elapsed from the initial contact between the substrates, for example. In this case, data indicating a relationship between elapsed time and a size of the initially bonded region is stored in advance and, based on the data, the observing unit determines that the initially bonded region is bonded. Moreover, the observing unit may determine that the initially bonded region is bonded, by observing a change in the distance between the substrates to be bonded, or, by observing a change in the distance between the substrate and the substrate holder. In this case, the observing unit includes a light source and an imaging unit arranged on the same side as the substrates to be bonded, and a background board arranged on the opposite side, for example. The light source may illuminate the substrates to be bonded within the imaging field of view of the imaging unit, and the imaging unit may capture an image of the bonded state of the substrates formed in the background board. Note that the image acquired by the imaging unit is not limited to an image obtained by directly capturing the shape of the substrates. For example, the observing unit may determine the bonded state of the substrates based on a change in an interference fringe image caused by an optical phenomenon such as an interference occurring between the substrates to be bonded, or the like.

Moreover, the observing unit may determine that the initially bonded region is bonded by observing a change in an electrical characteristic in at least one of the substrates to be bonded. In this case, the observing unit includes a capacitance detecting unit, for example. The capacitance detecting unit applies a periodically changing electrical signal to an LC resonance circuit formed including the capacitance between the pair of substrates as measuring targets and a standard inductor. Then, the capacitance detecting unit superimposes an AC voltage on a DC voltage applied to the substrate holder having a function of an electrostatic chuck, and detects the AC component of the electrical signal that changes according to the change in capacitance in the pair of substrates. As the bonding wave progresses, the interval between the substrates to be bonded becomes narrower. As the interval becomes narrower, the capacitance between the pair of substrates becomes larger. Thus, the observing unit may determine a bonded state of the substrates by bringing an electrical terminal into contact with each substrate to be bonded and detecting a change in capacitance according to the change in the bonded state of the substrates. In the substrate holder on the releasing side, the protruding member 250 may be used as the electrical terminal, for example. The control unit may determine that the bonding is completed, when the control unit detects that the value of capacitance has become constant and the constant load value is maintained for a threshold time.

In the above-mentioned exemplary embodiment, an example is shown in which the initially bonded region 803 is formed by conveying the substrate 210 into the upper stage 322 while the substrate 210 is entirely held on the substrate holder 220 or 920 and partially unhold the substrate 210 from the substrate holder 220 or 920 to generate the bonding wave. Instead of this, the following exemplary embodiment may be used. The initially bonded region 803 is formed by conveying the substrate 210 into the upper stage 322 while only the outer circumferential portion of the substrate 210 is held on the substrate holder 220 or 920, and, after bringing a part of the substrate 210 into contact with the substrate 230 to form a contact region, autonomously generating the bonding wave between the substrates 210, 230 by the intermolecular force or the like between the activated surfaces while the outer circumferential portion of the substrate 210 is held on the substrate holder 220 or 920. Also in this case, when or after the determining unit determines that the initially bonded region 803 is formed before the bonding wave stops, the outer circumferential portion of the substrate 210 is unheld from the substrate holder 220 or 920. Alternatively, the size of the holding area of the substrate 210 by the substrate holder 220 or 920 may be set so that the size of the initially bonded region 803 formed when the bonding wave of the substrate 210 stops is equal to a preset size.

While the embodiments of the present invention have been described, the technical scope of the invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

100: substrate bonding apparatus; 110: enclosure; 120, 130: substrate cassette; 140: conveying unit; 150: control unit; 208, 209: silicon monocrystalline substrate; 210, 230, 610, 630: substrate; 212, 232: scribe line; 214: notch; 215: raised portion; 216, 236: circuit region; 218, 238: alignment mark; 220, 240, 920: substrate holder; 221, 241, 921: holding surface; 223: concave portion; 224, 244, 924: support pin; 225, 226, 227, 247, 922, 925, 926, 927, 928: support portion; 229, 929: body portion; 250: protruding member; 251: abutment portion; 255: leaf spring; 290: multilayer substrate; 300: bonding unit; 310: frame body; 312: bottom plate; 316: top plate; 322: upper stage; 324, 334: microscope; 326, 336: activation apparatus; 331: X-direction driving unit; 332: lower stage; 333: Y-direction driving unit; 338: lift driving unit; 341, 342, 343, 344: detector; 345: observing unit; 351: light source; 352: light receiving unit; 361, 362, 363, 364: observation window; 400: holder stocker; 500: pre-aligner; 601, 602, 603, 604, 901, 902, 903, 904, 905: observation hole; 621: inner circumferential vent channel; 622, 933: outermost circumferential vent channel; 625: central vent channel; 640: vent channel; 721, 723, 724, 725, 727, 751: control valve; 731: positive pressure source; 733, 734, 735, 737, 761: negative pressure source; 741, 743, 744, 745, 747, 771: open end; 801: bonded region; 803: initially bonded region; 931: inner circumferential vent channel; 932: outer circumferential vent channel

What is claimed is:

1. A substrate bonding apparatus comprising:
   a first holder configured to hold a first substrate; and
   a second holder configured to hold a second substrate,
   wherein the substrate bonding apparatus is configured to bond the first substrate and the second substrate by;
      forming a contact region between a part of the first substrate and a part of the second substrate;
      after forming the contact region, expanding the contact region so as to form an initially bonded region set based on information of distortion of the second substrate by maintaining a holding of an outer part of the second substrate by the second holder until the initially bonded region is formed; and

after forming the initially bonded region, releasing an outate part of the second substrate from the second holder, wherein the second holder includes:

an adsorbing portion configured to adsorb at least an outer circumferential portion of the second substrate; and a protruding portion configured to protrude toward the second substrate for pressing and deforming a center portion of the second substrate, and wherein a protruding amount of the protruding portion is variable, wherein the protruding portion is detachable, and wherein the protruding portion includes a plurality of protruding portions and the protruding amount is variable by exchanging the plurality of protruding portions having different heights.

2. The substrate bonding apparatus according to claim 1, wherein the substrate bonding apparatus is further configured to set the initially bonded region.

3. The substrate bonding apparatus according to claim 2, wherein the substrate bonding apparatus is further configured to set the initially bonded region so that an amount of positional misalignment between the first substrate and the second substrate bonded to each other is equal to or smaller than a threshold.

4. The substrate bonding apparatus according to claim 2, wherein the substrate bonding apparatus is further configured to set the initially bonded region based on an occurrence position of warping and a magnitude of warping in a bonding surface of the second substrate.

5. The substrate bonding apparatus according to claim 2, wherein the information of distortion includes information of at least one of an occurrence position of warping, a magnitude of warping, a direction of warping, an amplitude of warping, a magnitude of deflection, a direction of deflection, and an amplitude of deflection in the second substrate.

6. The substrate bonding apparatus according to claim 2, wherein the information of distortion includes information of at least one of a maximum value and an average value of amplitude of warping in the outer part of the second substrate.

7. The substrate bonding apparatus according to claim 2, further comprising a non-contact distance meter configured to measure a characteristic of a local curve of the second substrate wherein the substrate bonding apparatus is further configured to set the initially bonded region based on the characteristic of the local curve of the second substrate measured by the non-contact distance meter.

8. The substrate bonding apparatus according to claim 2, wherein the substrate bonding apparatus is further configured to estimate a characteristic of a local curve of the second substrate based on information of the local curve of the second substrate included in the information related to distortion of the second substrate, and wherein the substrate bonding apparatus is further configured to set the initially bonded region based on the characteristic of the local curve of the second substrate estimated by the substrate bonding apparatus.

9. The substrate bonding apparatus according to claim 8, wherein the information related to the local curve includes at least one of information indicating a type of the second substrate, information indicating a manufacturing process, information indicating a stress distribution, and information indicating a configuration of a structure formed on a surface.

10. The substrate bonding apparatus according to claim 2, further comprising a detector configured to determine that the initially bonded region is formed, wherein the second holder is configured to release the second substrate when the detector determines that the initially bonded region is formed.

11. The substrate bonding apparatus according to claim 10, wherein the substrate bonding apparatus is further configured to set the initially bonded region for each bonding of the first substrate and the second substrate, and output set information to the detector.

12. The substrate bonding apparatus according to claim 11, wherein the substrate bonding apparatus is further configured to set the initially bonded region for each manufacturing lot of a first substrate type, the first substrate type corresponding to the first substrate, and for each manufacturing lot of a second substrate type, the second substrate type corresponding to the second substrate, and output set information to the detector.

13. The substrate bonding apparatus according to claim 11, wherein the substrate bonding apparatus is further configured to set the initially bonded region for each type of the first substrate and for each type of the second substrate, and output set information to the detector.

14. The substrate bonding apparatus according to claim 11, wherein the substrate bonding apparatus is further configured to set the initially bonded region for each manufacturing process of a first substrate type, the first substrate type corresponding to the first substrate, and for each manufacturing process of a second substrate type, the second substrate type corresponding to the second substrate, and output set information to the detector.

15. The substrate bonding apparatus according to claim 10, wherein the detector is further configured to observe expansion of the contact region between the first substrate and the second substrate.

16. The substrate bonding apparatus according to claim 1, wherein the protruding amount is variable by the protruding portion moving toward the second substrate.

17. The substrate bonding apparatus according to claim 16, comprising:

a stage configured to hold at least one of the first holder and the second holder and change relative positions of the first holder and the second holder, wherein the substrate bonding apparatus is further configured to control at least one of the protruding portion and the stage so that the protruding amount becomes smaller as the bonded region expands.

18. The substrate bonding apparatus according to claim 17, wherein the substrate bonding apparatus is further configured to control at least one of the protruding portion and the stage so that the bonded region expands with a deformation angle in an outer circumferential portion of the second substrate being kept constant as when the second substrate is deformed by the second holder.

19. The substrate bonding apparatus according to claim 1, wherein the protruding amount is set so that an amount of nonlinear distortion occurring in the second substrate is equal to or smaller than a predetermined threshold when the second substrate is deformed by the second holder.

20. The substrate bonding apparatus according to claim 1, wherein the protruding amount is set based on information of distortion of the second substrate.

21. The substrate bonding apparatus according to claim 1, wherein the adsorbing portion includes a plurality of adsorbing regions independently isolated from each other, and wherein, as the bonded region expands, adsorption in the plurality of adsorbing regions is sequentially released from a center side toward an outer circumferential side of the second holder.

22. The substrate bonding apparatus according to claim 1, wherein the second holder is configured to hold an outer circumferential portion of the second substrate but not hold an inner circumferential portion of the second substrate until the initially bonded region is formed, and release the outer circumferential portion of the second substrate when the initially bonded region is formed.

23. The substrate bonding apparatus according to claim 1, wherein the second holder is configured to release the second substrate in a state in which the contact region has expanded to half or more of a radius of the first substrate.

24. A substrate bonding apparatus according to claim 1, comprising a calculator,
   wherein the substrate bonding apparatus is configured to bond the first substrate and the second substrate by using a parameter calculated by the calculator.

25. The substrate bonding apparatus according to claim 1, wherein a size or shape of the initially bonded region is set based on the information of distortion of the second substrate by maintaining the holding of the outer part of the second substrate by the second holder until the initially bonded region is formed.

26. The substrate bonding apparatus according to claim 1, wherein the second holder is configured to hold the outer part of the second substrate so that restoring of a curve in the outer part of the second substrate is suppressed when the second substrate is released.

27. A substrate bonding apparatus comprising:
a first holder configured to hold a first substrate; and
a second holder configured to hold a second substrate,
wherein the second holder includes a first holding region located on an inner side of the second holder and a second holding region located an outer side of the second holder, a width of the second holding region in a radial direction of the second holder being smaller than a width of the first holding region in the radial direction, the first holding region and the second holding region are controlled separately,
   wherein the substrate bonding apparatus is configured to bond the first substrate and the second substrate by;
forming a contact region between a part of the first substrate and a part of the second substrate;
after forming the contact region, expanding the contact region so as to form an initially bonded region set based on information of distortion of the second substrate by maintaining a holding of an outer part of the second substrate by the second holder until the initially bonded region is formed; and
after forming the initially bonded region, releasing the outer part of the second substrate from the second holder.

* * * * *